United States Patent
Yamazaki et al.

(10) Patent No.: US 9,142,683 B2
(45) Date of Patent: Sep. 22, 2015

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Kengo Akimoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/540,167

(22) Filed: Nov. 13, 2014

(65) Prior Publication Data

US 2015/0076497 A1 Mar. 19, 2015

Related U.S. Application Data

(60) Continuation of application No. 14/028,560, filed on Sep. 17, 2013, now Pat. No. 8,889,499, which is a division of application No. 12/960,664, filed on Dec. 6, 2010, now Pat. No. 8,563,976.

(30) Foreign Application Priority Data

Dec. 11, 2009 (JP) ................................ 2009-282093

(51) Int. Cl.
*H01L 29/12* (2006.01)
*H01L 29/04* (2006.01)
(Continued)

(52) U.S. Cl.
CPC ........ *H01L 29/7869* (2013.01); *H01L 27/1225* (2013.01); *H01L 29/45* (2013.01); *H01L 29/66742* (2013.01)

(58) Field of Classification Search
CPC ................... H01L 29/66942; H01L 29/66742; H01L 29/7869; H01L 29/45
USPC ........................................................ 257/43, 57
See application file for complete search history.

(56) References Cited

U.S. PATENT DOCUMENTS 5,032,531 A 7/1991 Tsutsui et al.
5,054,887 A 10/1991 Kato et al.
(Continued)

FOREIGN PATENT DOCUMENTS

EP 0376437 A 7/1990
EP 0558007 A 9/1993
(Continued)

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(Continued)

*Primary Examiner* — David S Blum
(74) *Attorney, Agent, or Firm* — Eric J. Robinson; Robinson Intellectual Property Law Office, P.C.

(57) ABSTRACT

A semiconductor device includes an oxide semiconductor layer including a channel formation region which includes an oxide semiconductor having a wide band gap and a carrier concentration which is as low as possible, and a source electrode and a drain electrode which include an oxide conductor containing hydrogen and oxygen vacancy, and a barrier layer which prevents diffusion of hydrogen and oxygen between an oxide conductive layer and the oxide semiconductor layer. The oxide conductive layer and the oxide semiconductor layer are electrically connected to each other through the barrier layer.

19 Claims, 24 Drawing Sheets

(51) Int. Cl.
 *H01L 31/036* (2006.01)
 *H01L 31/0376* (2006.01)
 *H01L 31/20* (2006.01)
 *H01L 29/786* (2006.01)
 *H01L 27/12* (2006.01)
 *H01L 29/66* (2006.01)
 *H01L 29/45* (2006.01)

(56) References Cited

U.S. PATENT DOCUMENTS

| | | | |
|---|---|---|---|
| 5,650,664 | A | 7/1997 | Sakamoto |
| 5,731,856 | A | 3/1998 | Kim et al. |
| 5,744,864 | A | 4/1998 | Cillessen et al. |
| 6,252,248 | B1 | 6/2001 | Sano et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,277,152 | B2 | 10/2007 | Sakamoto et al. |
| 7,282,782 | B2 | 10/2007 | Hoffman et al. |
| 7,297,977 | B2 | 11/2007 | Hoffman et al. |
| 7,298,084 | B2 | 11/2007 | Baude et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,719,185 | B2 | 5/2010 | Jin et al. |
| 7,732,819 | B2 | 6/2010 | Akimoto et al. |
| 7,745,798 | B2 | 6/2010 | Takahashi |
| 7,863,611 | B2 | 1/2011 | Abe et al. |
| 7,906,777 | B2 | 3/2011 | Yano et al. |
| 7,998,372 | B2 | 8/2011 | Yano et al. |
| 8,026,506 | B2 | 9/2011 | Shiino et al. |
| 8,415,198 | B2 * | 4/2013 | Itagaki et al. ............ 438/104 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0275038 | A1 | 12/2005 | Shih et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0057261 | A1 | 3/2007 | Jeong et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0299702 | A1 | 12/2008 | Son et al. |
| 2008/0308796 | A1 | 12/2008 | Akimoto et al. |
| 2008/0308797 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0189155 | A1 | 7/2009 | Akimoto |
| 2009/0189156 | A1 | 7/2009 | Akimoto |
| 2009/0239335 | A1 | 9/2009 | Akimoto et al. |
| 2009/0278122 | A1 | 11/2009 | Hosono et al. |
| 2009/0280600 | A1 | 11/2009 | Hosono et al. |
| 2009/0283762 | A1 | 11/2009 | Kimura |
| 2009/0305461 | A1 | 12/2009 | Akimoto et al. |
| 2009/0325341 | A1 | 12/2009 | Itagaki et al. |
| 2010/0065844 | A1 | 3/2010 | Tokunaga |
| 2010/0090217 | A1 | 4/2010 | Akimoto |
| 2010/0092800 | A1 | 4/2010 | Itagaki et al. |
| 2010/0109002 | A1 | 5/2010 | Itagaki et al. |
| 2010/0127253 | A1 | 5/2010 | Inoue et al. |
| 2010/0136743 | A1 | 6/2010 | Akimoto et al. |
| 2010/0159639 | A1 | 6/2010 | Sakata |
| 2010/0285632 | A1 | 11/2010 | Inoue et al. |
| 2011/0012112 | A1 | 1/2011 | Yamazaki et al. |
| 2011/0012116 | A1 | 1/2011 | Yamazaki et al. |
| 2011/0012118 | A1 | 1/2011 | Yamazaki et al. |
| 2011/0017995 | A1 | 1/2011 | Yamazaki et al. |
| 2011/0024741 | A1 | 2/2011 | Abe et al. |
| 2011/0031499 | A1 | 2/2011 | Kimura et al. |

FOREIGN PATENT DOCUMENTS

| | | | |
|---|---|---|---|
| EP | 1737044 | A | 12/2006 |
| EP | 1770788 | A | 4/2007 |
| EP | 1933293 | A | 6/2008 |
| EP | 1995787 | A | 11/2008 |
| EP | 1998373 | A | 12/2008 |
| EP | 1998374 | A | 12/2008 |
| EP | 1998375 | A | 12/2008 |

(56) References Cited

FOREIGN PATENT DOCUMENTS

| EP | 2110855 A | 10/2009 |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-019840 A | 1/1990 |
| JP | 02-048639 A | 2/1990 |
| JP | 05-243579 A | 9/1993 |
| JP | 05-251705 A | 9/1993 |
| JP | 05-275727 A | 10/1993 |
| JP | 06-095149 A | 4/1994 |
| JP | 08-264794 A | 10/1996 |
| JP | 09-293693 A | 11/1997 |
| JP | 11-505377 | 5/1999 |
| JP | 11-354802 A | 12/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-005215 A | 1/2003 |
| JP | 2003-029293 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-081362 A | 3/2007 |
| JP | 2007-096055 A | 4/2007 |
| JP | 2007-123861 A | 5/2007 |
| JP | 2007-142195 A | 6/2007 |
| JP | 2007-142196 A | 6/2007 |
| JP | 2007-163467 A | 6/2007 |
| JP | 2007-171932 A | 7/2007 |
| JP | 2008-053356 A | 3/2008 |
| JP | 2008-192721 A | 8/2008 |
| JP | 2009-260378 A | 11/2009 |
| JP | 2009-265271 A | 11/2009 |
| JP | 2010-098280 A | 4/2010 |
| WO | WO-2004/114391 | 12/2004 |
| WO | WO-2007/040194 | 4/2007 |
| WO | WO-2008/023553 | 2/2008 |

OTHER PUBLICATIONS

International Search Report (Application No. PCT/JP2010/070632) Dated Jan. 18, 2011.
Written Opinion (Application No. PCT/JP2010/070632) Dated Jan. 18, 2011.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layers", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer", SID Digest '09 : SID International Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 099140412) Dated May 29, 2015.

* cited by examiner

Energy band diagram along B-B' (V_G>0)

Energy band diagram along B-B' (V_G<0)

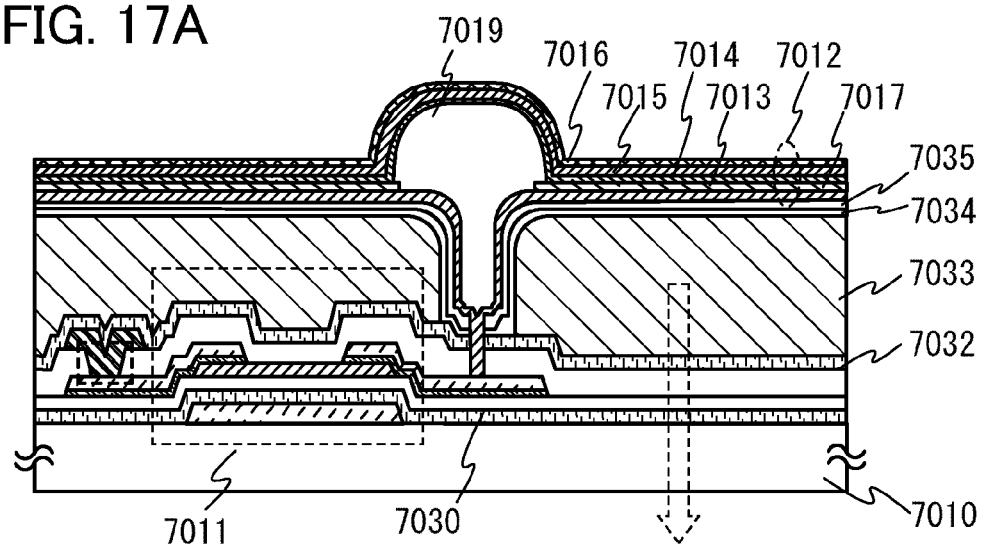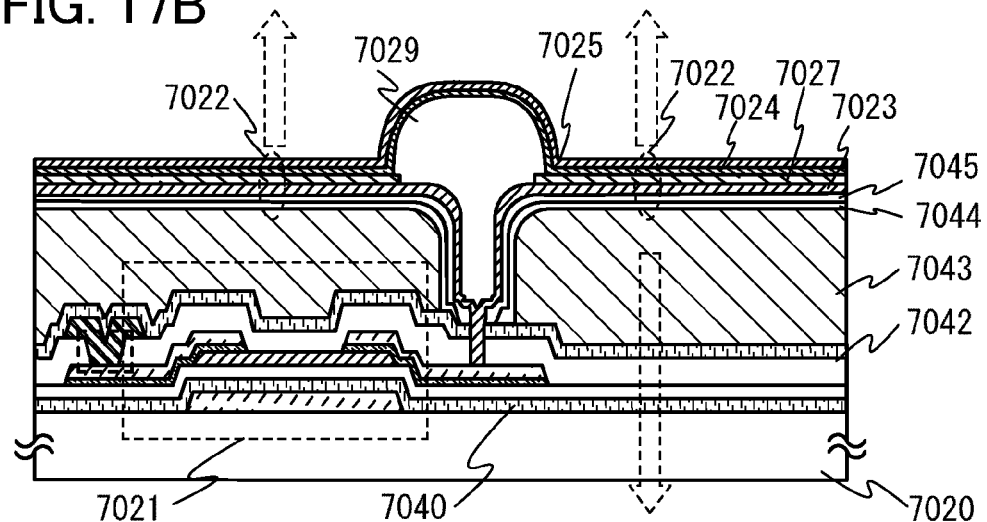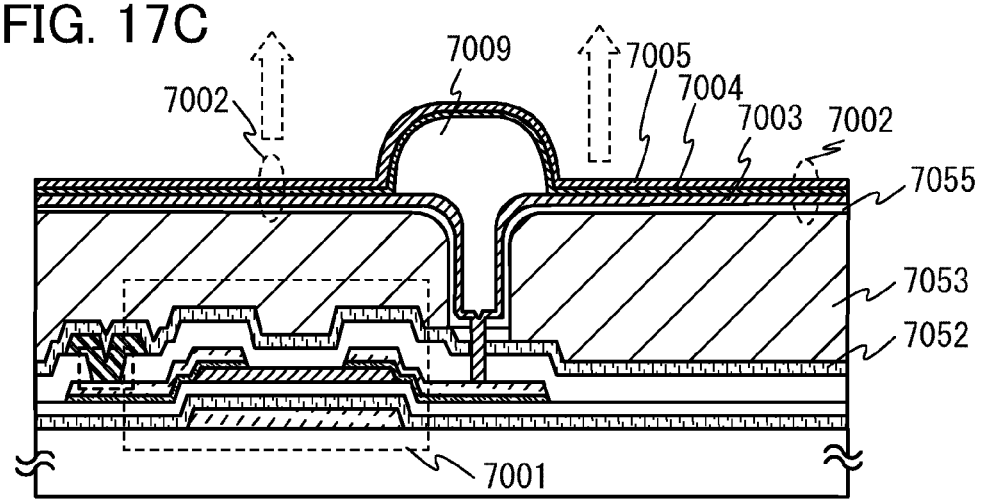

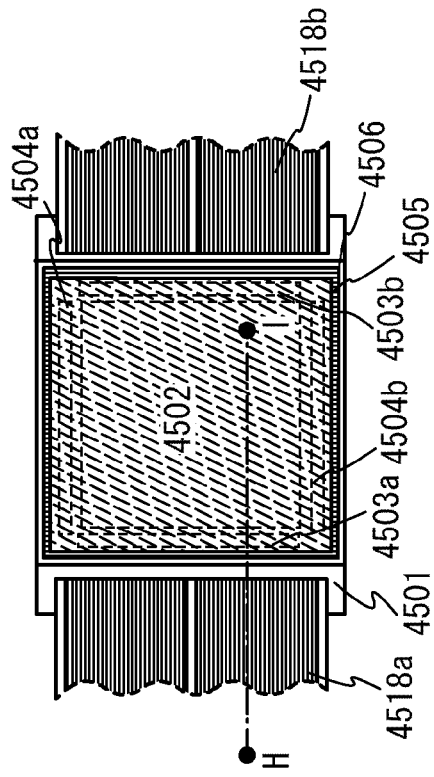
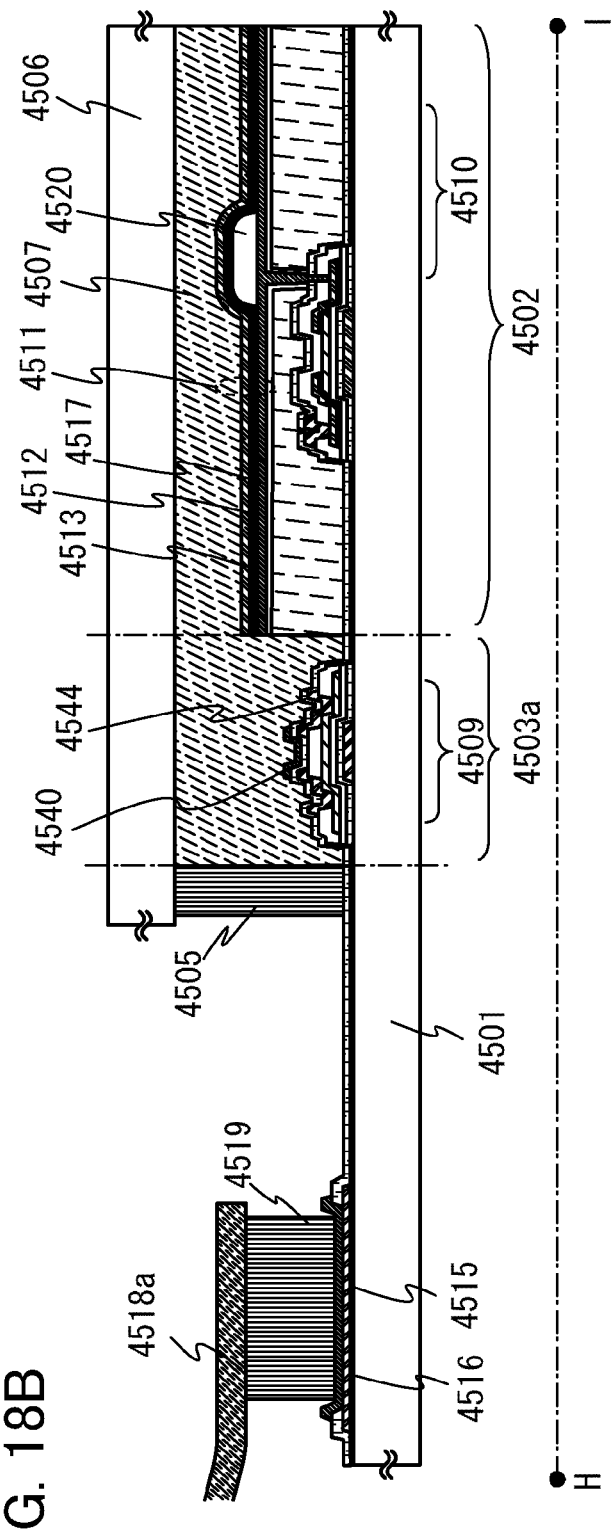
FIG. 18A
FIG. 18B

SEMICONDUCTOR DEVICE AND MANUFACTURING METHOD THEREOF

RELATED APPLICATIONS

This application is a continuation of U.S. patent application Ser. No. 14/028,560, now U.S. Pat. No. 8,889,499, which is a divisional of U.S. patent application Ser. No. 12/960,664, now U.S. Pat. No. 8,563,976 filed Dec. 7, 2010, and claims Priority to Japanese Patent application No. 2009-282093, filed Dec. 11, 2009, the entire content and disclosure of the above, which is incorporated herein by reference.

TECHNICAL FIELD

The present invention relates to a semiconductor device including a semiconductor element and a method for manufacturing the semiconductor device.

Note that a semiconductor device in this specification indicates all the devices that can operate by using semiconductor characteristics, and semiconductor elements such as transistors; and electro-optical devices, semiconductor circuits, and electronic appliances which include semiconductor elements are all semiconductor devices.

BACKGROUND ART

A technique by which transistors are manufactured using oxide semiconductors for channel formation regions and the transistors are applied to semiconductor circuits, ICs, electro-optical devices, electronic appliances, and the like has attracted attention.

In particular, an oxide semiconductor having a wide band gap transmits visible light; therefore, the following is attempted: a light-transmitting transistor is manufactured using such an oxide semiconductor with a wide band gap in combination with a gate electrode, a source electrode, and a drain electrode which are formed using a light-transmitting oxide conductor.

For example, Patent Documents 1 and 2 disclose a technique by which a transistor is formed over a substrate having an insulating surface with the use of a semiconductor thin film (with a thickness of about several nanometers to several hundreds of nanometers) including zinc oxide, an In—Ga—Zn—O-based oxide semiconductor, or the like as an embodiment of a transistor using an oxide semiconductor for a channel formation region, and such a transistor is used for a switching element or the like of an image display device.

A transistor using an oxide semiconductor for a channel formation region (also referred to as a channel region) can have a higher field effect mobility than a transistor using amorphous silicon. An oxide semiconductor film can be formed by a sputtering method or the like, and its manufacturing process is easier than that of a transistor using polycrystalline silicon.

Meanwhile, an oxide conductor which transmits visible light and has conductivity is used as a transparent electrode material needed in a display device such as a liquid crystal display. Most oxide conductors which transmit visible light contain metal oxides each having a wide band gap.

As a light-transmitting oxide conductor, an indium oxide-tin oxide alloy ($In_2O_3$—$SnO_2$, abbreviated as ITO), zinc oxide, zinc oxide to which aluminum is added (AZO), zinc oxide to which gallium is added (GZO), and the like can be given.

Most of these light-transmitting oxide conductors are oxide semiconductors to each of which an impurity or the like is added. For example, tin, aluminum, and gallium are added to ITO, AZO, and GZO as impurities, respectively.

Further, it is also known that conductivity depends on a deposition condition in the case where the oxide conductor is deposited by a sputtering method. For example, Patent Documents 3 and 4 disclose a technique of forming an oxide conductive layer with high conductivity in a reduced atmosphere containing hydrogen. It is said that when film formation is performed in a reduced atmosphere containing hydrogen, an oxide conductive film containing hydrogen and oxygen vacancy is formed and thus the oxide conductive film has higher conductivity.

Note that Non-Patent Document 1 discloses that a shallow donor level of hydrogen contributes to conductivity of zinc oxide which is an example of an oxide semiconductor having a wide band gap.

In addition, a trend in resolution of a screen of a display device, which is an embodiment of a semiconductor device, is toward higher definition, e.g., high-definition (HD) image quality (1366×768) or full high-definition (FHD) image quality (1920×1080), and a so-called 4K Digital Cinema display device, which has a resolution of 3840×2048 or 4096×2160, has been developed rapidly.

As a display device has such a higher definition, a pixel is significantly miniaturized. This tendency is remarkable particularly in middle-sized display devices and small display devices.

In an active matrix semiconductor device in which pixels each provided with a transistor are arranged in matrix, as the pixel is miniaturized, the proportion of the area of the transistor in the pixel is increased; thus, there occurs a problem of reduction in so-called aperture ratio. Therefore, a technique by which the aperture ratio of a pixel of such a semiconductor device is increased with the use of a light-transmitting transistor is expected to be applied to display devices such as a liquid crystal display, an electroluminescent display (also referred to as an EL display), and electronic paper.

With increase in the number of pixels, writing time for one pixel is shortened, and thus a transistor is required to have high speed operation characteristics, a large on current, and the like. In addition, a problem of energy depletion in recent years has caused a demand for a display device whose power consumption is suppressed. Thus, a transistor is required which is off when the potential of a gate electrode is 0, that is, has so-called normally-off characteristics, and in which an off current is small and unnecessary leakage current is suppressed.

Moreover, a large display device has been developed with a view to a screen size of a diagonal of 60 inches or more or even a screen size of a diagonal of 120 inches or more. Thus, a technique by which increase in wiring resistance due to increase in screen size is suppressed is also required.

REFERENCE

[Patent Document 1] Japanese Published Patent Application No. 2007-123861

[Patent Document 2] Japanese Published Patent Application No. 2007-096055

[Patent Document 3] Japanese Published Patent Application No. H5-275727

[Patent Document 4] Japanese Published Patent Application No. H9-293693

[Non-Patent Document 1] WALLE. C, "Hydrogen as a Cause of Doping in Zinc Oxide", PHYS. REV. LETT. (PHYSICAL REVIEW LETTERS), Jul. 31, 2000, Vol. 85, No. 5, pp. 1012-1015

DISCLOSURE OF INVENTION

As described above, reduction in power consumption is also required in a light-transmitting transistor. The present invention is made in view of the foregoing technical background.

Therefore, an object of the present invention is to provide a transistor having both a light-transmitting property and so-called normally-off characteristics. Another object of the present invention is to provide a transistor having both a light-transmitting property and a characteristic of smaller off current. Another object of the present invention is to provide a transistor having both a light-transmitting property and a characteristic of small loss of on current. Another object of the present invention is to provide a transistor where change in property over time is suppressed.

An objective of the invention disclosed below is to achieve any one of the above objects.

To provide a light-transmitting transistor, a gate electrode, a source electrode, and a drain electrode are needed to be formed using a light-transmitting conductive film. To reduce the loss of on current of a transistor, it is necessary to increase conductivities of a source electrode and a drain electrode. Thus, in the case where a source electrode and a drain electrode of a transistor are formed using a light-transmitting conductive layer, an oxide conductive layer is favorably used. In particular, an oxide conductive layer containing oxygen vacancy and an impurity (such as hydrogen) which increase conductivity is favorable because it has high conductivity.

To provide a light-transmitting transistor, a semiconductor layer including a channel formation region needs to have a light-transmitting property. To reduce power consumption of a transistor, an operating characteristic of normally off and a characteristic of sufficiently small off current are necessary. Therefore, an oxide semiconductor layer having a lower carrier concentration and a wide band gap is suitable to a semiconductor layer including a channel formation region.

However, the following problem occurs when an oxide conductive layer containing oxygen vacancy and an impurity (such as hydrogen) which have an effect of increasing conductivity is directly connected to an oxide semiconductor layer having a lower carrier concentration and a wide band gap.

When an impurity such as hydrogen contained in the oxide conductive layer diffuses into the oxide semiconductor layer through the interface between the oxide conductive layer and the oxide semiconductor layer, the impurity concentration of the oxide conductive layer is reduced whereas the impurity concentration of the oxide semiconductor layer is increased. Accordingly, the reduction in impurity concentration of the oxide conductive layer leads to decrease in conductivity, and thus the loss of on current of a transistor increases. Further, the increase in impurity concentration of the oxide semiconductor layer leads to rise in carrier concentration, and thus it is difficult to realize a transistor having an operating characteristic of normally off and a characteristic of sufficiently small off current.

When oxygen diffuses into oxygen vacancy contained in the oxide conductive layer from the oxide semiconductor layer through the interface between the oxide conductive layer and the oxide semiconductor layer, the oxygen vacant portions in the oxide conductive layer decrease whereas the oxygen vacant portions in the oxide semiconductor layer increase. The decrease of oxygen vacant portions in the oxide conductive layer leads to decrease in conductivity, and thus the loss of on current of a transistor increases. Further, oxygen vacancy generated in the oxide semiconductor layer leads to rise in carrier concentration, and thus it is difficult to realize a transistor having normally-off characteristics and a characteristic of sufficiently small off current.

To achieve the above objective, movement of hydrogen and oxygen may be suppressed in a region where the oxide conductive layer for forming a source electrode and a drain electrode is electrically connected to the oxide semiconductor layer.

Specifically, a structure may be adopted in which an oxide semiconductor having a wide band gap and a carrier concentration which is as low as possible is used as the oxide semiconductor layer including a channel formation region, an oxide conductor containing hydrogen and oxygen vacancy is used for the source electrode and the drain electrode, a barrier layer which prevents diffusion of hydrogen and oxygen between the oxide conductive layer and the oxide semiconductor layer is provided, and the oxide conductive layer and the oxide semiconductor layer are electrically connected to each other through the barrier layer.

That is, an embodiment of the present invention is a semiconductor device including a light-transmitting gate electrode over an insulating surface of a light-transmitting substrate; a first insulating layer over the gate electrode; a highly purified oxide semiconductor layer over the first insulating layer; and a first electrode and a second electrode over the oxide semiconductor layer, which have terminals overlapping with the gate electrode. In addition, light-transmitting barrier layers are provided between the oxide semiconductor layer and the first electrode and between the oxide semiconductor layer and the second electrode, and a second insulating layer is provided in contact with a surface of the oxide semiconductor layer, which is on the side which is the reverse of the side of a channel formation region. The carrier concentration of the oxide semiconductor layer is lower than $1 \times 10^{14}/cm^3$. The first electrode and the second electrode include an oxide conductor having a light-transmitting property and a resistivity of $2000 \times 10^{-6}$ Ω·cm or lower. The barrier layers contain nitride.

Another embodiment of the present invention is the semiconductor device including a gate wiring electrically connected to the gate electrode. The gate wiring contains metal.

Another embodiment of the present invention is the semiconductor device including a signal line electrically connected to the first electrode and the second electrode through openings formed in the second insulating layer. The signal line contains metal.

Another embodiment of the present invention is the semiconductor device including a third insulating layer over the signal line. The third insulating layer and the first insulating layer are in contact with each other around the semiconductor device.

Another embodiment of the present invention is the semiconductor device including a first capacitor electrode over the substrate; the first insulating layer over the first capacitor electrode; and a second capacitor electrode over the first insulating layer. The first capacitor electrode includes the same material as the gate electrode, and the second capacitor electrode includes the same material as the first electrode and the second electrode.

Another embodiment of the present invention is the semiconductor device in which the first insulating layer, the second insulating layer, and the oxide semiconductor layer are sandwiched between the gate wiring and the signal line at the intersection of the gate wiring and the signal line.

Another embodiment of the present invention is a semiconductor device including the above semiconductor device over an insulating surface of a light-transmitting substrate; a second gate electrode; a first insulating layer over the second gate electrode; an oxide semiconductor layer over the first insulating layer; a channel protective layer overlapping with a channel formation region of the oxide semiconductor layer; and a third electrode and a fourth electrode having end portions over the channel protective layer. The second gate electrode is formed of the same material as the gate wiring, the channel protective layer is formed of the same material as the second insulating layer, and the third electrode and the fourth electrode are formed of the same material as the signal line.

Another embodiment of the present invention is a method for manufacturing a semiconductor device including the following steps: forming a gate electrode which includes an oxide conductor having a light-transmitting property over an insulating surface of a substrate having a light-transmitting property; forming a first insulating layer over the gate electrode; forming an oxide semiconductor layer having a light-transmitting property over the first insulating layer; performing heat treatment on the substrate, over which the oxide semiconductor layer is formed, in an inert gas atmosphere so that the temperature of the substrate is higher than or equal to 350° C. and lower than or equal to 700° C.; forming a barrier layer to cover the oxide semiconductor layer; forming an oxide conductive layer having a light-transmitting property over the barrier layer in a reduced atmosphere; forming a first electrode and a second electrode which have end portions overlapping with the gate electrode and are electrically connected with the oxide semiconductor layer through the barrier layer; forming a second insulating layer over the oxide semiconductor layer, the first electrode, and the second electrode. The oxide semiconductor layer has a carrier concentration of lower than $1 \times 10^{14}/cm^3$ and the oxide conductive layer has a resistivity of $2000 \times 10^{-6}$ Ω·cm or lower.

Note that in this specification, a light-transmitting property refers to a property of transmitting at least light of a wavelength region of visible light.

Note that a gate in this specification refers to the entire gate electrode and gate wiring or part thereof. The gate wiring refers to a wiring for electrically connecting a gate electrode of at least one transistor to another electrode or another wiring, and includes a scan line in a display device in its category, for example.

The source refers to the entire source region, source electrode, and source wiring or part thereof. The source region refers to a region in a semiconductor layer, where the resistivity is lower than or equal to a given value. The source electrode refers to a conductive layer which supplies carriers to a semiconductor layer. The source wiring refers to a wiring for electrically connecting a source electrode of at least one transistor to another electrode or another wiring. For example, in the case where a signal line in a display device is electrically connected to a source electrode, the source wiring includes the signal line in its category.

The drain refers to the entire drain region, drain electrode, and drain wiring or part thereof. The drain region refers to a region in a semiconductor layer, where the resistivity is lower than or equal to a given value. The drain electrode refers to a conductive layer to which carriers flow from a semiconductor layer. The drain wiring refers to a wiring for electrically connecting a drain electrode of at least one transistor to another electrode or another wiring. For example, in the case where a signal line in a display device is electrically connected to a drain electrode, the drain wiring includes the signal line in its category.

In this document (the specification, the claims, the drawings, and the like), since a source and a drain of a transistor may interchange depending on the structure, the operating condition, and the like of the transistor, it is difficult to define which is the source or the drain. Therefore, in this document (the specification, the claims, the drawings, and the like), one terminal selected from the source and the drain is referred to as one of the source and the drain, while the other terminal is referred to as the other of the source and the drain.

In addition, in this specification, silicon nitride oxide refers to silicon that contains nitrogen and oxygen so that the amount of nitrogen is larger than that of oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. The total of the percentages of the constituent elements does not exceed 100 atomic %.

A transistor having a light-transmitting property and normally-off characteristics can be provided. A transistor having a light-transmitting property and a characteristic of smaller off current can be provided. A transistor having a light-transmitting property and a characteristic of small loss of on current can be provided. The light-transmitting transistor with high reliability, in which change in property over time is suppressed, can be provided.

BRIEF DESCRIPTION OF DRAWINGS

FIG. 2 is a longitudinal sectional view of a transistor including an oxide semiconductor.

FIGS. 8A-1, 8A-2, 8B-1, and 8B-2 illustrate a terminal of a semiconductor device according to an embodiment.

FIGS. 14A-1, 14A-2, and 14B illustrate semiconductor devices according to an embodiment.

FIGS. 17A to 17C illustrate semiconductor devices according to an embodiment.

FIGS. 18A and 18B illustrate a semiconductor device according to an embodiment.

BEST MODE FOR CARRYING OUT THE INVENTION

Figures 1, 1A:
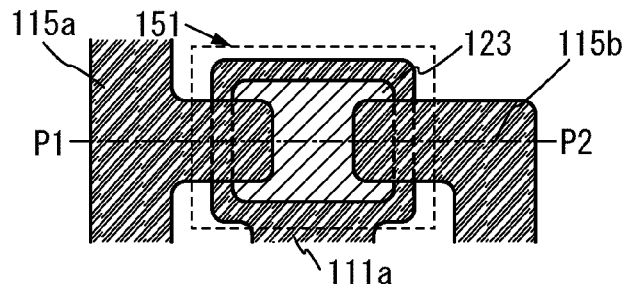
FIGS. 1A-1, 1A-2, 1B-1, and 1B-2 illustrate semiconductor devices according to an embodiment.

Embodiments will be described with reference to drawings. Note that the present invention is not limited to the following description, and it will be easily understood by those skilled in the art that the modes and details of the present invention can be modified in various ways without departing from the spirit and scope of the present invention. Therefore, the present invention should not be construed as being limited to the following description of the embodiments. Note that in structures of the present invention described below, the same portions or portions having similar functions are denoted by the same reference numerals in different drawings, and description thereof is omitted.

Embodiment 1

In this embodiment, a bottom-gate transistor which transmits visible light will be described as an embodiment of a semiconductor device with reference to FIGS. 1A-1, 1A-2, 1B-1, and 1B-2.

Figures 1, 1A, 2:
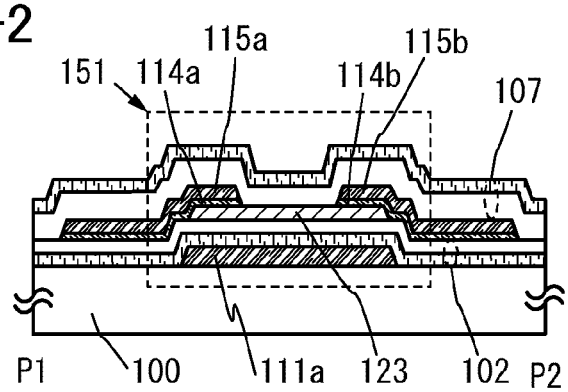

FIGS. 1A-1 and 1A-2 illustrate an example in which an electrode of a transistor and a wiring connected to the transistor are formed using light-transmitting conductive films.

Figures 1, 1B:
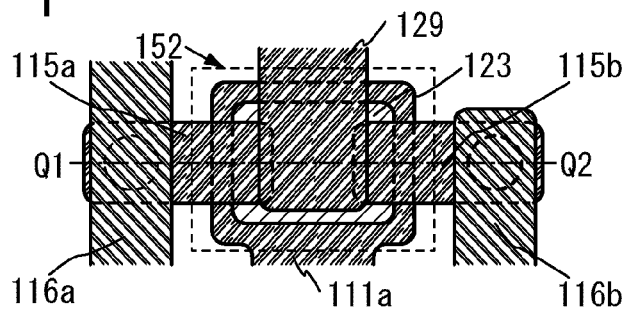
Figures 1, 1B, 2:
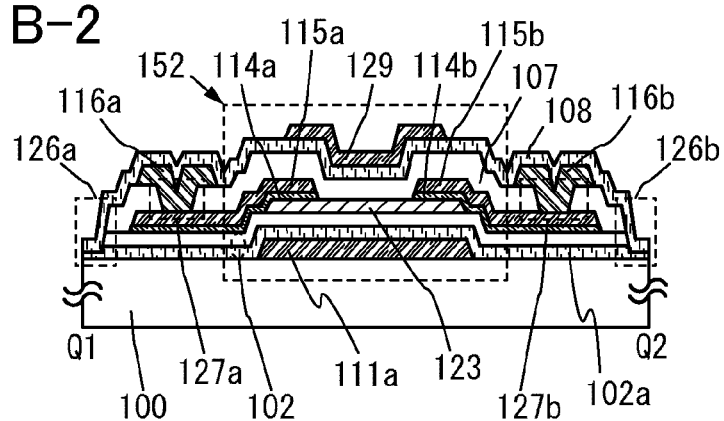
Figure 2:
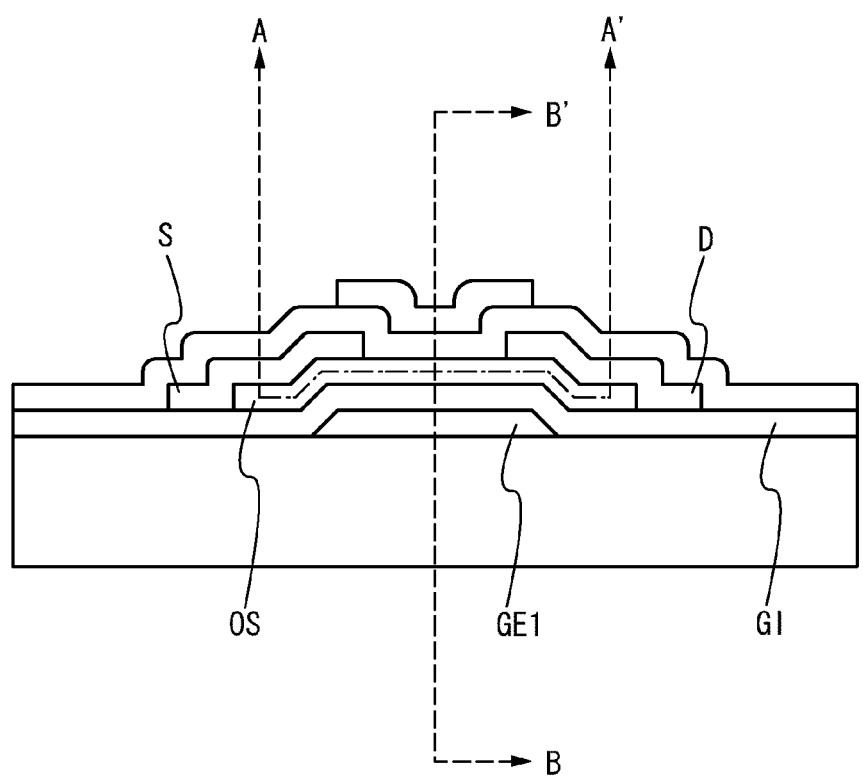

FIGS. 1B-1 and 1B-2 illustrate an example in which an electrode of a transistor is formed using a light-transmitting conductive film and a wiring connected to the transistor is formed using a conductive film containing metal.

FIGS. 1A-1 and 1A-2 illustrate an embodiment of a structure of a bottom-gate transistor which transmits visible light. FIG. 1A-1 is a top plan view illustrating a plane structure of the transistor, and FIG. 1A-2 is a cross-sectional view illustrating a layered structure of the transistor. Note that a dashed-dotted line P1-P2 in FIG. 1A-1 corresponds to a cross section P1-P2 in FIG. 1A-2.

The cross section P1-P2 illustrates the layered structure of the transistor 151. The transistor 151 includes, over a light-transmitting substrate 100, a gate electrode 111a which is formed using a light-transmitting first conductive layer; a first insulating layer 102 which transmits light and is over the gate electrode 111a; and an oxide semiconductor layer 123 which transmits light and includes a channel formation region and is in contact with the first insulating layer 102 over the gate electrode 111a.

Further, the transistor includes a first electrode 115a and a second electrode 115b which are formed using a light-transmitting second conductive layer and have end portions overlapping with the gate electrode 111a. The first electrode 115a and the second electrode 115b are electrically connected to the oxide semiconductor layer 123 through a barrier layer 114a and a barrier layer 114b, respectively. The first electrode 115a and the second electrode 115b function as source and drain electrodes of the transistor 151.

Further, the transistor 151 includes a second insulating layer 107 over the first electrode 115a, the second electrode 115b, the first insulating layer 102, and the oxide semiconductor layer 123.

Since all the layers included in the transistor 151 have light-transmitting properties, the transistor 151 transmits light.

FIGS. 1B-1 and 1B-2 illustrate another embodiment of a structure of a bottom-gate transistor which transmits visible light. FIG. 1B-1 is a top plan view illustrating a plane structure of the transistor, and FIG. 1B-2 is a cross-sectional view illustrating a layered structure of the transistor. Note that a dashed-dotted line Q1-Q2 in FIG. 1B-1 corresponds to a cross section Q1-Q2 in FIG. 1B-2.

The cross section Q1-Q2 illustrates the layered structure of a transistor 152. The transistor 152 includes, over the light-transmitting substrate 100, the gate electrode 111a which transmits light and is connected to a gate wiring layer containing metal which is not illustrated in the drawing; the first insulating layer 102 which transmits light and is over the gate electrode 111a; and the oxide semiconductor layer 123 which transmits light and includes a channel formation region and is in contact with the first insulating layer 102 over the gate electrode 111a.

Further, the transistor includes the first electrode 115a and the second electrode 115b which transmit light and have end portions overlapping with the gate electrode 111a. The first electrode 115a and the second electrode 115b are electrically connected to the oxide semiconductor layer 123 through the barrier layer 114a and the barrier layer 114b, respectively. The first electrode 115a and the second electrode 115b function as source and drain electrodes of the transistor 152.

Further, the transistor 152 includes the second insulating layer 107 over the first electrode 115a, the second electrode 115b, the oxide semiconductor layer 123, and the first insulating layer 102. A signal line 116a is connected to the first electrode 115a through an opening 127a formed in the second insulating layer 107, and a signal line 116b is connected to the second electrode 115b through an opening 127b formed in the second insulating layer 107.

Further, the transistor 152 includes a third insulating layer 108 over the signal line 116a, the signal line 116b, and the second insulating layer 107. A conductive layer 129 may be provided over the third insulating layer 108.

The third insulating layer 108 and an insulating layer 102a which is part of the first insulating layer are in contact with each other through the openings 126a and 126b formed in the second insulating layer 107. The insulating layer 102a is formed of an insulating layer which is of the same kind as the third insulating layer 108, whereby the insulating layer 102a and the third insulating layer 108 are closely attached to each other and are in contact with each other around the transistor 152.

Since all the layers included in the transistor 152 have light-transmitting properties, the transistor 152 transmits light. Further, the electrode of the transistor 152 is connected to a wiring formed of a conductive film containing metal; therefore, a semiconductor device can be formed to have low wiring resistance. Furthermore, the transistor 152 is surrounded by the similar insulating layers so that diffusion of impurities from the outside can be suppressed; thus, the transistor 152 has excellent reliability.

The conductive layer 129 is provided so as to overlap with a channel formation region in the oxide semiconductor layer 123, whereby in a bias-temperature stress test (hereinafter referred to as a BT test), the amount of change in threshold voltage of the transistor 152 can be reduced. Note that for example, the BT test can be conducted with $2 \times 10^6$ V/cm at an environmental temperature of 85° C. for 12 hours.

In this embodiment, a highly purified In—Ga—Zn—O-based oxide semiconductor whose carrier concentration is suppressed to less than $1 \times 10^{14}/cm^3$ and which has a wide band gap is used as the oxide semiconductor layer 123.

A transistor where an oxide semiconductor layer, which has been highly purified so that the carrier concentration is suppressed to less than $1 \times 10^{14}/cm^3$, preferably $1 \times 10^{12}/cm^3$ or less, and which has a wide band gap (specifically 2 eV or more, preferably 2.5 eV or more, more preferably 3 eV or more), is used for a channel formation region is off (so-called normally-off characteristics) when the potential of a gate electrode is 0. The transistor formed using such an oxide semiconductor has a small off current.

Note that the meaning of using such an oxide semiconductor, which has been highly purified so that the carrier concentration is suppressed to less than $1 \times 10^{14}/cm^3$, preferably $1 \times 10^{12}/cm^3$ or less, and which has a wide band gap, for the semiconductor layer of the transistor, in which a channel is formed, will be described in detail at the end of this embodiment.

As the oxide semiconductor layer, any of the following oxide semiconductor layers can be used: an In—Sn—Ga—Zn—O-based layer that is a four-component metal oxide; an In—Ga—Zn—O-based layer, an In—Sn—Zn—O-based layer, In—Al—Zn—O-based layer, an Sn—Ga—Zn—O-based layer, an Al—Ga—Zn—O-based layer, and an Sn—Al—Zn—O-based layer that are three-component metal oxides; an In—Zn—O-based layer, an Sn—Zn—O-based layer, an Al—Zn—O-based layer, a Zn—Mg—O-based layer, an Sn—Mg—O-based layer, and an In—Mg—O-based layer that are two-component metal oxides; an In—O-based layer, an Sn—O-based layer, and a Zn—O-based layer that are one-component metal oxides; and the like. Further, the above oxide semiconductor layer may contain $SiO_2$.

There is an oxide semiconductor material expressed by $InMO_3(ZnO)_m$ (m>0). Here, M represents one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. An oxide semiconductor expressed by $InGaO_3(ZnO)_m$ (m>0) is a typical example of the In—Ga—Zn—O-based oxide semiconductor material described above. Note that the above composition is obtained from a crystal structure and thus is only an example.

As the oxide semiconductor layer, the one on which dehydration or dehydrogenation is performed by a rapid thermal annealing (RTA) method or the like at high temperature for a short time is used. In the oxide semiconductor layer, oxygen vacancy is generated in the step of dehydration or dehydrogenation. Therefore, it is necessary to supply oxygen to the oxygen vacancy portion. Through that process, the oxide semiconductor layer is highly purified. The carrier concentration of the highly purified oxide semiconductor layer is suppressed to less than $1 \times 10^{14}/cm^3$, preferably $1 \times 10^{12}/cm^3$ or less.

In this embodiment, the first conductive layer including the gate electrode 111a and the second conductive layer including the first electrode 115a and the second electrode 115b are formed using light-transmitting conductive films.

Note that a conductive film which transmits light refers to a film having a thickness which realizes a visible light transmittance of 75% to 100%. Alternatively, a conductive film which is semitransparent to visible light may be used. A conductive film which is semitransparent to visible light refers to a film with a visible light transmittance of 50% to 75%.

The electrical resistivity of the light-transmitting conductive films used for the gate electrode, the first electrode, and the second electrode is $200 \times 10^{-6}$ Ω·cm to $2000 \times 10^{-6}$ Ω·cm inclusive, preferably $250 \times 10^{-6}$ Ω·cm to $2000 \times 10^{-6}$ Ω·cm inclusive.

As the light-transmitting conductive film, an oxide conductive film is preferable. Specifically, indium oxide containing tungsten oxide, indium zinc oxide containing tungsten oxide, indium oxide containing titanium oxide, indium tin oxide containing titanium oxide, indium tin oxide (ITO), indium zinc oxide, indium tin oxide to which silicon oxide is added, or the like can be used. Indium tin oxide to which silicon oxide is added has low crystallinity and thus forms an amorphous film having excellent processability. Alternatively, zinc oxide, zinc oxide to which aluminum is added, zinc oxide to which gallium is added, or the like may be used. In this embodiment, indium tin oxide (ITO) is used.

The conductance of a light-transmitting oxide conductive layer can be increased depending on the composition, an impurity to be added, and a film formation condition. For example, an oxide conductive layer formed in a reduced atmosphere to have oxygen vacancy has higher conductance. Further, when an impurity (such as a compound containing hydrogen) is added to an oxide conductive layer, the oxide conductive layer comes to be amorphous, which leads to not only improvement in processability but also increase in conductance.

In this embodiment, the barrier layers 114a and 114b are formed using titanium nitride. The barrier layers each have a thickness of 1 nm to 50 nm inclusive, preferably 2 nm to 10 nm inclusive, and transmit light.

The barrier layer 114a is provided between the first electrode 115a and the oxide semiconductor layer 123 which has been highly purified. The barrier layer 114b is provided between the oxide semiconductor layer 123 which has been highly purified and the second electrode 115b. The barrier layers 114a and 114b inhibit diffusion of hydrogen and oxygen.

The barrier layers 114a and 114b suppress diffusion of impurities (e.g., an impurity containing a hydrogen atom) included in an oxide conductive layer into the oxide semiconductor layer. Further, the barrier layers 114a and 114b suppress diffusion of oxygen atoms included in the oxide semiconductor layer into the oxide conductive layer.

Note that as the barrier layers 114a and 114b, a conductive nitride layer such as a tantalum nitride layer, a tungsten nitride layer, or a molybdenum nitride layer or a nitride layer having a barrier property, such as an extremely thin silicon nitride layer or an extremely thin aluminum nitride layer may alternatively be used instead of a titanium nitride layer.

In this embodiment, a stack in which silicon oxide is stacked over silicon nitride ($SiN_y$ (y>0)) is used for the first insulating layer 102. A stack in which silicon nitride ($SiN_y$ (y>0)) is stacked over silicon oxide is used for the second insulating layer 107.

When a silicon nitride layer is used, impurities from the outside can be prevented from diffusing into and reaching the oxide semiconductor layer 123 provided in the transistor 151.

Further, when silicon oxide is used for part of the first insulating layer 102, which is in contact with the oxide semiconductor layer 123, and part of the second insulating layer 107, which is in contact with the oxide semiconductor layer 123, oxygen can be supplied to oxygen vacancy generated in the oxide semiconductor layer 123.

The silicon oxide and the silicon nitride included in the first insulating layer 102 and the second insulating layer 107 each have a light-transmitting property.

Alternatively, instead of being formed using a silicon nitride oxide layer, a silicon oxynitride layer, a silicon nitride layer, or a silicon oxide layer, the first insulating layer 102 may be formed with a single-layer structure or a layered structure using a compound layer including one kind of oxide, nitride, oxynitride, or nitride oxide of aluminum, tantalum, yttrium, or hafnium; or a compound layer including two or more kinds of the above compounds.

In particular, it is preferable to use an insulating layer having a higher dielectric constant than silicon oxide as the first insulating layer 102 because properties of the first insulating layer 102 as a gate insulating layer are improved.

As the substrate 100, a substrate which transmits visible light and has an insulating surface is used. For example, other than a glass substrate and a ceramic substrate, a plastic substrate or the like with heat resistance which can withstand a process temperature in this manufacturing process can be used.

As a glass substrate, an alkali-free glass substrate of barium borosilicate glass, aluminoborosilicate glass, aluminosilicate glass, or the like may be used. Alternatively, a quartz substrate, a sapphire substrate, or the like may be used. In this embodiment, aluminoborosilicate glass is used for the substrate 100.

A glass substrate with any of the following sizes can be used appropriately in consideration of the use, a manufacturing apparatus, or the like: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), the 10th generation (2950 mm×3400 mm), or the like.

A base film over the substrate 100 can be formed with a single-layer structure or a layered structure using any of a silicon nitride film and a silicon nitride oxide film. The base film can be formed by a sputtering method, a CVD method, a coating method, a printing method, or the like as appropriate. Note that the base film may be doped with phosphorus (P) or boron (B).

Here, the meaning of using an oxide semiconductor, which has been highly purified so that the carrier concentration is suppressed to less than $1\times10^{14}/cm^3$, preferably $1\times10^{12}/cm^3$ or less, and which has a wide band gap, for the semiconductor layer of the transistor, in which a channel is formed, will be described in detail.

<Realization of Intrinsic Oxide Semiconductor>

Although a lot of researches on properties of an oxide semiconductor, such as DOS (density of state), have been conducted, those researches do not include the idea of sufficiently reducing localized levels themselves. According to an embodiment of the disclosed invention, an oxide semiconductor which is highly purified to be intrinsic (i-type) is formed by removing water and hydrogen that can be causes of a localized level. This is based on the idea that localized levels themselves are sufficiently reduced. Such a highly purified oxide semiconductor enables fabrication of very excellent industrial products.

Note that when hydrogen, water, and the like are removed, oxygen might be removed together with hydrogen, water, and the like. Thus, it is preferable to more highly purify an oxide semiconductor so that it becomes intrinsic (i-type) by supplying oxygen to a dangling bond of metal which is generated by oxygen vacancy and reducing localized levels due to the oxygen vacancy. For example, an oxide film containing excessive oxygen is formed in close contact with a channel formation region including an oxide semiconductor and then heat treatment is performed at temperatures of 200° C. to 400° C., typically at a temperature of about 250° C., so that oxygen is supplied to the oxide semiconductor from the oxide film. Thus, localized levels due to oxygen vacancy can be reduced.

Deterioration of properties of an oxide semiconductor is considered to be attributed to a shallow level of 0.1 eV to 0.2 eV under the conduction band due to excessive hydrogen, a deep level due to oxygen vacancy, or the like. Hydrogen is removed thoroughly and oxygen is supplied sufficiently in order to eliminate such a defect.

An oxide semiconductor is generally considered to have n-type conductivity; however, according to an embodiment of the disclosed invention, an oxide semiconductor is made to be i-type by removing impurities such as water and hydrogen and supplying oxygen which is a constituent element of the oxide semiconductor. In this respect, it can be said that an embodiment of the disclosed invention includes a novel technical thought because it is not an i-type semiconductor such as silicon which is obtained by adding an impurity element.

<Conduction Mechanism of Transistor Including Oxide Semiconductor>

Here, the conduction mechanism of a transistor including an oxide semiconductor will be described with reference to FIG. 2, FIG. 3, FIGS. 4A and 4B, and FIG. 5. Note that the following description is based on the assumption of an ideal situation for simplification and does not entirely reflect a real situation. In addition, the following description is only an examination and does not influence availability of the invention.

FIG. 2 is a cross-sectional view of a transistor including an oxide semiconductor. An oxide semiconductor layer (OS) is provided over a gate electrode (GE1) with a gate insulating layer (GI) therebetween, and a source electrode (S) and a drain electrode (D) are provided over the oxide semiconductor layer.

Figure 3:
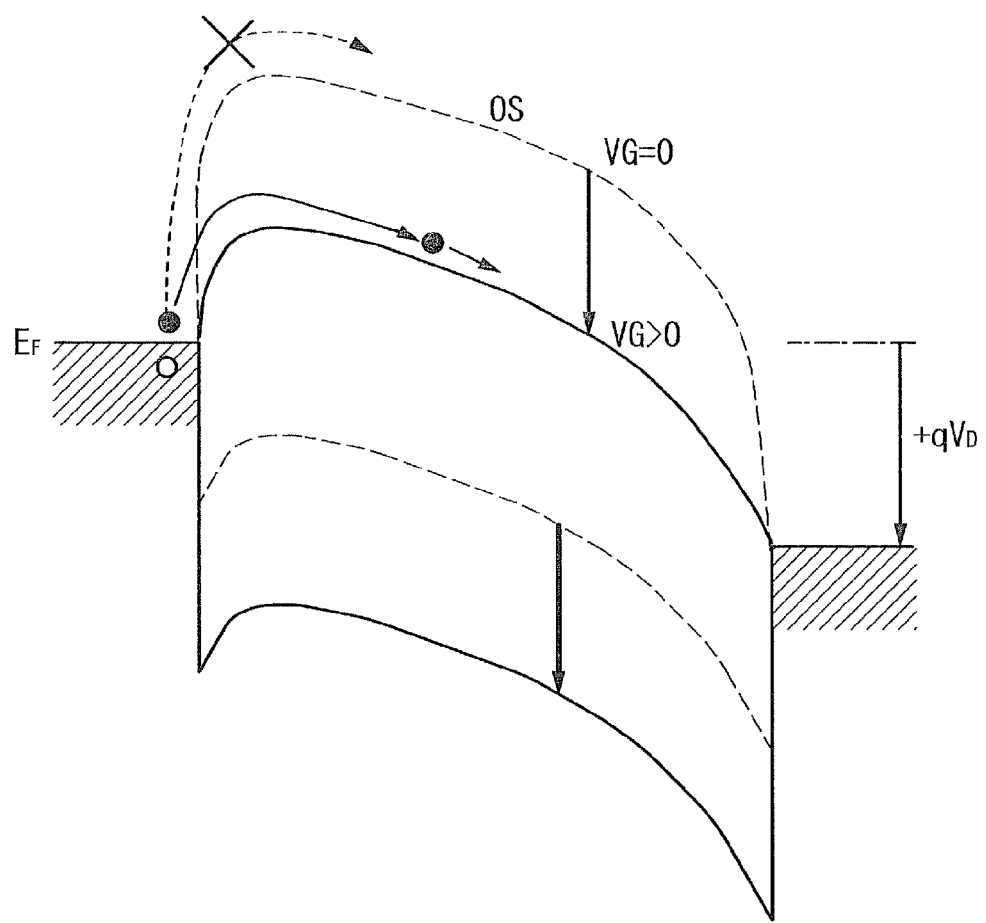
FIG. 3 is an energy band diagram (schematic diagram) along an A-A' section in FIG. 2.

FIG. 3 is an energy band diagram (schematic diagram) along A-A' in FIG. 2. In FIG. 3, a black circle (●) and a white circle (○) represent an electron and a hole and have electric charges (−q, +q), respectively. With a positive voltage ($V_D>0$) applied to the drain electrode, the dashed line shows the case where no voltage is applied to the gate electrode ($V_G=0$) and the solid line shows the case where a positive voltage is applied to the gate electrode ($V_G>0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 4A:
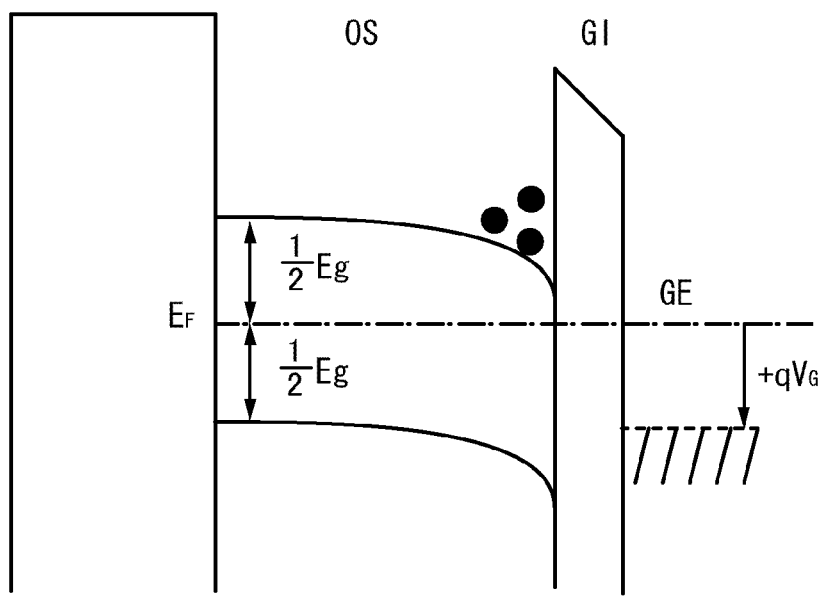
FIG. 4A is a diagram illustrating a state where a positive voltage ($V_G$>0) is applied to a gate (GE1) and FIG. 4B is a diagram illustrating a state where a negative voltage ($V_G$<0) is applied to the gate (GE1).
Figure 4B:
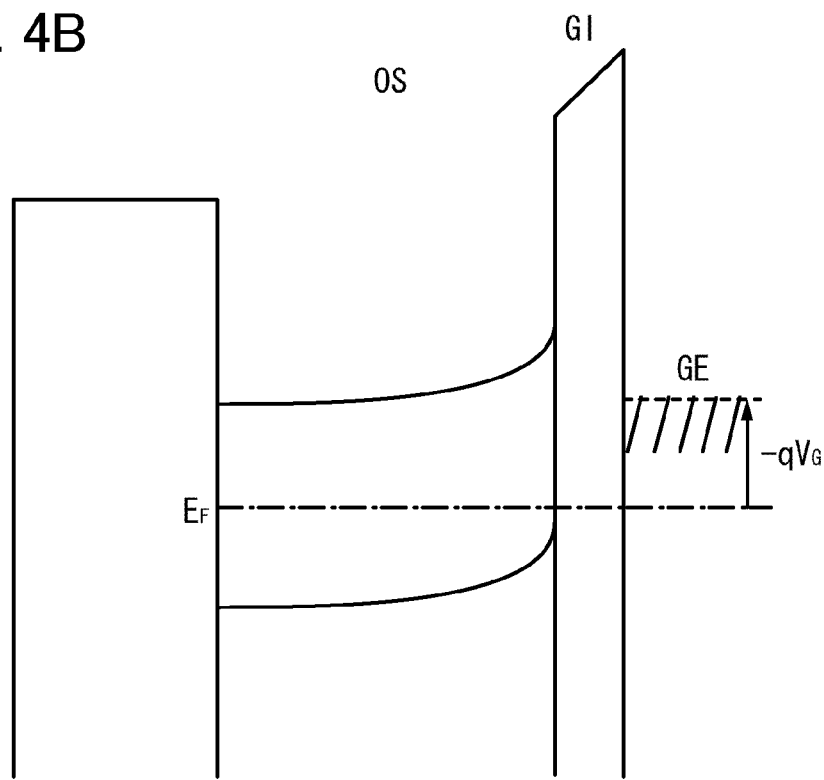

FIGS. 4A and 4B are energy band diagrams (schematic diagrams) along B-B' in FIG. 2. FIG. 4A illustrates a state where a positive voltage ($V_G>0$) is applied to the gate (GE1), that is, an on state where a carrier (electron) flows between a source and a drain. FIG. 4B illustrates a state where a negative voltage ($V_G<0$) is applied to the gate (GE1), that is, an off state (where a minority carrier (electron) does not flow).

Figure 5:
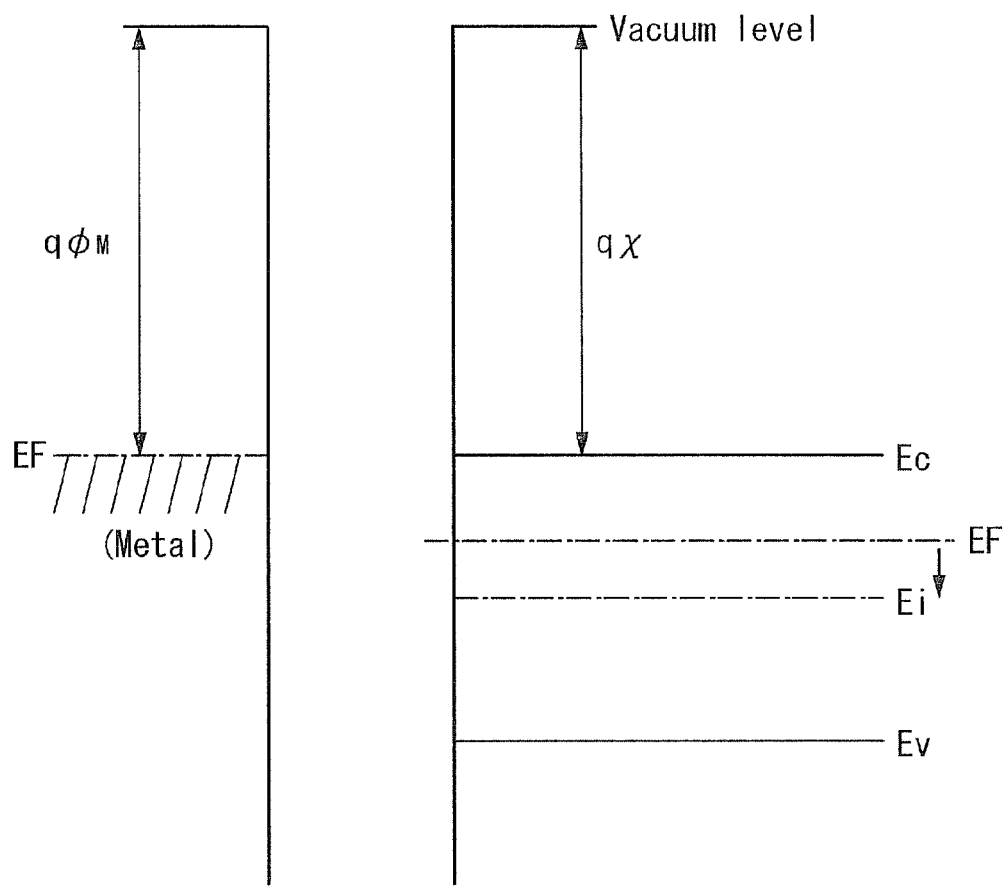
FIG. 5 is a diagram illustrating the relationships between the vacuum level and the work function of a metal (φM) and between the vacuum level and the electron affinity (χ) of an oxide semiconductor.

FIG. 5 illustrates the relation between the vacuum level, the work function of metal ($\phi_M$), and the electron affinity of an oxide semiconductor ($\chi$).

At normal temperature, electrons in the metal are degenerated and the Fermi level is located in the conduction band.

A conventional oxide semiconductor is n-type, and the Fermi level ($E_f$) is distant from the intrinsic Fermi level ($E_i$) in the center of the band gap and is located near the conduction band. It is known that hydrogen in an oxide semiconductor becomes a donor and is one of the causes to produce an n-type oxide semiconductor.

In contrast, an oxide semiconductor according to an embodiment of the disclosed invention is an oxide semiconductor that is made to be intrinsic (i-type) or to be close to intrinsic in the following manner: hydrogen, which is the cause to produce an n-type oxide semiconductor, is removed from the oxide semiconductor for high purification, so that the oxide semiconductor includes an element (impurity element) other than the main component of the oxide semiconductor as little as possible. That is, a feature of an embodiment of the disclosed invention is that an oxide semiconductor is made to be or be close to a highly-purified intrinsic (i-type) semiconductor not by addition of an impurity element but by elimination of impurities such as hydrogen and water as much as possible. Thus, the Fermi level ($E_f$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) contained in a source electrode and a drain electrode is substantially equal to the electron affinity ($\chi$) of an oxide semiconductor. In this case, a Schottky barrier against an electron is not formed at the interface between metal and an oxide semiconductor.

At that time, as illustrated in FIG. 4A, the electron travels in the vicinity of the interface between a gate insulating layer and the highly-purified oxide semiconductor (the bottom portion where the oxide semiconductor is stable in terms of energy).

As illustrated in FIG. 4B, when a negative potential is supplied to the gate electrode (GE1), a hole which is a minority carrier does not exist substantially. Thus, the current value is substantially close to 0.

In such a manner, the oxide semiconductor layer becomes intrinsic (an i-type semiconductor) or substantially intrinsic by being highly purified so as to contain an element other than its main element (i.e., an impurity element) as little as possible. Thus, characteristics of the interface between the oxide semiconductor and the gate insulating layer become obvious. For that reason, the gate insulating layer needs to form a favorable interface with the oxide semiconductor. Specifically, it is preferable to use the following insulating layer, for example: an insulating layer formed by a CVD method using high-density plasma generated with a power supply frequency in the range of the VHF band to the microwave band, or an insulating layer formed by a sputtering method.

When the interface between the oxide semiconductor and the gate insulating layer is made favorable while the oxide semiconductor is highly purified, in the case where the transistor has a channel width W of $1 \times 10^4$ µm and a channel length L of 3 µm, for example, it is possible to realize an off-current of $10^{-13}$ A or less and a subthreshold swing (S value) of 0.1 V/dec. (with a 100-nm-thick gate insulating layer).

When the oxide semiconductor is highly purified as described above so as to contain an element other than its main element (i.e., an impurity element) as little as possible, the transistor can operate in a favorable manner.

The transistor which is thus formed of a light-transmitting material, according to this embodiment, transmits light.

In the transistor according to this embodiment, the source electrode and the drain electrode are formed using the oxide conductive layer containing oxygen vacancy and an impurity (such as hydrogen) to have higher conductivity, so that the loss of on current is small.

Formed using the oxide semiconductor having a wide band gap and having a carrier concentration suppressed to less than $1 \times 10^{14}/cm^3$, preferably $1 \times 10^{12}/cm^3$ or less, the transistor according to this embodiment is normally off and the off current of the transistor is small. Specifically, the transistor can have an off current per a channel width of 1 µm of $1 \times 10^{-16}$ A/µm or lower, furthermore 1 aA/µm ($1 \times 10^{-18}$ A/µm) or lower, at room temperature.

The resistance to flow of off current in a transistor can be referred to as the off resistivity. The off resistivity is the resistivity of a channel formation region when the transistor is off, which can be calculated from the off current.

Specifically, when the values of off current and drain voltage are known, it is possible to obtain resistivity (off resistivity R) at the time when the transistor is off in accordance with Ohm's law. In addition, off resistivity $\rho$ can be obtained in accordance with the formula $\rho=RA/L$ (R: off resistivity), if the cross-sectional area A of a channel formation region and the length L of the channel formation region (the length corresponds to a distance between the source and drain electrodes) are known.

The cross-sectional area A can be calculated from A=dW where the thickness of the channel formation region is d and the channel width is W. The length L of the channel formation region is the channel length L. In this manner, the off resistivity can be calculated from the off current.

The transistor including the oxide semiconductor layer according to this embodiment has an excellent off resistivity of $1 \times 10^9$ Ω·m or more.

In the transistor according to this embodiment, the barrier layers which inhibit diffusion of hydrogen and oxygen are provided between the oxide conductive layer and the highly purified oxide semiconductor layer; therefore, diffusion of impurities (e.g., an impurity containing a hydrogen atom) included in the oxide conductive layer into the oxide semiconductor layer can be suppressed. Further, the barrier layers suppress diffusion of oxygen atoms included in the oxide semiconductor layer into the oxide conductive layer.

In the light-transmitting transistor described as an example in this embodiment, the highly purified oxide semiconductor layer is protected by the barrier layers, so that the transistor has normally-off characteristics and a characteristic of smaller off current and the characteristics are unlikely to be changed. Thus, the transistor has high reliability.

Note that this embodiment can be appropriately combined with any of the other embodiments described in this specification.

Embodiment 2

In this embodiment, a display device for which a bottom-gate transistor which transmits visible light is used will be described as an embodiment of a semiconductor device with reference to FIGS. 6A and 6B. In addition, a method for manufacturing the bottom-gate transistor which transmits visible light will be described with reference to FIGS. 7A to 7D.

A method for manufacturing a channel-protective transistor which can be formed together with the bottom-gate transistor which transmits visible light will also be described with reference to FIGS. 7A to 7D.

Figure 6A:
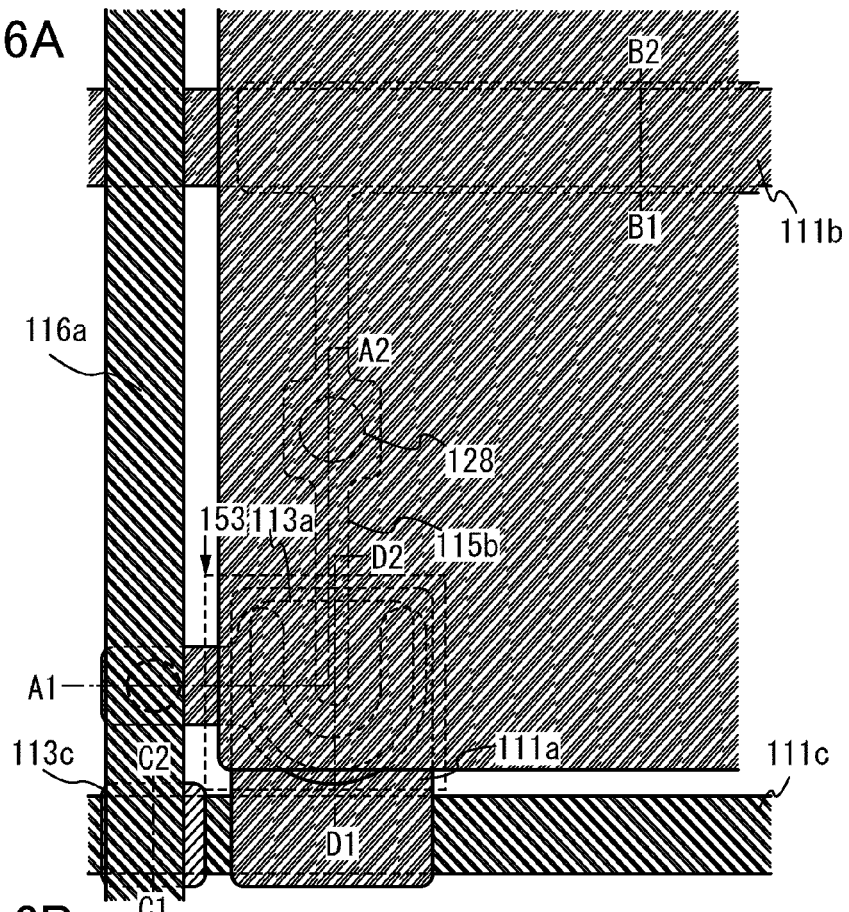
FIGS. 6A and 6B illustrate a semiconductor device according to an embodiment.

FIG. 6A is a top plan view illustrating a pixel portion of a display device for which a bottom-gate transistor which transmits visible light is used. FIG. 6B is a cross-sectional view illustrating a layered structure of the pixel portion of the display device for which a bottom-gate transistor which transmits visible light is used. Note that a dashed-dotted line A1-A2 in FIG. 6A corresponds to a cross section A1-A2 in FIG. 6B. A dashed-dotted line B1-B2 in FIG. 6A corresponds to a cross section B1-B2 in FIG. 6B. A dashed-dotted line C1-C2 in FIG. 6A corresponds to a cross section C1-C2 in FIG. 6B. A dashed-dotted line D1-D2 in FIG. 6A corresponds to a cross section D1-D2 in FIG. 6B.

The cross section A1-A2 illustrates the layered structure of a transistor 153. The cross section D1-D2 different from the cross section A1-A2 also illustrates the layered structure of the transistor 153 from another direction.

The transistor 153 includes, over the light-transmitting substrate 100, the gate electrode 111a which is connected to a gate wiring 111c; the first insulating layer 102 over the gate electrode 111a; the oxide semiconductor layer 123 in contact with the first insulating layer 102 over the gate electrode 111a; the first electrode 115a and the second electrode 115b having end portions overlapping with the gate electrode 111a; the barrier layer 114a between the first electrode 115a and the oxide semiconductor layer 123; and the barrier layer 114b between the second electrode 115b and the oxide semiconductor layer 123.

The second insulating layer 107 and the oxide semiconductor layer 123 are in contact with each other over the gate electrode 111a between a region where the oxide semiconductor layer 123 overlaps with the first electrode 115a and a region where the oxide semiconductor layer 123 overlaps with the second electrode 115b. An opening 127 is formed in the second insulating layer 107, the signal line 116a is formed in the opening 127, and the third insulating layer 108 is provided over the second insulating layer 107 and the signal line 116a, and a fourth insulating layer 109 is provided over the third insulating layer 108. A pixel electrode 120 electrically connected to the second electrode 115b through an opening 128 formed in the second insulating layer 107, the third insulating layer 108, and the fourth insulating layer 109 is provided over the fourth insulating layer 109.

The cross section B1-B2 illustrates the layered structure of a capacitor portion.

In the capacitor portion, the second electrode 115b of the transistor 153 is extended to be formed over the first capacitor electrode 111b, which is provided over the substrate 100, with the first insulating layer 102 and the barrier layer 114b therebetween. The first capacitor electrode 111b can be formed together with the gate electrode 111a of the transistor 153 and the first insulating layer 102, the barrier layer 114b, and the second electrode 115b can be formed concurrently with those of the transistor 153.

Since the first capacitor electrode 111b and the second electrode 115b have light-transmitting properties, the capacitor portion transmits light. Thus, the aperture ratio of a pixel is not reduced. Further, a distance between the first capacitor electrode 111b and the second electrode 115b is short, so that a large capacitance can be obtained.

The cross section C1-C2 illustrates the cross-sectional structure of an intersection of the gate wiring 111c and the signal line 116a.

The signal line 116a is across and over the gate wiring 111c, which is provided over the substrate 100, with the first insulating layer 102, an oxide semiconductor layer 113c, and the second insulating layer 107 therebetween. The gate wiring 111c is connected to the gate electrode of the transistor 153.

At the intersection of the gate wiring 111c and the signal line 116a, the distance between them is increased; thus, wiring capacitance is reduced.

Next, a method for manufacturing the transistor 153 which is a bottom-gate type and transmits visible light will be described with reference to FIGS. 7A to 7D.

Figure 6B:
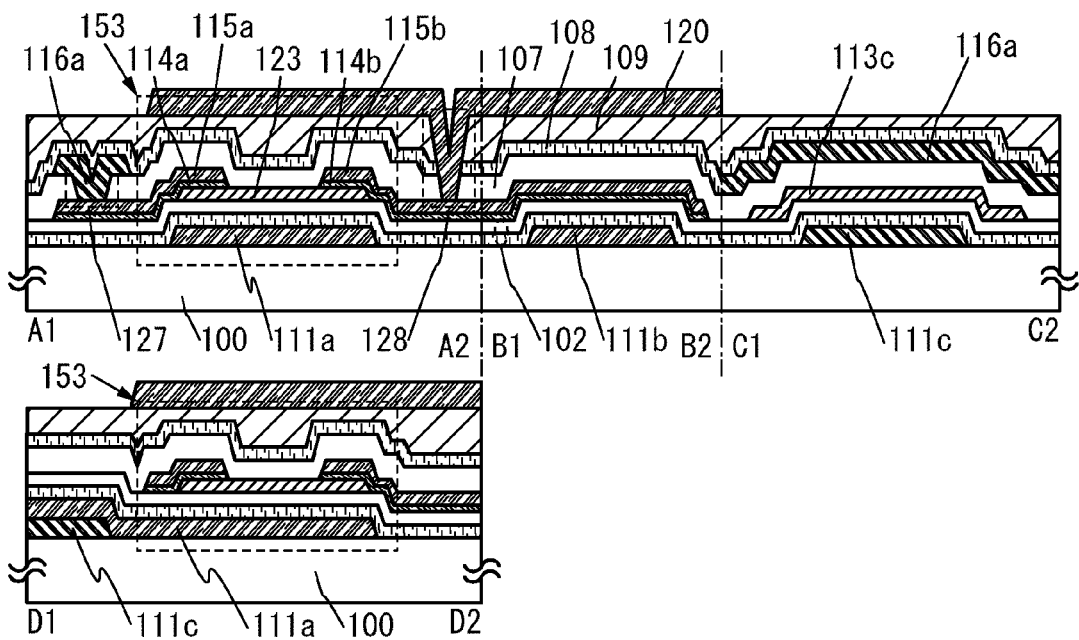
Figure 7A:
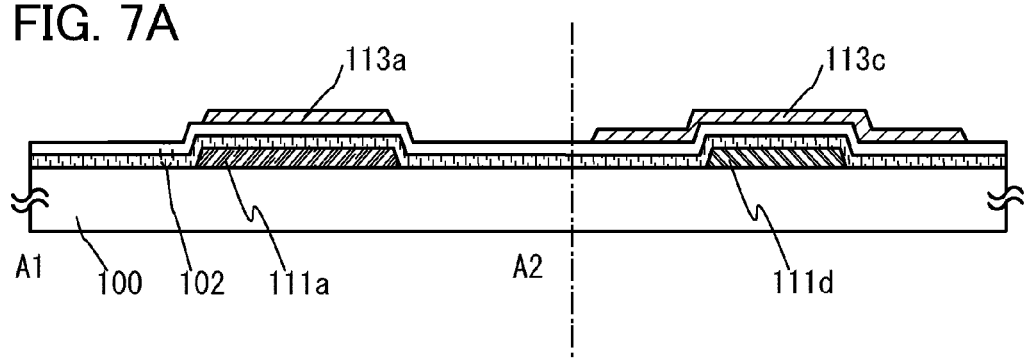
FIGS. 7A to 7D illustrate a method for manufacturing a semiconductor device according to an embodiment.
Figure 7B:
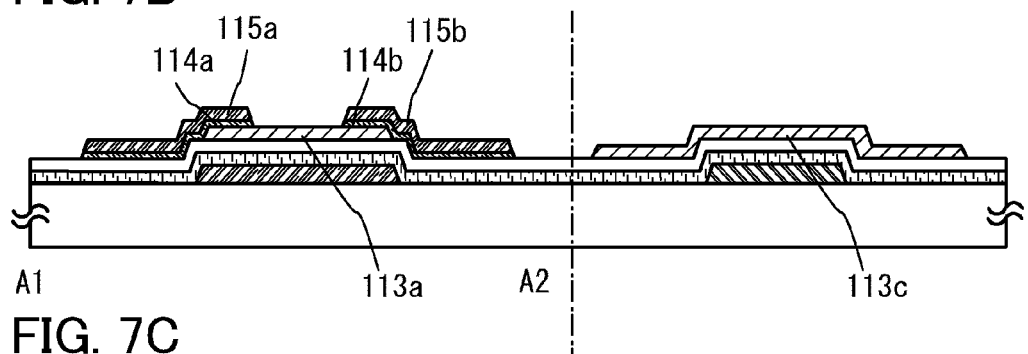
Figure 7C:
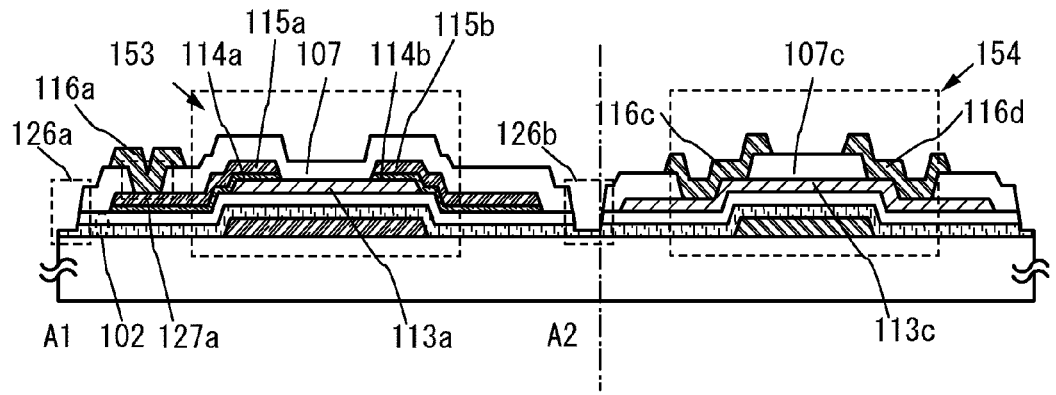
Figure 7D:
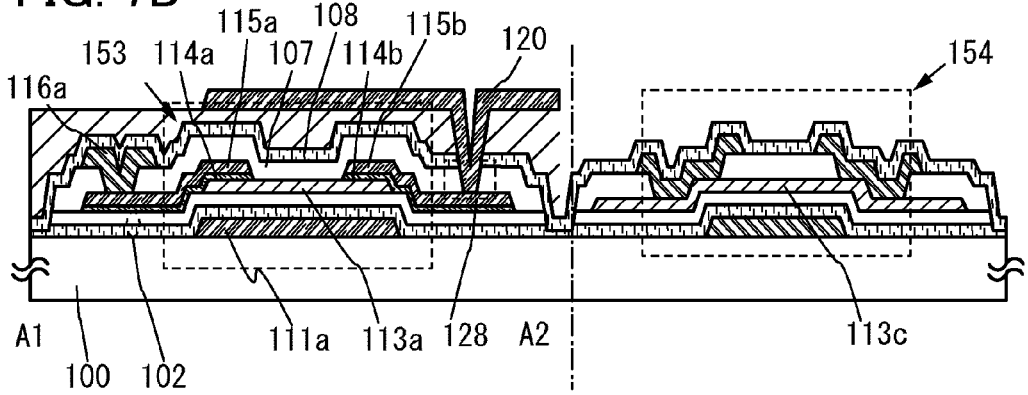

The transistor 153 illustrated in FIG. 7D has the same structure as the bottom-gate transistor which transmits visible light and is used for the pixel portion of the display device illustrated in FIGS. 6A and 6B.

FIG. 7D also illustrates a transistor 154 which has a structure different from that of the transistor 153 but can be formed concurrently with the transistor 153 over the same substrate, as an example.

The transistor 154 includes a gate electrode 111d formed of the same material as the gate wiring 111c, and a third electrode 116c and a fourth electrode 116d formed using a conductive film formed of the same material as the signal line 116a. Further, the transistor 154 includes an insulating layer 107c over a channel formation region in the oxide semiconductor layer 113c, and the insulating layer 107c functions as a channel protective layer.

Note that in this embodiment, "B formed of the same material as A" means that A and B are formed of the same material in the same step.

In this embodiment, aluminoborosilicate glass is used for the substrate 100.

First, the gate electrode 111a, the gate electrode 111d, and a gate wiring electrically connected to the gate electrodes are formed. In this embodiment, a conductive layer to be the gate electrode 111a and a conductive layer including the gate wiring are collectively referred to as a first conductive layer. Note that the gate wiring is not illustrated in FIGS. 7A to 7D.

In this embodiment, a conductive layer having a three-layer structure in which a titanium layer, an aluminum layer, and a titanium layer are stacked is used for the gate wiring and the gate electrode 111d, and indium tin oxide (ITO) is used for a conductive layer which transmits visible light and is to be the gate electrode 111a.

The conductive layer having a three-layer structure in which a titanium layer, an aluminum layer, and a titanium layer are stacked is formed over the substrate 100 by a sputtering method. Then, through a first photolithography process, a resist mask is formed and etching is selectively performed with the use of the resist mask, so that the gate electrode 111d and the gate wiring are formed. Note that the gate electrode 111d formed of the same material as the gate wiring serves as a gate electrode of the transistor 154.

Next, indium tin oxide (ITO) is deposited. Through a second photolithography process, a resist mask is formed and etching is selectively performed with the use of the resist mask, so that the gate electrode 111a which transmits light is formed. Note that the gate electrode 111a having a light-transmitting property serves as the gate electrode of the transistor 153.

The conductive film for forming the gate wiring is formed of a metal material such as Al, Cu, Cr, Ta, Ti, Mo, or W; or an alloy material containing any of the metal materials as a component. Alternatively, a structure may be employed in which a high-melting-point metal film of Cr, Ta, Ti, Mo, W, or the like is stacked over one of or both metal layers of Al, Cu, or the like. Still alternatively, when an Al material to which an element preventing generation of hillocks and whiskers in an Al film, such as Si, Ti, Ta, W, Mo, Cr, Nd, Sc, or Y, is added is used, heat resistance can be increased.

In this embodiment, the case where the gate wiring is formed and then the gate electrode having a light-transmitting property is formed; however, the gate wiring may be formed after formation of the gate electrode having a light-transmitting property.

Next, the first insulating layer 102 is formed. In this embodiment, a silicon oxide layer is stacked over a silicon nitride layer to form the first insulating layer 102.

As the first insulating layer 102, a single-layer film or a laminate film of any of a silicon oxide layer, a silicon oxynitride layer, a silicon nitride oxide layer, a silicon nitride layer, an aluminum oxide layer, a tantalum oxide layer, and the like can be used. Further, the first insulating layer 102 is formed to a thickness of 50 nm to 250 nm inclusive by a CVD method, a sputtering method, or the like. Note that the layer may be doped with phosphorus (P) or boron (B).

Note that in the first insulating layer 102, an oxide insulating layer is provided preferably on the side where the first insulating layer 102 is in contact with the oxide semiconductor layer. Further, an oxide semiconductor that becomes intrinsic or substantially intrinsic by removal of impurities (a highly purified oxide semiconductor) and is used in this embodiment is quite susceptible to the interface level and the interface charge; therefore, the interface with an insulating layer is important. Thus, an insulating layer that is to be in contact with a highly purified oxide semiconductor layer needs to have high quality.

Then, the oxide semiconductor layer is formed. In this embodiment, the oxide semiconductor layer is formed using an In—Ga—Zn—O-based non-single-crystal film formed by sputtering with the use of an In—Ga—Zn—O-based oxide semiconductor film formation target.

The thickness of the oxide semiconductor layer is 5 nm to 200 nm inclusive, preferably 10 nm to 20 nm inclusive, and is set to, for example, 15 nm.

Note that before the oxide semiconductor layer is formed, dust attached to a surface of the first insulating layer 102 is preferably removed by reverse sputtering in which an argon gas is introduced and plasma is generated.

The reverse sputtering refers to a method in which an RF power source is used for application of a voltage to a substrate in an argon atmosphere so that plasma is generated to modify a surface of the substrate. Note that instead of an argon atmosphere, a nitrogen atmosphere, a helium atmosphere, or the like may be used. Alternatively, an argon atmosphere to which oxygen, $N_2O$, or the like is added may be used. Still alternatively, an argon atmosphere to which $Cl_2$, $CF_4$, or the like is added may be used.

After the reverse sputtering, the oxide semiconductor film is formed without being exposed to the air, whereby dust or moisture can be prevented from attaching to an interface between the oxide semiconductor layer and the first insulating layer 102.

Alternatively, the oxide semiconductor film can be formed by a sputtering method in a rare gas (typically argon) atmosphere, an oxygen atmosphere, or a mixed atmosphere of a rare gas (typically argon) and oxygen. In the case of using a sputtering method, film formation may be performed using a target containing $SiO_2$ at 2 wt % to 10 wt % inclusive and SiOx (x>0) which inhibits crystallization may be contained in the oxide semiconductor film.

Here, the oxide semiconductor film is formed using an oxide semiconductor film formation target, which contains In, Ga, and Zn (the ratio of $In_2O_3$ to $Ga_2O_3$ to ZnO is 1:1:1 or 1:1:2 in molar ratio) under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%). Note that a pulse direct current (DC) power is preferably used because dust can be reduced and the film thickness can be uniform.

In that case, the oxide semiconductor film is preferably formed removing moisture remaining in the treatment chamber. This is for preventing hydrogen, a hydroxyl group, and moisture from being contained in the oxide semiconductor film.

A multi-chamber sputtering apparatus used in this embodiment is provided with a target of silicon or silicon oxide (artificial quartz), and a target for forming the oxide semiconductor film. A deposition chamber provided with the target for forming the oxide semiconductor film is further provided with at least a cryopump as an evacuation unit. Note that a turbo molecular pump may be used instead of the cryopump, and a cold trap may be provided so that moisture or the like may be adsorbed onto an inlet of the turbo molecular pump.

In the deposition chamber which is evacuated with the cryopump, for example, a hydrogen atom, a compound containing a hydrogen atom, such as $H_2O$, a carbon atom, a compound containing a carbon atom, and the like are removed, whereby the concentration of an impurity in the oxide semiconductor film formed in the deposition chamber can be reduced.

It is preferable that the oxide semiconductor film be formed over the first insulating layer 102, following the formation of the first insulating layer 102.

It is preferable that a high-purity gas in which an impurity such as hydrogen, water, a hydroxyl group, or hydride is removed to a concentration of about 1 ppm, preferably a concentration of about 10 ppb be used as the sputtering gas for the formation of the oxide semiconductor film.

The oxide semiconductor film may be formed while the substrate is heated. At that time, the substrate temperature is set to 100° C. to 600° C. inclusive, preferably 200° C. to 400° C. inclusive. By forming the oxide semiconductor film while the substrate is heated, the concentration of an impurity contained in the formed oxide semiconductor film can be reduced.

Next, through a third photolithography process, a resist mask is formed and etching is selectively performed with the use of the resist mask, so that an island-shaped oxide semiconductor layer 113a and the oxide semiconductor layer 113c are formed with the use of an In—Ga—Zn—O-based non-single-crystal.

In the etching, organic acid such as citric acid or oxalic acid can be used for an etchant. In the case where etching is performed so that end portions of the island-shaped oxide semiconductor layer have tapered shapes, breakage of a wiring due to a step shape can be prevented. Note that etching here is not limited to wet etching and dry etching may also be performed.

Then, a substrate provided with the island-shaped oxide semiconductor layer 113a and the oxide semiconductor layer 113c is subjected to first heat treatment to dehydrate or dehydrogenate the island-shaped oxide semiconductor layer.

Note that in this specification, heat treatment in an atmosphere of an inert gas such as nitrogen or a rare gas is referred to as heat treatment for dehydration or dehydrogenation. In this specification, "dehydrogenation" does not indicate that only $H_2$ is eliminated by the heat treatment. For convenience, elimination of H, a hydroxyl group, or the like is referred to as "dehydration or dehydrogenation".

In this embodiment, for the first heat treatment, the temperature of the substrate provided with the island-shaped oxide semiconductor layer is heated to a temperature T. Rapid thermal anneal (RTA) treatment is performed at a temperature T of 700° C. or lower (or a temperature lower than or equal to the strain point of a glass substrate), preferably 350° C. to 500° C. inclusive, for approximately 1 minute to 10 minutes.

The inert gas atmosphere used for the first heat treatment is preferably an atmosphere which contains nitrogen or a rare gas (e.g., helium, neon, or argon) as its main component and does not contain water, hydrogen, or the like. Alternatively, the purity of an inert gas which is introduced into a heat treatment apparatus is preferably 6N (99.9999%) or lower, more preferably 7N (99.99999%) or lower (that is, the impurity concentration is 1 ppm or lower, preferably 0.1 ppm or lower).

It is important that the oxide semiconductor layer should not be exposed to the air so that entry of water or hydrogen into the oxide semiconductor layer can be prevented when the oxide semiconductor layer is dehydrated or dehydrogenated.

Note that the heat treatment apparatus may be an electric furnace or an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp.

Since dehydration or dehydrogenation can be performed in a short time by an RTA method, the first heat treatment can be performed even at a temperature over the strain point of a glass substrate. A GRTA apparatus is an apparatus for heat treatment with a high-temperature gas.

Note that the timing of heat treatment is not limited to this timing and may be performed plural times, for example, before and after a photolithography process or a film formation step.

In the oxide semiconductor layer which is sufficiently dehydrated or dehydrogenated under the above conditions, at least a peak at around 250° C. to 300° C. of two peaks in spectra which show discharge of moisture is not detected with thermal desorption spectroscopy (TDS) even when the temperature of the dehydrated or dehydrogenated oxide semiconductor layer is increased to 450° C. for measurement.

The oxide semiconductor layer is an amorphous layer having many dangling bonds at the stage where the oxide semiconductor layer is formed. Through the first heat treatment for the dehydration or dehydrogenation, dangling bonds within a short distance are bonded to each other, so that the oxide semiconductor layer can have an ordered amorphous structure. As ordering proceeds, the oxide semiconductor layer comes to be formed of a mixture of amorphousness and microcrystals, where an amorphous region is dotted with microcrystals.

In addition, the first heat treatment can also be performed on the oxide semiconductor film which has not yet processed into the island-shaped oxide semiconductor layer. In that case, after the first heat treatment, the substrate is taken out of the heating apparatus and subjected to a photolithography process to form the island-shaped oxide semiconductor layer.

FIG. 7A is a cross-sectional view at this stage.

Next, the barrier layer 114a, the barrier layer 114b, the first electrode 115a, and the second electrode 115b are formed.

In this embodiment, titanium nitride is used for the barrier layers 114a and 114b, and indium tin oxide (ITO) is used for a second conductive film which to be the first electrode 115a and the second electrode 115b.

A titanium nitride film which is to be the barrier layers is formed to cover the island-shaped oxide semiconductor layer 113a formed over the first insulating layer 102, and an indium tin oxide (ITO) film which is a conductive film transmitting visible light is formed over the titanium nitride film. Note that the titanium nitride film and the indium tin oxide (ITO) film can be formed by a sputtering method.

The indium tin oxide (ITO) film is formed in a reduced atmosphere. For example, the indium tin oxide (ITO) film can be formed with the used of a target with a diameter of 302 mm obtained by mixing indium oxide ($In_2O_3$) and tin oxide ($SnO_2$) in the weight ratio of 85 to 15 and performing sintering, by a DC sputtering method, where the pressure in the chamber is 0.4 Pa and the power is 1 Kw. As a deposition gas, a mixed gas of argon, oxygen, and hydrogen or a mixed gas of argon, oxygen, and water vapor can be used. Specifically, a gas containing argon, oxygen, and hydrogen so that the volume ratio in a normal state is 50:1:10 (=$Ar:O_2:H_2$) can be used. Alternatively, a gas containing argon, oxygen, and water vapor so that the volume ratio in a normal state is 50:1:1 (=$Ar:O_2:H_2O$) can be used.

When such a gas to which hydrogen or water vapor is added is used, the indium tin oxide (ITO) film is formed to be amorphous and thus, processability is improved. Further, oxygen vacancy generated due to film formation in a reduced atmosphere and an added impurity (such as hydrogen or a compound containing hydrogen) lead to increase in conductivity.

Covered with the titanium nitride film to be the barrier layers, the oxide semiconductor layer 113a which has been subjected to dehydration or dehydrogenation is not exposed to a reduced atmosphere for increasing conductivity of the light-transmitting conductive film.

Then, through a fourth photolithography process, a resist mask is formed and etching is selectively performed with the use of the resist mask, so that the barrier layer 114a, the barrier layer 114b, the first electrode 115a, and the second electrode 115b are formed.

FIG. 7B illustrates a cross-sectional view at this stage.

Before formation of the barrier layer 114a, the barrier layer 114b, the first electrode 115a, and the second electrode 115b, the first insulating layer 102 may be selectively etched to form a contact hole which reaches the gate wiring or the gate electrode. After formation of the contact hole which reaches the gate wiring or the gate electrode, the titanium nitride film to be the barrier layers and the light-transmitting conductive film are formed, whereby the gate wiring or the gate electrode can be directly connected to the titanium nitride film and the light-transmitting conductive film without another conductive layer interposed therebetween. With such a structure, the number of contact holes needed for connection can be reduced. Reduction in the number of contact holes needed for connection leads to not only decrease in electric resistance but also decrease in area occupied by the contact holes.

Next, the second insulating layer 107 is formed over the first insulating layer 102, the oxide semiconductor layer 113a, the oxide semiconductor layer 113c, the first electrode 115a, and the second electrode 115b. The second insulating layer 107 includes an inorganic insulating layer, and a silicon oxide film, a silicon nitride oxide film, an aluminum oxide film, an aluminum oxynitride film, or the like is used for the second insulating layer 107. Further, the second insulating layer 107 can be formed to a thickness of at least 1 nm by employing a method with which impurities such as water and hydrogen do not enter the oxide insulating layer, such as a sputtering method, as appropriate. At this stage, a region where the oxide semiconductor layer and the second insulating layer 107 are in contact with each other is formed.

A region of the oxide semiconductor layer, which overlaps with the gate electrode and is sandwiched between and in contact with the second insulating layer 107 and the first insulating layer 102, is a channel formation region. The second insulating layer 107 is provided over and in contact with the channel formation region in the oxide semiconductor layer, and functions as a channel protective layer.

The second insulating layer 107 is provided in contact with the oxide semiconductor layer which contains few impurities such as a compound containing a hydrogen atom typified by $H_2O$, a compound containing a carbon atom, a hydrogen atom, or a carbon atom. The second insulating layer 107 does not contain impurities such as moisture, hydrogen ions, or a hydroxyl group and prevents entry of these from the outside.

In this embodiment, silicon oxide is used for the second insulating layer 107.

A silicon oxide film to be the second insulating layer 107 is formed by a sputtering method. The substrate temperature at the time of film formation may be at room temperature to 600° C. inclusive, preferably 200° C. to 400° C. inclusive, and is 100° C. in this embodiment. The silicon oxide film can be formed by a sputtering method in a rare gas (typically, argon) atmosphere, an oxygen atmosphere, or a mixed atmosphere of a rare gas (typically, argon) and oxygen. Note that an oxide insulating layer formed by a sputtering method is particularly dense, and can be used as a protective film for preventing diffusion of impurities into a layer in contact with the oxide insulating layer even if it is a single layer. In addition, a target doped with phosphorus (P) or boron (B) can be used so that phosphorus (P) or boron (B) is added to the oxide insulating layer.

As a target, a silicon oxide target or a silicon target can be used, and a silicon target is particularly preferable. The silicon oxide film formed by a sputtering method in a mixed atmosphere of oxygen and a rare gas with the use of a silicon target includes many dangling bonds of silicon atoms or oxygen atoms.

Since the second insulating layer 107 which is formed using silicon oxide and which is described as an example of this embodiment contains many dangling bonds, impurities contained in the oxide semiconductor layer 113a and the oxide insulating layer 113c are more likely to diffuse into the second insulating layer 107 through the interface between the oxide semiconductor layer and the second insulating layer 107. Specifically, a hydrogen atom or a compound containing a hydrogen atom, such as $H_2O$, in the oxide semiconductor layer is more likely to diffuse into the second insulating layer 107.

In this embodiment, the film formation is performed by a pulsed DC sputtering method using a boron-doped columnar polycrystalline silicon target (the resistivity is 0.01 Ωcm) with a purity of 6N under conditions where the distance between the substrate and the target (T-S distance) is 89 mm, the pressure is 0.4 Pa, the direct-current (DC) power source is 6 kW, and the atmosphere is oxygen (the oxygen flow rate is 100%). The film thickness thereof is 300 nm.

Then, through a fifth photolithography process, a resist mask is formed and etching is selectively performed with the use of the resist mask, so that the openings 126a, 126b, and 127a are formed in the second insulating layer.

Next, the signal line 116a, the third electrode 116c, and the fourth electrode 116d are formed. First, a third conductive layer to be the signal line 116a, the third electrode 116c, and the fourth electrode 116d is formed.

The third conductive layer is formed of a metal material such as Al, Cu, Cr, Ta, Ti, Mo, or W; or an alloy material containing any of the metal materials as a component. Alternatively, a structure may be employed in which a high-melting-point metal film of Cr, Ta, Ti, Mo, W, or the like is stacked over one of or both metal layers of Al, Cu, or the like. Still alternatively, when an Al material to which an element preventing generation of hillocks and whiskers in an Al film, such as Si, Ti, Ta, W, Mo, Cr, Nd, Sc, or Y, is added is used, heat resistance can be increased.

For the third conductive layer, a conductive film having a three-layer structure in which a titanium layer, an aluminum layer, and a titanium layer are stacked is used.

The conductive film having a three-layer structure in which a titanium layer, an aluminum layer, and a titanium layer are stacked is formed to cover the second insulating layer 107, the insulating layer 107c, and the openings by a sputtering method. Then, through a sixth photolithography process, a resist mask is formed and etching is selectively performed with the use of the resist mask, so that the signal line 116a, the third electrode 116c, and the fourth electrode 116d are formed. Note that the third electrode 116c and the fourth electrode 116d which are formed of the same material as the signal line 116a serve as a source electrode and a drain electrode of the transistor 154.

FIG. 7C illustrates a cross-sectional view at this stage.

Next, the third insulating layer 108 is formed over the second insulating layer 107. As the third insulating layer 108, a silicon nitride film, a silicon nitride oxide film, an aluminum nitride film, or the like can be used.

In this embodiment, silicon nitride is used for the third insulating layer 108. The third insulating layer 108 can be formed by an RF sputtering method.

After the formation of the second insulating layer 107, second heat treatment (preferably at a temperature of 200° C. to 400° C. inclusive, for example, 250° C. to 350° C. inclusive) may be performed in a rare gas atmosphere or a nitrogen gas atmosphere.

For example, the second heat treatment is performed in a nitrogen gas atmosphere at 250° C. for one hour. In the second heat treatment, heating is performed in the state where part of the oxide semiconductor layers 113a and 113c is in contact with the second insulating layer 107, another part of the oxide semiconductor layer 113a is in contact with the barrier layers (114a and 114b), and another part of the oxide semiconductor layer 113c is in contact with the signal lines (116a and 116b).

In the oxide semiconductor layer which has been dehydrated or dehydrogenated through the first treatment, oxygen vacancy is generated due to the first heat treatment; that is, the oxide semiconductor layer is changed into an n-type (e.g., $n^-$type or $n^+$type) oxide semiconductor layer.

The second heat treatment is performed in a state where the n-type (e.g., $n^-$type or $n^+$type) oxide semiconductor layer is in contact with the oxide insulating layer, whereby oxygen vacancy is eliminated and thus the n-type oxide semiconductor layer is changed into a high-resistance oxide semiconductor layer (i-type oxide semiconductor layer).

Through such a process, the oxide semiconductor layer is highly purified. When the transistor is formed using such a highly-purified oxide semiconductor layer, a switching element which is off when the potential of a gate electrode is 0 (so-called normally-off characteristics) can be realized.

Among the electric characteristics of a transistor, the threshold voltage (Vth) is particularly important. When the threshold voltage is high or is negative even if the field effect mobility is high, it is difficult to control a circuit. In the case of a transistor where an absolute value of the threshold voltage is large, the transistor cannot perform a switching function as the transistor and might be a load when the transistor is driven at low voltage.

In the case of an n-channel transistor, it is desirable that a channel be formed and a drain current flow, only after a positive voltage is applied as a gate voltage. A transistor in which a channel is not formed unless the driving voltage is increased and a transistor in which a channel is formed and a drain current flows even in the case of the negative voltage state are unsuitable for a transistor used for a circuit. If the threshold voltage of a transistor is negative, it tends to be normally on; in other words, a current flows between a source electrode and a drain electrode even when the gate voltage is 0 V.

As for an active matrix display device, electric characteristics of a transistor included in a circuit are significant and performance of the display device depends on the electric characteristics. In the case of using a transistor for a display device, it is desirable that a channel be formed by applying a positive threshold voltage which is as close to 0 V as possible to a gate.

In this embodiment, heating is performed in the state where channel formation regions of the oxide semiconductor layers 113a and 113c are in contact with the second insulating layer 107, so that the channel formation regions come to have higher resistance (be i-type). Consequently, the transistor 153 including the oxide semiconductor layer 113a and the transistor 154 including the oxide semiconductor layer 113c each have normally-off characteristics.

In the case where a metal conductive layer with high oxygen affinity is in contact with an oxide semiconductor layer, oxygen tends to move toward the metal conductive layer side by performing second heat treatment and a region of the oxide semiconductor layer, which is in contact with the metal conductive layer, comes to be n-type.

In this embodiment, a region of the oxide semiconductor layer 113c, which is in contact with the third electrode 116c, and a region of the oxide semiconductor layer 113c, which is in contact with the fourth electrode 116d, come to be n-type by heating.

Note that the timing for performing the second heat treatment is not limited to the timing just after the sixth photolithography process as long as it is after the fifth photolithography process.

Through the above process, the transistor 153 and the transistor 154 can be manufactured.

According to a method for manufacturing a semiconductor element in this embodiment, a semiconductor element can be manufactured in which the barrier layers which inhibit diffusion of hydrogen and oxygen are provided between the oxide conductive layer and the highly purified oxide semiconductor layer and thus, diffusion of impurities (e.g., an impurity containing a hydrogen atom) included in the oxide conductive layer into the oxide semiconductor layer can be suppressed. Further, a semiconductor element can be manufactured in which the barrier layers suppress diffusion of an oxygen atom included in the oxide semiconductor layer into the oxide conductive layer.

In addition, according to a method for manufacturing a semiconductor element, which is described as an example in this embodiment, a light-transmitting semiconductor element having high reliability can be manufactured; in the light-transmitting semiconductor element, a highly purified oxide semiconductor layer is protected by a barrier layer, so that the light-transmitting semiconductor element has normally-off characteristics and a characteristic of smaller off current and the characteristics are unlikely to be changed with the lapse of time.

Note that this embodiment can be appropriately combined with any of the other embodiments described in this specification.

Embodiment 3

In this embodiment, an example of a structure of a terminal portion provided over a substrate over which a semiconductor device is provided is illustrated in FIGS. 8A-1, 8A-2, 8B-1, and 8B-2. Note that in FIGS. 8A-1, 8A-2, 8B-1, and 8B-2, the portions which are the same as those in FIGS. 1A-1, 1A-2, 1B-1, and 1B-2 are denoted by common reference numerals.

Figures 1, 8A:
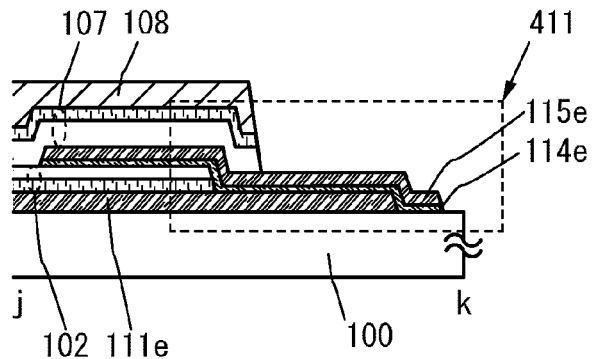
Figures 2, 8A:
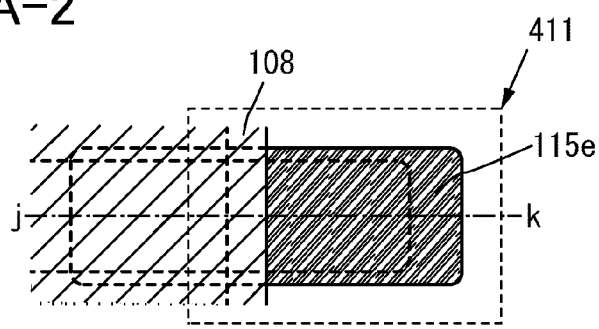

FIGS. 8A-1 and 8A-2 illustrate a top plan view and a cross-sectional view of a terminal portion of a gate wiring, respectively. FIG. 8A-1 corresponds to a cross-sectional view along j-k in FIG. 8A-2.

In FIG. 8A-1, a first terminal 411 is a connection terminal functioning as an input terminal. As for the first terminal 411, a conductive layer 111e formed of the same material as the gate wiring and a conductive layer 115e formed of the same material as a second conductive layer are stacked with a barrier layer 114e therebetween. Although not illustrated in the drawing, the conductive layer 111e is electrically connected to the gate wiring.

Figures 1, 8B:
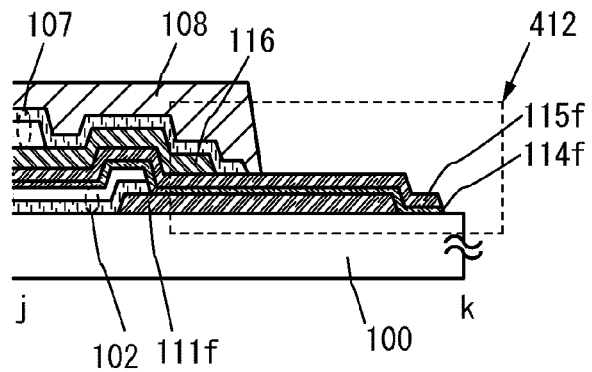
Figures 2, 8B:
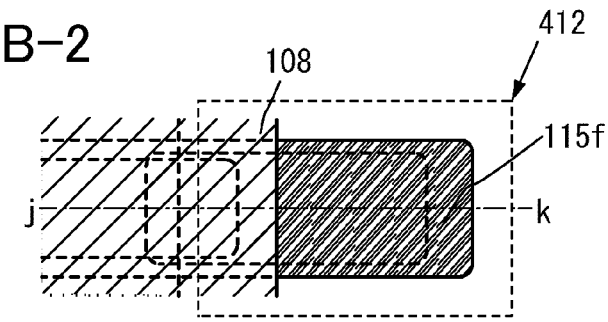

FIGS. 8B-1 and 8B-2 illustrate a top plan view and a cross-sectional view of a terminal portion of a gate wiring, respectively. FIG. 8B-1 corresponds to a cross-sectional view along j-k in FIG. 8B-2.

In FIG. 8B-1, a second terminal 412 is a connection terminal functioning as an input terminal. As for the second terminal 412, a conductive layer 111f formed of the same material as the gate wiring and a conductive layer 115f formed of the same material as a second conductive layer are stacked with a barrier layer 114f therebetween. The conductive layer 111f is electrically connected to a conductive layer 116 formed of the same material as a third conductive layer. Although not illustrated in the drawing, the conductive layer 116 is electrically connected to a signal line.

A plurality of gate wirings, signal lines, common potential lines, and power supply lines are provided depending on the pixel density. In the terminal portion, the first terminal given the same potential as the gate wiring, the second terminal given the same potential as the signal line, a third terminal given the same potential as the power supply line, and a fourth terminal given the same potential as the common potential line, and the like are arranged. The number of each of the terminals may be any number and may be determined by a practitioner as appropriate.

This embodiment can be freely combined with any of other embodiments.

Embodiment 4

In this embodiment, an example in which an inverter circuit is formed using two four-terminal transistors where a pair of electrode layers are provided above and below a channel formation region of an oxide semiconductor layer with insulating layers interposed between the oxide semiconductor layer and the pair of the electrode layers will be described below with reference to FIGS. 9A to 9C. The transistor illustrated in FIG. 9A can be formed by a method similar to the method used for the transistor 152 according to Embodiment 1, which is illustrated in FIGS. 1A-1, 1A-2, 1B-1, and 1B-2. Note that the inverter circuit according to this embodiment can be used for a driver circuit for driving a pixel portion.

A driver circuit for driving a pixel portion is provided, for example, in the vicinity of a pixel portion and includes an inverter circuit, a capacitor, a resistor, and the like. As an embodiment of an inverter circuit, an inverter circuit formed using two n-channel transistors in combination is given. For example, an inverter circuit having a combination of an enhancement transistor and a depletion transistor (hereinafter referred to as an EDMOS circuit) and an inverter circuit having a combination of two enhancement type transistors (hereinafter referred to as an EEMOS circuit) are given.

Figure 9A:
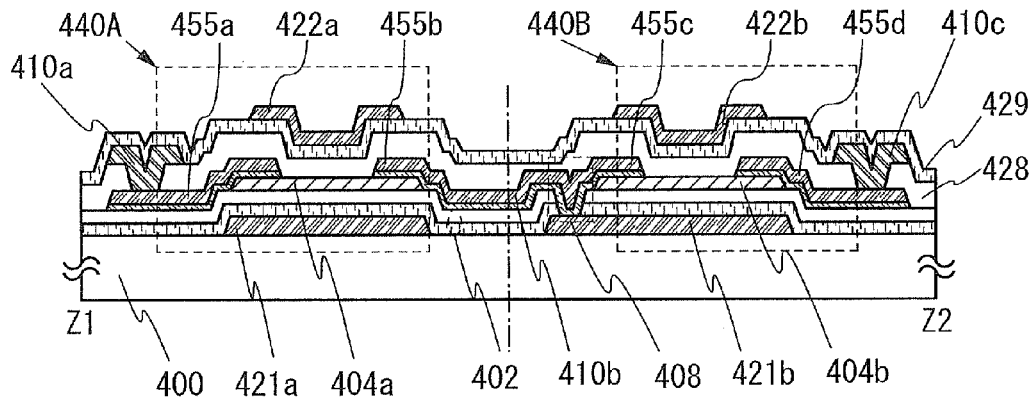
FIGS. 9A to 9C illustrate an inverter circuit according to an embodiment.

FIG. 9A illustrates a cross-sectional structure of the inverter circuit in the driver circuit.

The first transistor 440A includes, over a substrate 400, a gate electrode 421a which is formed using a first conductive layer; an oxide semiconductor layer 404a which includes a channel formation region, is in contact with a first insulating layer 402, and is over the gate electrode 421a; and a first electrode 455a and a second electrode 455b which are formed using a second conductive layer, has end portions overlapping with the gate electrode 421a, and are in contact with the oxide semiconductor layer 404a with barrier layers therebetween. The first electrode 455a and the second electrode 455b function as source and drain electrodes of the first transistor 440A. In addition, a second insulating layer 428 is provided over the first electrode 455a, the second electrode 455b, the first insulating layer 402, and the oxide semiconductor layer 404a, and an electrode 422a formed using a third conductive layer is provided over the second insulating layer 428.

The second transistor 440B includes, over the substrate 400, a gate electrode 421b which is formed using a first conductive layer; an oxide semiconductor layer 404b which includes a channel formation region, is in contact with the first insulating layer 402, and is over the gate electrode 421b; and a third electrode 455c and a fourth electrode 455d which are formed using the second conductive layer, has end portions overlapping with the gate electrode 421b, and are in contact with the oxide semiconductor layer 404b with barrier layers therebetween. The third electrode 455c and the fourth electrode 455d function as source and drain electrodes of the second transistor 440B. In addition, the second insulating layer 428 is provided over the third electrode 455c, the fourth electrode 455d, the first insulating layer 402, and the oxide semiconductor layer 404b, and an electrode 422b formed using the third conductive layer is provided over the second insulating layer 428.

The first transistor 440A and the second transistor 440B are electrically connected to the second electrode 455b and the third electrode 455c which are formed using the same conductive film, respectively. The third electrode 455c is connected to the gate electrode 421b of the second transistor 440B through a contact hole 408.

Since a first transistor 440A and a second transistor 440B can be formed by the method described in Embodiment 2, detailed description is omitted. Note that it is preferable to form a contact hole 408 in the first insulating layer 402 and then, form a second conductive layer, and directly connect the second electrode 455b and a second wiring 410b connected to the third electrode 455c through the contact hole 408. The number of contact holes needed for a connection is small, so that not only the electric resistance but also an area occupied by the contact hole can be reduced.

A first wiring 410a connected to the first electrode 455a of the first transistor 440A is a power supply line to which a negative voltage VDL is applied (negative power supply line). This power supply line may be a power supply line given a ground potential (ground power supply line).

Further, a third wiring 410c connected to a fourth electrode 455d of the second transistor 440B is a power supply line to which a positive voltage VDH is applied (positive power supply line).

Figure 9B:
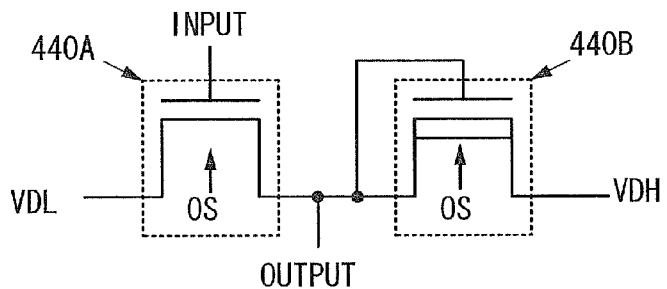
Figure 9C:
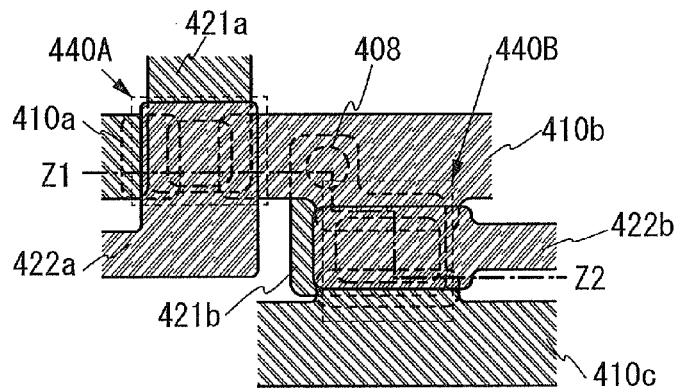

Further, FIG. 9C is a top view of the inverter circuit of the driver circuit. In FIG. 9C, a cross section taken along a dashed-dotted line Z1-Z2 corresponds to FIG. 9A.

FIG. 9B illustrates an equivalent circuit of the EDMOS circuit. The circuit connection illustrated in FIG. 9A corresponds to that illustrated in FIG. 9B. An example in which the first transistor 440A is an enhancement n-channel transistor and the second transistor 440B is a depletion n-channel transistor is illustrated.

In this embodiment, electrodes formed using the third conductive layer provided over a channel formation region of the highly purified oxide semiconductor layer with an insulating layer interposed therebetween are used in order to control the threshold values of the first transistor 440A and the second transistor 440B. Specifically, a voltage is applied to each of the electrode 422a and the electrode 422b so that the first transistor 440A becomes an enhancement transistor and the second transistor 440B becomes a depletion transistor.

Although an example in which the second wiring 410b is directly connected to the gate electrode 421b through the contact hole 408 formed in the first gate insulating layer 402 is illustrated in FIGS. 9A and 9C, an embodiment of the present invention is not particularly limited. A connection electrode may be separately provided, thereby electrically connecting the second wiring 410b and the gate electrode 421b.

As described above, the inverter circuit can be formed in such a manner that the electrode layers are provided on opposite sides from each other with respect to a channel formation region of an oxide semiconductor layer, each with an insulating layer interposed therebetween, in order to control the threshold values of the transistors. The threshold values of the transistors are controlled with the dual-gate structure, whereby the enhancement transistor and the depletion transistor can be formed over one substrate without forming oxide semiconductor films separately, and thus the manufacturing process is simple.

Further, with the use of a transistor which includes a highly purified oxide semiconductor and thus has high field effect mobility, an inverter circuit with excellent dynamic characteristics can be provided.

This embodiment can be freely combined with any of other embodiments.

Embodiment 5

In this embodiment, described will be an example of a driver circuit including a transistor which can be manufactured over the same substrate through the same process as a light-transmitting transistor in a pixel portion and an example of a method for driving a display device formed using the driver circuit.

The transistor placed in the pixel portion is formed according to Embodiment 1 or 2. Since the transistor described in Embodiment 1 or 2 is an n-channel transistor, some of driver circuits that can be constituted by n-channel transistors among the driver circuits are formed over a substrate where the transistor in the pixel portion is formed.

Figure 10A:
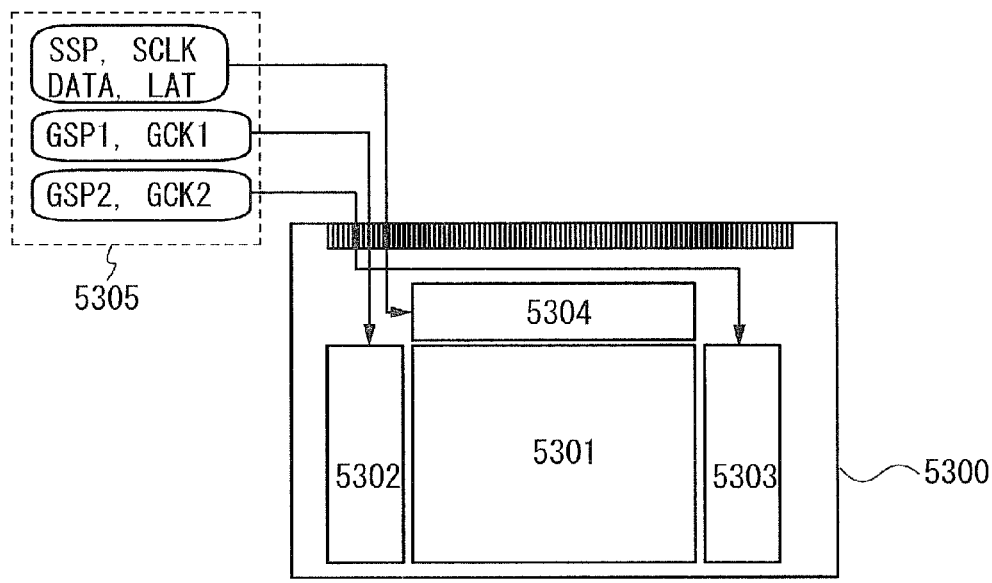
FIGS. 10A and 10B are block diagrams each illustrating a display device.

FIG. 10A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as an FPC (flexible printed circuit).

In FIG. 10A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Further, if the driver circuit is provided outside the substrate 5300, wirings would need to be extended and the number of connections of wirings would be increased. However, by providing the driver circuit over the substrate 5300, the number of connections of the wirings can be reduced. Consequently, the reliability or yield can be increased.

Note that the timing control circuit 5305 supplies, for example, a first scan line driver circuit start signal (GSP1) (a start signal is also referred to as a start pulse) and a scan line driver circuit clock signal (GCK1) to the first scan line driver circuit 5302. Furthermore, the timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 10B:
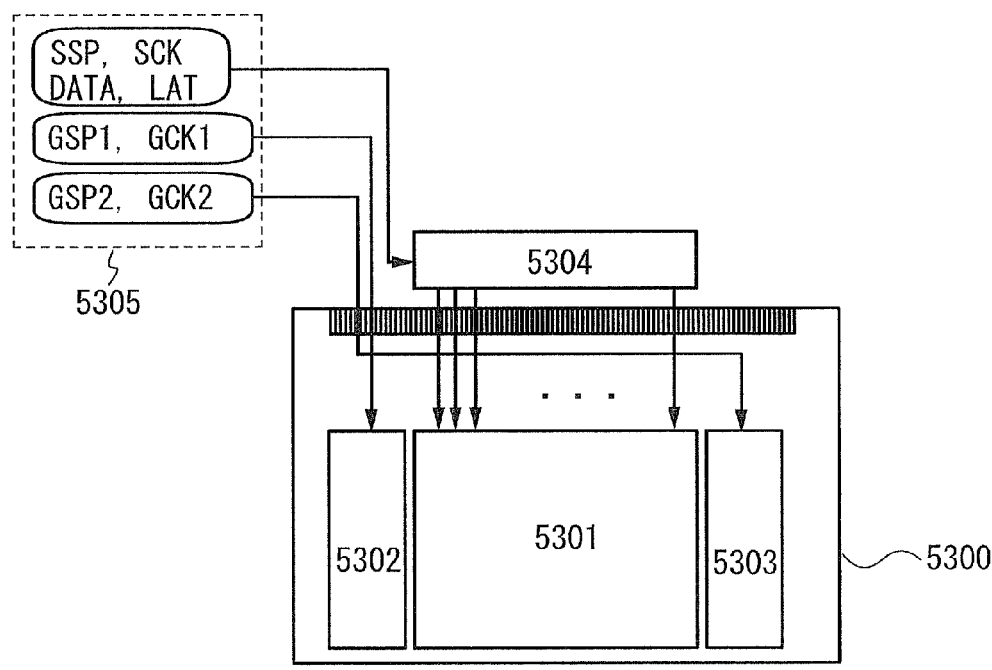

FIG. 10B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by transistors whose field effect mobility is lower than that of transistors each including a single crystal semiconductor. Thus, increase in the size of the display device, reduction in the number of steps, reduction in cost, improvement in yield, or the like can be achieved.

Figure 11A:
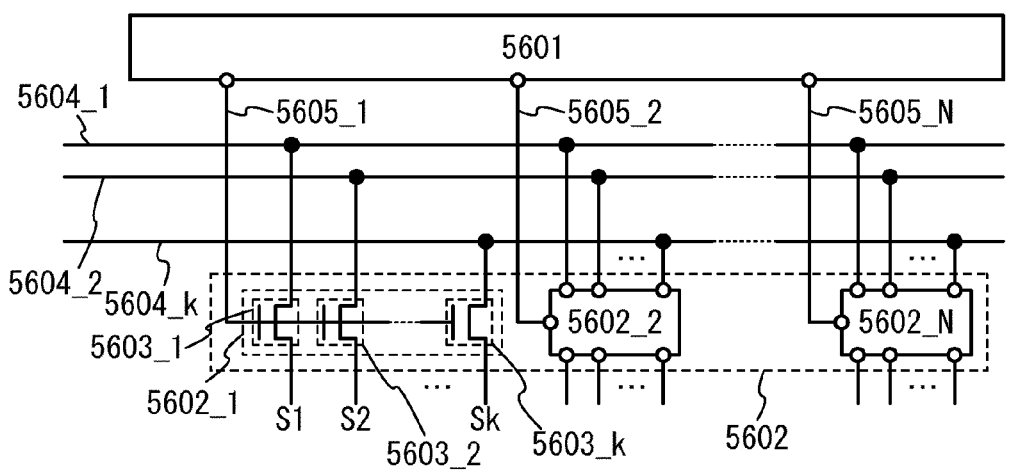
FIGS. 11A and 11B illustrate a structure of a signal line driver circuit.
Figure 11B:
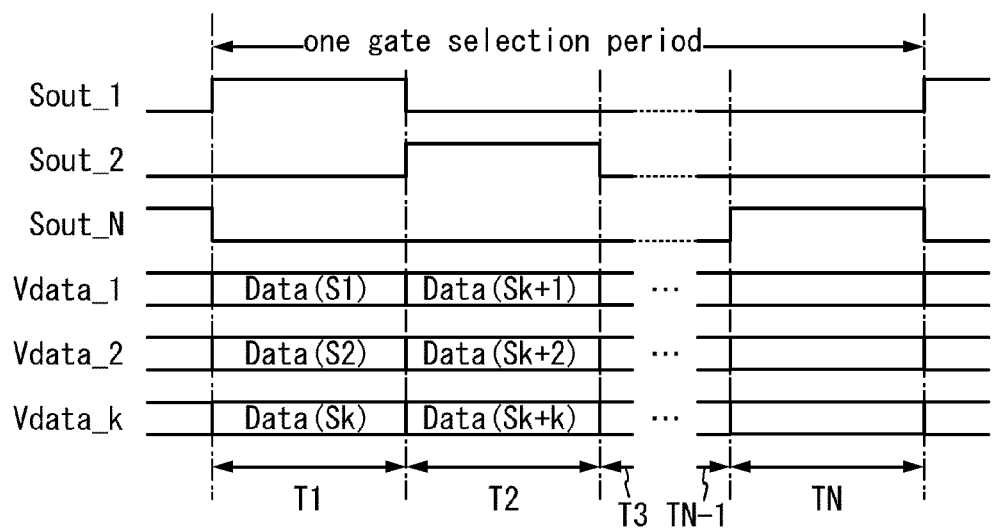

The transistor in Embodiment 1 or 2 is an n-channel transistor. FIGS. 11A and 11B illustrate an example of a structure and operation of a signal line driver circuit constituted by n-channel transistors.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of transistors 5603_1 to 5603_*k* (k is a natural number). The example where the transistors 5603_1 to 5603_*k* are n-channel transistors is described below.

A connection relation in the signal line driver circuit is described by using the switching circuit 5602_1 as an example. First terminals of the transistors 5603_1 to 5603_*k* are connected to wirings 5604_1 to 5604_*k*, respectively.

Second terminals of the transistors 5603_1 to 5603_*k* are connected to signal lines S1 to Sk, respectively. Gates of the transistors 5603_1 to 5603_*k* are connected to a wiring 5605_1.

The shift register 5601 has a function of sequentially selecting the switching circuits 5602_1 to 5602_N by sequentially outputting H-level signals (also referred to as H signals or signals at high power supply potential level) to wirings 5605_1 to 5605_N.

The switching circuit 5602_1 has a function of controlling a conduction state between the wirings 5604_1 to 5604_*k* and the signal lines S1 to Sk (electrical continuity between the first terminals and the second terminals), that is, a function of controlling whether potentials of the wirings 5604_1 to 5604_*k* are supplied to the signal lines S1 to Sk. In this manner, the switching circuit 5602_1 functions as a selector. Moreover, the transistors 5603_1 to 5603_*k* have functions of controlling conduction states between the wirings 5604_1 to 5604_*k* and the signal lines S1 to Sk, respectively, that is, a function of controlling whether potentials of the wirings 5604_1 to 5604_*k* are supplied to the signal lines S1 to Sk, respectively. In this manner, each of the transistors 5603_1 to 5603_*k* functions as a switch.

The video signal data (DATA) is input to each of the wirings 5604_1 to 5604_*k*. The video signal data (DATA) is often an analog signal corresponding to image data or an image signal.

Next, the operation of the signal line driver circuit in FIG. 11A is described with reference to a timing chart in FIG. 11B. FIG. 11B illustrates examples of signals Sout_1 to Sout_N and signals Vdata_1 to Vdata_*k*. The signals Sout_1 to Sout_N are examples of output signals from the shift register 5601. The signals Vdata_1 to Vdata_*k* are examples of signals input to the wirings 5604_1 to 5604_*k*. Note that one operation period of the signal line driver circuit corresponds to one gate selection period in a display device. For example, one gate selection period is divided into periods T1 to TN. Each of the periods T1 to TN is a period for writing the video signal data (DATA) into a pixel that belongs to a selected row.

In the periods T1 to TN, the shift register 5601 outputs H-level signals sequentially to the wirings 5605_1 to 5605_N. For example, in the period T1, the shift register 5601 outputs a high-level signal to the wiring 5605_1. Then, the transistors 5603_1 to 5603_*k* are turned on, so that the wirings 5604_1 to 5604_*k* and the signal lines S1 to Sk are brought into conduction. At this time, Data(S1) to Data(Sk) are input to the wirings 5604_1 to 5604_*k*, respectively. The Data(S1) to Data(Sk) are written into pixels in a first to k-th columns in a selected row through the transistors 5603_1 to 5603_*k*, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that the circuit constituted by the transistor in Embodiments 1 or 2 can be used for the shift register 5601 and the switching circuit 5602. In that case, the shift register 5601 can be constituted by only n-channel transistors or only p-channel transistors.

A structure of a scan line driver circuit will be described. The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply large current is used.

Figure 12A:
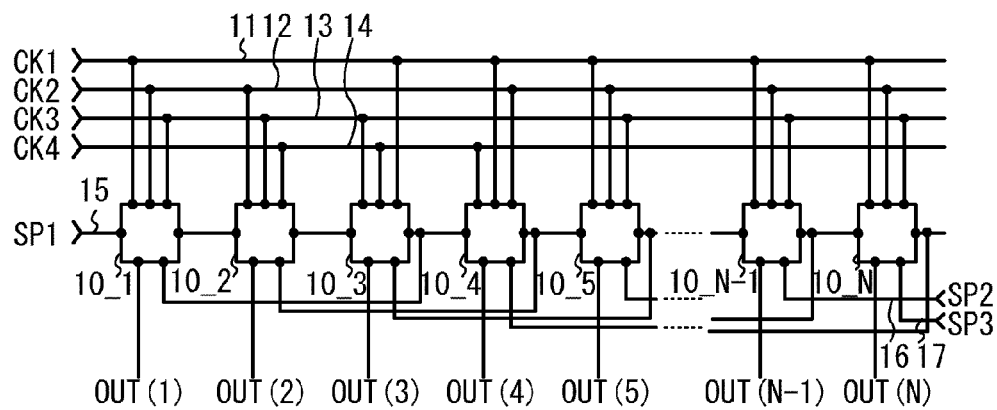
FIGS. 12A to 12C illustrate a configuration of a shift register.

The shift register includes a first to N-th pulse output circuits 10_1 to 10_N (N is a natural number greater than or equal to 3) (see FIG. 12A). In the shift register illustrated in FIG. 12A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to N-th pulse output circuits 10_1 to 10_N. A start pulse SP1 (a first start pulse) is input from a fifth wiring 15 to the first pulse output circuit 10_1. To the n-th pulse output circuit 10_n of the second or subsequent stage (n is a natural number greater than or equal to 2 and less than or equal to N), a signal from the pulse output circuit of the previous stage (such a signal is referred to as a previous-stage signal OUT(n−1)) (n is a natural number greater than or equal to 2) is input. To the first pulse output circuit 10_1, a signal from the third pulse output circuit 10_3 of the stage following the next stage is input. In a similar manner, to the n-th pulse output circuit 10_n of the second or subsequent stage, a signal from the (n+2)-th pulse output circuit 10_(n+2) of the stage following the next stage (such a signal is referred to as a subsequent-stage signal OUT(n+2)) is input. Thus, the pulse output circuits of the respective stages output first output signals (OUT(1)(SR) to OUT(N)(SR)) to be input to the pulse output circuits of the subsequent stages and/or the pulse output circuits of the stages before the preceding stages and second output signals (OUT(1) to OUT(N)) to be input to different circuits or the like. Note that the subsequent-stage signal OUT(n+2) is not input to the last two stages of the shift register as illustrated in FIG. 12A, and a second start pulse SP2 and a third start pulse SP3 may be additionally input to the stage before the last stage and the last stage from a sixth wiring 16 and a seventh wiring 17, respectively, for example. Alternatively, a signal which is additionally generated in the shift register may be input. For example, an (N+1)-th pulse output circuit 10_(N+1) and an (N+2)-th pulse output circuit 10_(N+2) which do not contribute to output of pulses to the pixel portion (such circuits are also referred to as dummy stages) may be provided so that signals corresponding to the second start pulse (SP2) and the third start pulse (SP3) are generated in the dummy stages.

Note that a clock signal (CK) is a signal that alternates between an H-level and an L-level (also referred to as an L signal or a signal at low power supply potential level) at regular intervals. Here, the first clock signal (CK1) to the fourth clock signal (CK4) are delayed by ¼ cycle sequentially. In this embodiment, driving of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 12A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 12B:
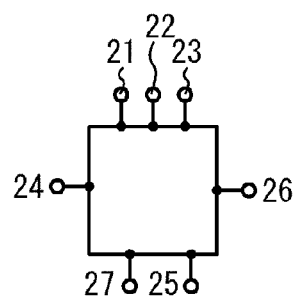

Each of the first to Nth pulse output circuits 10_1 to 10_N is assumed to include the first input terminal 21, the second input terminal 22, the third input terminal 23, a fourth input terminal 24, a fifth input terminal 25, a first output terminal 26, and a second output terminal 27 (see FIG. 12B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27. Although not illustrated, the pulse output circuits are connected to a power supply line 51, a power supply line 52, and a power supply line 53.

Next, an example of a specific circuit configuration of the pulse output circuit will be described with reference to FIG. 12C.

Figure 12C:
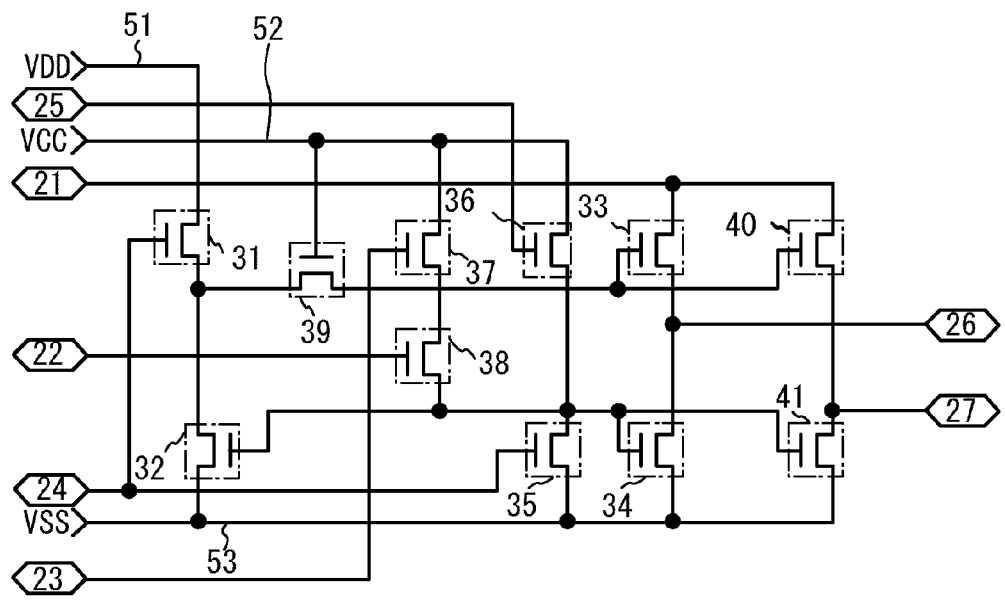

The first pulse output circuit 10_1 includes a first to eleventh transistors 31 to 41 (see FIG. 12C). A signal or power supply potential is supplied to the first to eleventh transistors 31 to 41 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27. The relation of the power supply potentials of the power supply lines in FIG. 12C is as follows: the first high power supply potential VDD is higher than or equal to the second high power supply potential VCC, and the second high power supply potential VCC is higher than the low power supply potential VSS (VCC is lower than VDD, and VSS is lower than VCC). Note that the first to fourth clock signals (CK1) to (CK4) each alternate between an H-level and an L-level at regular intervals; the clock signal at H level is VDD and the clock signal at L level is VSS. By making the potential VCC of the power supply line 52 lower than the potential VDD of the power supply line 51, a potential applied to the gate electrode of the transistor can be lowered, shift in threshold voltage of the transistor can be reduced, and degradation of the transistor can be suppressed without an adverse effect on the operation of the transistor.

In FIG. 12C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 12C, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 13A).

Note that a transistor is an element having at least three terminals of a gate, a drain, and a source. The transistor has a channel region between a drain region and a source region and thus, a current can flow through the drain region, the channel region, and the source region. Here, since the source and the drain of the transistor may change depending on the structure, the operating condition, and the like of the transistor, it is difficult to define which is a source or a drain. Therefore, a region functioning as the source or the drain is not called the source or the drain in some cases. In that case, for example, such regions may be referred to as a first terminal and a second terminal.

Figure 13A:
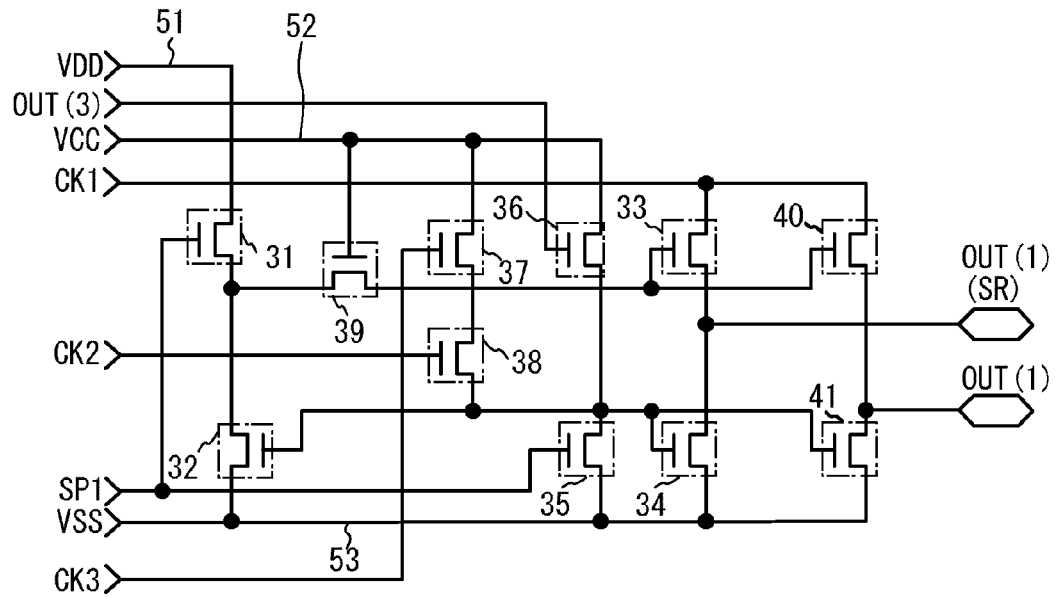
FIGS. 13A and 13B are a circuit diagram of a shift register and a timing chart of operation of the shift register, respectively.
Figure 13B:
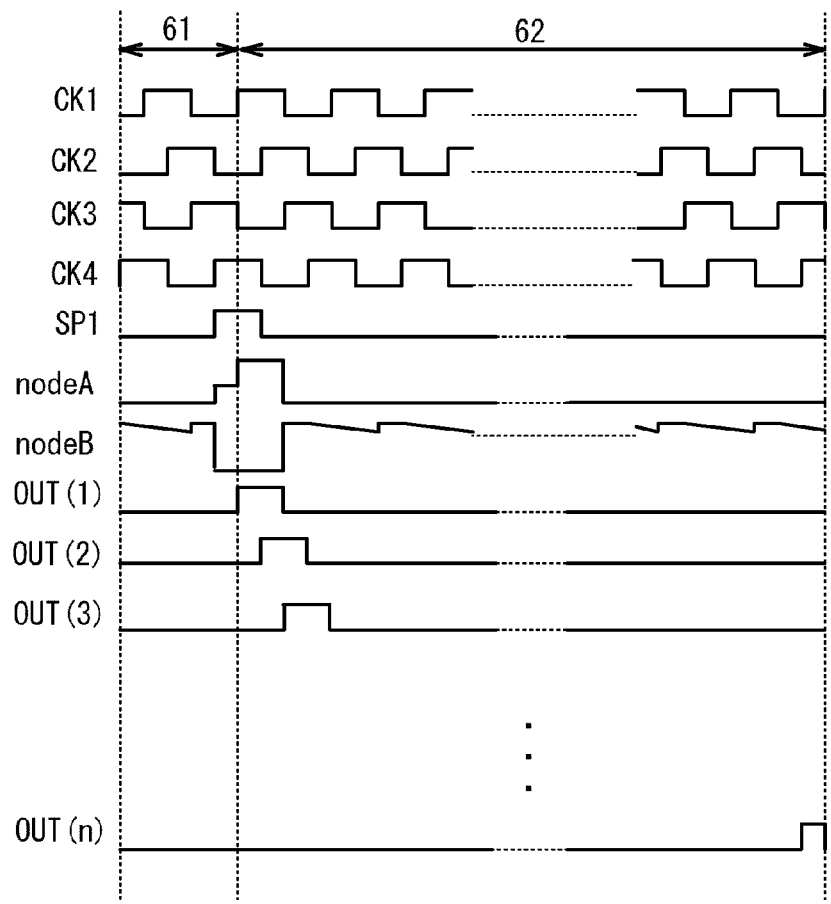

FIG. 13B illustrates a timing chart of a shift register including a plurality of pulse output circuits illustrated in FIG. 13A. Note that when the shift register is the one of a scan line driver circuit, a period 61 in FIG. 13B corresponds to a vertical retrace period and a period 62 corresponds to a gate selection period.

Note that the placement of the ninth transistor 39 in which the second high power supply potential VCC is applied to the gate electrode as illustrated in FIG. 13A has the following advantages before and after bootstrap operation.

Without the ninth transistor 39 in which the second high power supply potential VCC is applied to the gate electrode, if a potential of the node A is raised by bootstrap operation, a potential of the source which is the second terminal of the first transistor 31 rises to a value higher than the first high power supply potential VDD. Then, the source of the first transistor 31 is switched to the first terminal, that is, the terminal on the power supply line 51 side. Consequently, in the first transistor 31, high bias voltage is applied and thus significant stress is applied between the gate and the source and between the gate and the drain, which might cause deterioration of the transistor. On the other hand, with the ninth transistor 39 in which the second high power supply potential VCC is applied to the gate electrode, increase in the potential of the second terminal of the first transistor 31 can be prevented while the potential of the node A is raised by bootstrap operation. In other words, the placement of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that in the case of the shift register including a plurality of pulse output circuits in this embodiment in a signal line driver circuit having a larger number of stages than a scan line driver circuit, the ninth transistor 39 can be omitted, which is advantageous in that the number of transistors is reduced.

Note that an oxide semiconductor is used for a semiconductor layer of each of the first to eleventh transistors 31 to 41, whereby the off current of the transistors can be reduced, the on-state current and field effect mobility can be increased, and the degree of degradation of the transistors can be reduced. Thus, a malfunction in the circuit can be reduced. Moreover, the degree of deterioration of the transistor using an oxide semiconductor by application of a high potential to a gate electrode is smaller than that of a transistor using amorphous silicon. Consequently, similar operation can be obtained even when the first high power supply potential VDD is supplied to the power supply line to which the second high power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 are supplied from the second input terminal 22 and the third input terminal 23, respectively. In the shift register illustrated in FIG. 13A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. On the other hand, in the shift register illustrated in FIG. 13A, when a state of the seventh transistor 37 and the eighth transistor 38 is changed so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 occurs only once, which is caused by fall in potential of the gate electrode of the eighth transistor 38. Consequently, the connection relation, in which the clock signal CK3 is supplied to the gate electrode of the seventh transistor 37 from the third input terminal 23 and the clock signal CK2 is supplied to the gate electrode of the eighth transistor 38 from the second input terminal 22, is preferable. That is because the number of times of the change in the potential of the node B can be reduced, whereby the noise can be reduced.

In such a manner, an H-level signal is regularly supplied to the node B in a period during which the potentials of the first output terminal 26 and the second output terminal 27 are held at L level; thus, a malfunction of the pulse output circuit can be suppressed.

Embodiment 6

According to this embodiment, a semiconductor device having a display function (also referred to as a display device) can be manufactured using transistors formed as in Embodiment 1 or 2 in a pixel portion and also in a driver circuit, as an example of a semiconductor device of the present invention. Moreover, part of the driver circuit or the entire driver circuit, which includes a transistor formed as in Embodiment 1 or 2, can be formed over a substrate where a pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like in its category. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an embodiment of the present invention relates to an element substrate corresponding to one embodiment at the time before the display element is completed in a manufacturing process of the display device. The element substrate is provided with a means for supplying current to the display element in each of a plurality of pixels. Specifically, the element substrate may be in a state in which only a pixel electrode layer of the display element is formed, a state after formation of a conductive film to be a pixel electrode layer and before etching of the conductive film to form the pixel electrode layer, or any other state.

Note that a display device in this specification refers to an image display device, a display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

Figures 1, 2, 14A:
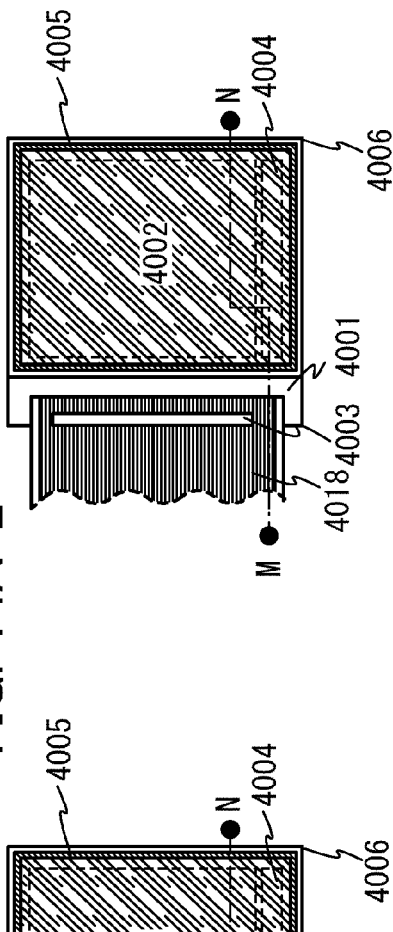
Figure 14B:
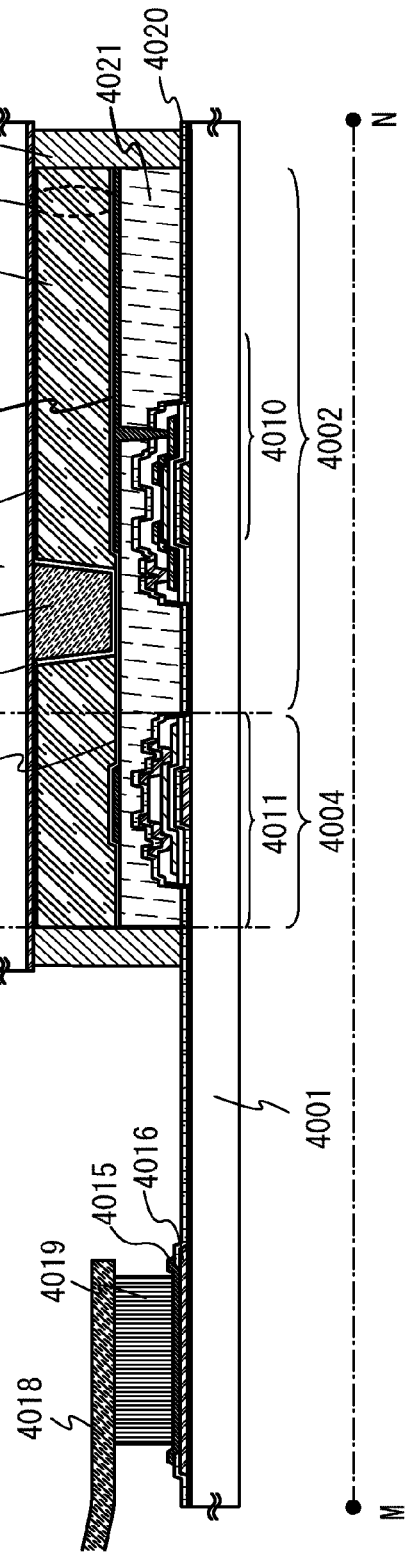

In this embodiment, the appearance and a cross section of a liquid crystal display panel, which is a semiconductor device according to one embodiment of the present invention, will be described with reference to FIGS. 14A-1, 14A-2, and 14B. FIGS. 14A-1 and 14A-2 are top plan views of panels in which transistors 4010 and 4011 formed as in Embodiment 2 and a liquid crystal element 4013 are sealed between a first substrate 4001 and a second substrate 4006 with a sealant 4005. FIG. 14B is a cross-sectional view along M-N in FIGS. 14A-1 and 14A-2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 14A-1 illustrates an example in which the signal line driver circuit 4003 is mounted by a COG method. FIG. 14A-2 illustrates an example in which signal line driver circuit 4003 is mounted by a TAB method.

The pixel portion 4002 and the scan line driver circuit 4004 provided over the first substrate 4001 include a plurality of transistors. FIG. 14B illustrates the transistor 4010 included in the pixel portion 4002 and the transistor 4011 included in the scan line driver circuit 4004, as an example. Insulating layers 4020 and 4021 are provided over the transistors 4010 and 4011.

The transistors described in Embodiment 1 or 2 can be used for example as the transistors 4010 and 4011. In this embodiment, the transistors 4010 and 4011 are n-channel transistors.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that for the first substrate 4001 and the second substrate 4006, glass, metal (typically, stainless steel), ceramics, or plastics can be used. As plastics, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

A columnar spacer 4035 is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the transistor 4010 is formed. The counter electrode layer 4031 and the common potential line formed over the substrate where the transistor 4010 is formed are electrically connected to each other through conductive particles. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperature, the liquid crystal layer 4008 is formed using a liquid crystal composition containing a chiral agent at 5 wt % or more in order to improve the temperature range. The liquid crystal composition including liquid crystal exhibiting a blue phase and a chiral agent has a short response time of 10 μs to 100 μs and is optically isotropic; therefore, alignment treatment is not necessary and viewing angle dependence is small.

Note that this embodiment is an example of a transmissive liquid crystal display device; however, an embodiment of the present invention can also be applied to a reflective liquid crystal display device and a transflective liquid crystal display device.

In the example of the liquid crystal display device according to this embodiment, a polarizing plate is provided on the outer surface of the substrate (on the viewer side) and a coloring layer and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided.

In this embodiment, in order to reduce the surface roughness due to the transistor and to improve the reliability of the transistor, the transistor obtained in Embodiment 1 or 2 is covered with insulating layers (the insulating layers 4020 and 4021) serving as a protective film and a planarization insulating film. Note that the protective film is provided to prevent entry of contaminant impurities such as organic substance, metal, or water vapor existing in the air and is preferably a dense film. The protective film may be formed with a single-layer structure or a layered structure using any of a silicon oxide film, a silicon nitride film, a silicon oxynitride film, a silicon nitride oxide film, an aluminum oxide film, an aluminum nitride film, an aluminum oxynitride film, and an aluminum nitride oxide film by a sputtering method. Although an example in which the protective film is formed by a sputtering method is described in this embodiment, an embodiment of the present invention is not limited to this method and a variety of methods may be employed.

Further, after the protective film is formed, the oxide semiconductor layer containing indium, gallium, and zinc may be subjected to annealing (300° C. to 400° C.).

The insulating layer 4021 is formed as a planarization insulating film. The insulating layer 4021 can be formed using a heat-resistant organic material such as polyimide, an acrylic resin, a benzocyclobutene resin, polyamide, or an epoxy resin can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using any of these materials. The siloxane-based resin may include an organic group (e.g., an alkyl group or an aryl group) or a fluoro group as a substituent. Moreover, the organic group may include a fluoro group. Note that the insulating layer 4021 may be formed by stacking insulating films formed using any of these materials.

Note that the siloxane-based resin corresponds to a resin including a Si—O—Si bond formed using a siloxane-based material as a starting material.

There is no particular limitation on the method of forming the insulating layer 4021, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. In the case of forming the insulating layer 4021 using a material solution, annealing (300° C. to 400° C.) of the oxide semiconductor layer containing indium, gallium, and zinc may be performed at the same time as a baking step. The baking step of the insulating layer 4021 also serves as annealing of the semiconductor layer, whereby a semiconductor device can be efficiently manufactured.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode layer formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more kinds of these materials.

Further, a variety of signals and potentials are supplied to the signal line driver circuit 4003 which is separately formed, the scan line driver circuit 4004, and the pixel portion 4002 from an FPC 4018.

In this embodiment, a connection terminal electrode 4015 is formed using the same conductive film as the pixel electrode layer 4030 included in the liquid crystal element 4013.

A terminal electrode 4016 is formed using the same conductive film as source and drain electrode layers of the transistor 4011.

The connection terminal electrode 4015 is electrically connected to a terminal included in the FPC 4018 through an anisotropic conductive film 4019.

Note that FIGS. 14A-1, 14A-2, and 14B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 15:
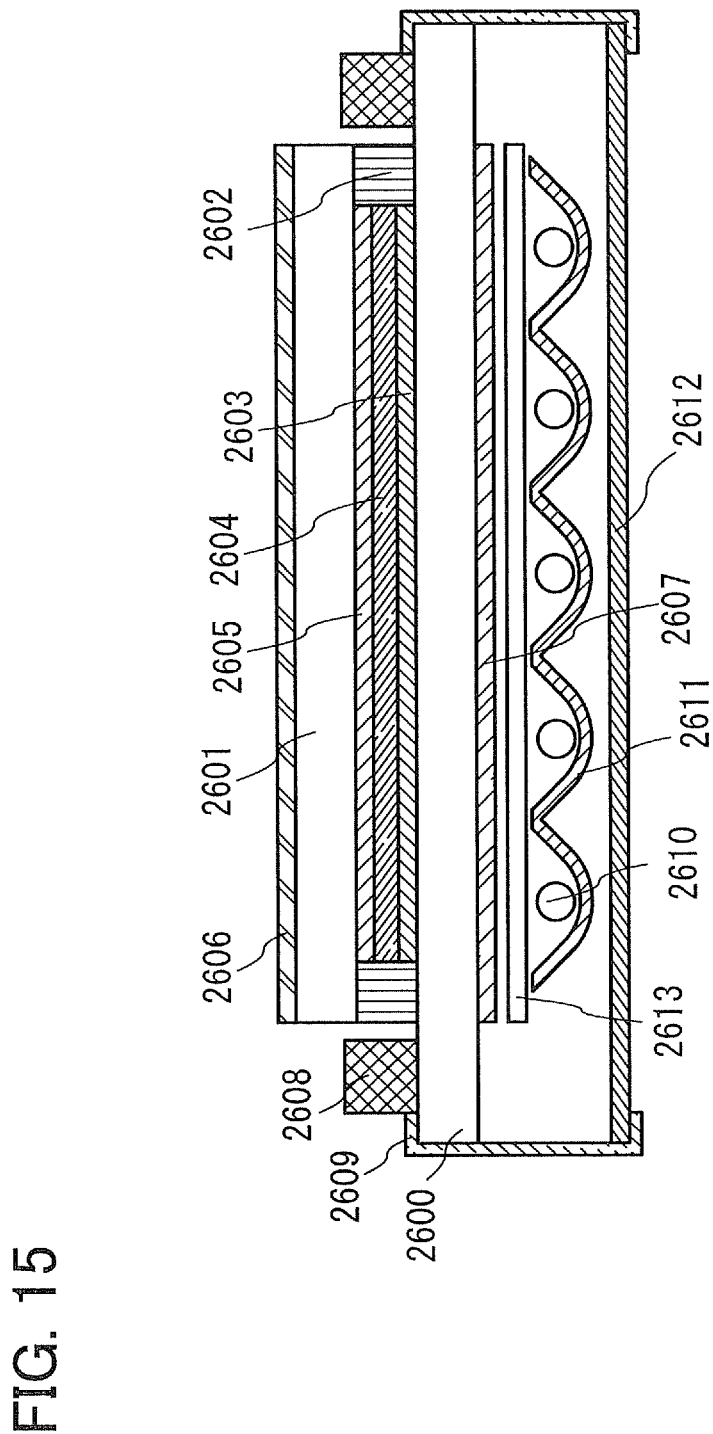
FIG. 15 illustrates a semiconductor device according to an embodiment.

FIG. 15 illustrates an example of a liquid crystal display module which is formed as a semiconductor device with the use of a transistor substrate 2600 manufactured by applying an embodiment of the present invention.

FIG. 15 illustrates an example of the liquid crystal display module, in which the transistor substrate 2600 and a counter substrate 2601 are fixed to each other with a sealant 2602, and a pixel portion 2603 including a transistor and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the transistor substrate 2600 and the counter substrate 2601. A light source includes a cold cathode tube 2610 and a reflective plate 2611. A circuit board 2612 is connected to a wiring circuit portion 2608 of the transistor substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above process, a display device including a transistor which is excellent in operation stability can be manufactured. Since the liquid crystal display device according to this embodiment includes the transistor whose operation stability is excellent, the reliability of the liquid crystal display device is high.

The display device according to this embodiment includes a light-transmitting transistor in the pixel portion and thus has a high aperture ratio. In addition, the source electrode and the drain electrode of the transistor are formed using an oxide conductive layer containing oxygen vacancy and an impurity (such as hydrogen) to have higher conductivity, so that the loss of on current is small.

Formed using the oxide semiconductors each having a wide band gap and having a carrier concentration suppressed to less than $1\times10^{14}/cm^3$, preferably $1\times10^{12}/cm^3$ or less, the transistors provided in a pixel portion and a driver circuit of the display device according to this embodiment are normally off and the off current of the transistors is small. Specifically, the transistor can have an off current per a channel width of 1 µm of $1\times10^{-16}$ A/µm or lower, furthermore 1 aA/µm ($1\times10^{-18}$ A/µm) or lower, at room temperature.

Thus, the display device can have a smaller leak current and lower power consumption. Further, the ratio of an on current to an off current of the display device can be high. Furthermore, contrast and display quality of the display device can be high.

Moreover, the display device according to this embodiment includes a transistor which includes a highly-purified oxide semiconductor layer and thus has high field effect mobility, so that the display device can operate at high speed, have a characteristic of displaying moving images, and display high-definition images.

This embodiment can be implemented in appropriate combination with any of the structures described in the other embodiments.

Embodiment 7

In this embodiment, a light-emitting display device will be described as an example of a semiconductor device of the present invention. As a display element included in a display device, a light-emitting element utilizing electroluminescence is described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that in this embodiment, an organic EL element is described as a light-emitting element.

Figure 16:
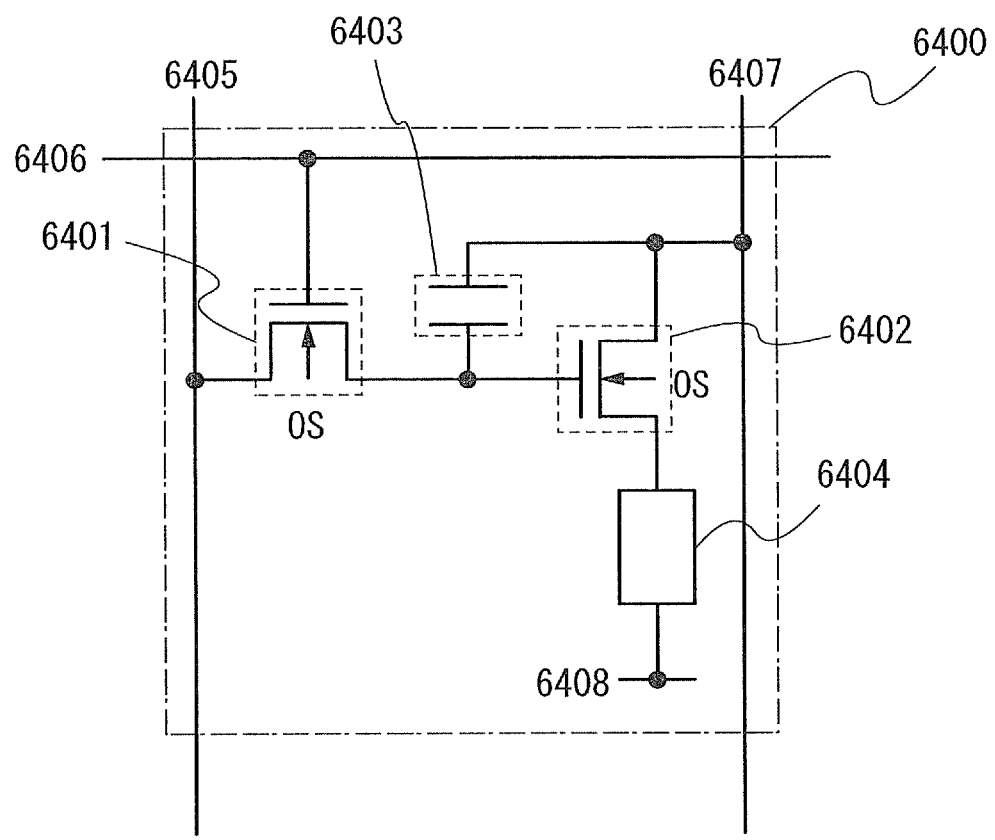
FIG. 16 is a pixel equivalent circuit of a semiconductor device according to an embodiment.

FIG. 16 illustrates an example of a pixel structure to which digital time grayscale driving can be applied, as an example of a semiconductor device to which an embodiment of the present invention is applied. Note that the term "OS" in the drawing indicates a transistor in which an oxide semiconductor is used.

A structure and operation of a pixel to which digital time grayscale driving can be applied are described. In this embodiment, one pixel includes two n-channel transistors described in Embodiment 1 or 2, in each of which is formed using an oxide semiconductor layer (In—Ga—Zn—O-based film) for a channel formation region.

A pixel 6400 includes a switching transistor 6401, a driving transistor 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode layer) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is lower than a high power supply potential that is set to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. In order to make the light-emitting element 6404 emit light, each potential is set so that the potential difference between the high power supply potential and the low power supply potential is higher than or equal to the forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel region and a gate electrode layer. Note that the off current of each of the transistors described in Embodiments 1 and 2 is significantly small, which can reduce capacitance of the capacitor 6403 or can omit the capacitor.

In the case of employing a voltage-input voltage-driving method, a video signal is input to the gate of the driving transistor 6402 so that the driving transistor 6402 is in either of two states of being sufficiently turned on or turned off. That is, the driving transistor 6402 operates in a linear region. Since the driving transistor 6402 operates in the linear region, voltage higher than the voltage of the power supply line 6407 is applied to the gate of the driving transistor 6402. Note that voltage higher than or equal to the sum of the power supply line voltage and Vth of the driving transistor 6402 is applied to the signal line 6405.

In the case of employing an analog grayscale method instead of the digital time grayscale method, the same pixel structure as that in FIG. 16 can be employed by changing signal input.

In the case of performing analog grayscale driving, voltage higher than or equal to the sum of the forward voltage of the light-emitting element 6404 and Vth of the driving transistor 6402 is applied to the gate of the driving transistor 6402. The forward voltage of the light-emitting element 6404 indicates voltage at which a desired luminance is obtained, and includes at least the forward threshold voltage. The video signal by which the driving transistor 6402 operates in a saturation region is input, so that current can be supplied to the light-emitting element 6404. In order to operate the driving transistor 6402 in the saturation region, the potential of the power supply line 6407 is set higher than the gate potential of the driving transistor 6402. When an analog video signal is used, current corresponding to the video signal can be supplied to the light-emitting element 6404, so that analog grayscale driving can be performed.

Note that the pixel structure is not limited to that illustrated in FIG. 16. For example, a switch, a resistor, a capacitor, a transistor, a logic circuit, or the like may be added to the pixel illustrated in FIG. 16.

Next, a structure of a light-emitting element will be described with reference to FIGS. 17A to 17C. In this embodiment, a cross-sectional structure of a pixel will be described using an n-channel transistor for a driving transistor as an example. Driving transistors 7001, 7011, and 7021 which are used in semiconductor devices illustrated in FIGS. 17A, 17B, and 17C can be formed in a manner similar to that of the transistor described in Embodiment 1 or 2.

In order to extract light emitted from the light-emitting element, at least one of an anode and a cathode needs to transmit light. A transistor and a light-emitting element are formed over a substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure according to this embodiment can be applied to a light-emitting element having any of these emission structures.

A light-emitting element having the bottom emission structure will be described with reference to FIG. 17A.

FIG. 17A is a cross-sectional view of a pixel in the case where the driving transistor 7011 is an n-channel transistor and light generated in a light-emitting element 7012 is emitted to pass through a first electrode 7013. In FIG. 17A, the first electrode 7013 of the light-emitting element 7012 is formed over a light-transmitting conductive film 7017 which is electrically connected to a source electrode or a drain electrode of the driving transistor 7011, and an EL layer 7014 and a second electrode 7015 are stacked in this order over the first electrode 7013.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7013 of the light-emitting element. For example, in the case where the first electrode 7013 is used as a cathode, the first electrode 7013 is preferably formed using, for example, a material having a low work function, such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 17A, the first electrode 7013 is formed to a thickness enough to transmit light (preferably, approximately 5 nm to 30 nm). For example, an aluminum film having a thickness of 20 nm is used for the first electrode 7013.

Note that the light-transmitting conductive film 7017 and the first electrode 7013 may be formed by stacking a light-transmitting conductive film and an aluminum film and then performing selective etching. In that case, the etching can be performed using the same mask, which is preferable.

Further, a partition wall 7019 is provided over a contact hole which is formed in a protective insulating layer 7035, an overcoat layer 7034, and an insulating layer 7032 and which reaches a drain electrode layer, with the light-transmitting conductive film 7017 therebetween. Note that the periphery of the first electrode 7013 may be covered with a partition wall. The partition wall 7019 is formed using an organic resin film of polyimide, an acrylic resin, polyamide, an epoxy resin, or the like, an inorganic insulating film, or organic polysiloxane. It is particularly preferable that the partition wall 7019 be formed using a photosensitive resin material to have an opening over the first electrode 7013 so that a sidewall of the opening is formed to have an inclined surface with continuous curvature. In the case where a photosensitive resin material is used for the partition wall 7019, a step of forming a resist mask can be omitted.

The EL layer 7014 over the first electrode 7013 and the partition wall 7019 may be formed to have either a single-layer structure or a layered structure as long as it includes at least a light-emitting layer. When the EL layer 7014 is formed using a plurality of layers and the first electrode 7013 is used as a cathode, the EL layer 7014 is formed by stacking an electron-injection layer, an electron-transport layer, a light-emitting layer, a hole-transport layer, and a hole-injection layer in that order over the first electrode 7013. Note that not all of these layers other than the light-emitting layer need to be provided.

The stacking order is not limited to the above order. When the first electrode 7013 serves as an anode, a hole-injection layer, a hole-transport layer, a light-emitting layer, an electron-transport layer, and an electron-injection layer may be stacked in this order over the first electrode 7013. However, considering power consumption, it is preferable that the first electrode 7013 serve as a cathode and an electron-injection layer, an electron-transport layer, a light-emitting layer, a hole-transport layer, and a hole-injection layer be stacked in this order over the first electrode 7013 because an increase in voltage of a driver circuit portion can be suppressed and power consumption can be reduced more effectively than in the case where the first electrode 7013 is used as the anode and the hole-injection layer, the hole-transport layer, the light-emitting layer, the electron-transport layer, and the electron-injection layer are stacked in this order over the first electrode 7013.

Further, any of a variety of materials can be used for the second electrode 7015 formed over the EL layer 7014. For example, in the case where the second electrode 7015 is used as an anode, a material having a high work function, for example, ZrN, Ti, W, Ni, Pt, Cr, or the like; or a transparent conductive material such as ITO, IZO, or ZnO is preferable. Further, a shielding film 7016, for example, a metal which blocks light, a metal which reflects light, or the like is provided over the second electrode 7015. In this embodiment, an ITO film is used as the second electrode 7015, and a Ti film is used as the shielding film 7016.

The light-emitting element 7012 corresponds to a region where the EL layer 7014 including the light-emitting layer is sandwiched between the first electrode 7013 and the second electrode 7015. In the case of the element structure illustrated in FIG. 17A, light emitted from the light-emitting element 7012 is ejected to the first electrode 7013 side as indicated by an arrow.

Note that in FIG. 17A, light emitted from the light-emitting element 7012 passes through a color filter layer 7033, an insulating layer 7032, a gate insulating layer 7030, and a substrate 7010 to be emitted.

The color filter layer 7033 is formed by a droplet discharge method such as an ink-jet method, a printing method, an etching method with the use of a photolithography technique, or the like.

The color filter layer 7033 is covered with the overcoat layer 7034, and also covered with the protective insulating layer 7035. Note that although the overcoat layer 7034 with a small thickness is illustrated in FIG. 17A, the overcoat layer 7034 is formed using a resin material such as an acrylic resin and has a function of planarizing roughness due to the color filter layer 7033.

A light-emitting element having a dual emission structure is described with reference to FIG. 17B.

In FIG. 17B, a first electrode 7023 of a light-emitting element 7022 is formed over a light-transmitting conductive film 7027 which is electrically connected to a source electrode or a drain electrode of the driving transistor 7021, and an EL layer 7024 and a second electrode 7025 are stacked in this order over the first electrode 7023.

As the light-transmitting conductive film 7027, a light-transmitting conductive film of indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like can be used.

A variety of materials can be used for the first electrode 7023. For example, in the case where the first electrode 7023 is used as a cathode, the first electrode 7023 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In the case where a metal film is used for the first electrode 7023, the first electrode 7023 is formed to have a thickness enough to transmit light (preferably, approximately 5 nm to 30 nm). For example, when the first electrode 7023 is used as a cathode, an aluminum film having a thickness of 20 nm can be used.

Note that the light-transmitting conductive film 7027 and the first electrode 7023 may be formed by stacking a light-transmitting conductive film and a light-transmitting aluminum film and then performing selective etching. In that case, the etching can be performed using the same mask, which is preferable.

Further, a partition wall 7029 is provided over a contact hole which is formed in a protective insulating layer 7045, an overcoat layer 7044 and an insulating layer 7042 and which reaches a drain electrode layer, with the light-transmitting conductive film 7027 therebetween. Note that the periphery of the first electrode 7023 may be covered with a partition wall. The partition wall 7029 is formed using an organic resin film of polyimide, an acrylic resin, polyamide, an epoxy resin, or the like; an inorganic insulating film; or organic polysiloxane. It is particularly preferable that the partition wall 7029 be formed using a photosensitive resin material to have an opening over the first electrode 7023 so that a sidewall of the opening is formed to have an inclined surface with continuous curvature. In the case where a photosensitive resin material is used for the partition wall 7029, a step of forming a resist mask can be omitted.

As the EL layer 7024 formed over the first electrode 7023 and the partition wall 7029, an EL layer including a light-emitting layer is acceptable. Further, the EL layer 7024 may be formed to have either a single-layer structure or a stacked-layer structure. When the EL layer 7024 is formed using a plurality of layers and the first electrode 7023 is used as a cathode, an electron-injection layer, an electron-transport layer, a light-emitting layer, a hole-transport layer, and a hole-injection layer are stacked in this order. Note that not all of these layers need to be provided.

The stacking order is not limited to the above order. When the first electrode 7023 is used as an anode, a hole-injection layer, a hole-transport layer, a light-emitting layer, an electron-transport layer, and an electron-injection layer may be stacked in this order over the first electrode 7023. However, considering power consumption, it is preferable that the first electrode 7023 is used as a cathode and an electron-injection layer, an electron-transport layer, a light-emitting layer, a hole-transport layer, and a hole-injection layer be stacked in the order presented over the first electrode 7023 because an increase in voltage of the driver circuit portion can be suppressed and power consumption can be reduced more effectively than in the case where the first electrode 7023 is used as the anode and the hole-injection layer, the hole-transport layer, the light-emitting layer, the electron-transport layer, and the electron-injection layer are stacked in this order over the first electrode 7023.

Further, a variety of materials can be used for the second electrode 7025 formed over the EL layer 7024. For example, in the case where the second electrode 7025 is used as an anode, a material having a high work function, for example, a transparent conductive material such as ITO, IZO, or ZnO is preferable. In this embodiment, the second electrode 7025 is formed using an ITO layer including silicon oxide and is used as an anode.

The light-emitting element 7022 corresponds to a region where the EL layer 7024 including the light-emitting layer is sandwiched between the first electrode 7023 and the second electrode 7025. In the case of the element structure illustrated in FIG. 17B, light emitted from the light-emitting element 7022 is ejected to both the second electrode 7025 side and the first electrode 7023 side as indicated by arrows.

Note that in FIG. 17B, light emitted from the light-emitting element 7022 to the first electrode 7023 side passes through a color filter layer 7043, an insulating layer 7042, a gate insulating layer 7040, and a substrate 7020 to be emitted.

The color filter layer 7043 is formed by a droplet discharge method such as an ink-jet method, a printing method, an etching method with the use of a photolithography technique, or the like.

The color filter layer 7043 is covered with the overcoat layer 7044, and also covered with the protective insulating layer 7045.

Note that in the case where full-color display is realized on both display surfaces by using a light-emitting element having a dual emission structure, light emitted from the second electrode 7025 side does not pass through the color filter layer 7043; therefore, it is preferable that a sealing substrate having a color filter layer be further provided over the second electrode 7025.

Next, a light-emitting element having a top emission structure is described with reference to FIG. 17C.

FIG. 17C is a cross-sectional view of a pixel of the case where a driving transistor 7001 is of an n-type and light emitted from a light-emitting element 7002 passes through a second electrode 7005. In FIG. 17C, a first electrode 7003 of the light-emitting element 7002 is formed to be electrically connected to a source electrode or a drain electrode of the driving transistor 7001, and an EL layer 7004 and the second electrode 7005 are stacked in this order over the first electrode 7003.

Further, a variety of materials can be used for the first electrode 7003. For example, in the case where the first electrode 7003 is used as a cathode, the first electrode 7003 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er.

Further, a partition wall 7009 is provided over a contact hole which is formed in a protective insulating layer 7052 and an insulating layer 7055 and which reaches a drain electrode layer, with the first electrode 7003 therebetween. Note that the periphery of the first electrode 7003 may be covered with a partition wall. The partition wall 7009 is formed using an organic resin film of polyimide, an acrylic resin, polyamide, an epoxy resin, or the like; an inorganic insulating film; or organic polysiloxane. It is particularly preferable that the partition wall 7009 be formed using a photosensitive resin material to have an opening over the first electrode 7003 so that a sidewall of the opening is formed to have an inclined surface with continuous curvature. In the case where a photosensitive resin material is used for the partition wall 7009, a step of forming a resist mask can be omitted.

As the EL layer 7004 formed over the first electrode 7003 and the partition wall 7009, an EL layer including at least a light-emitting layer is acceptable. Further, the EL layer 7004 may be formed to have either a single-layer structure or a stacked-layer structure. When the EL layer 7004 is formed using a plurality of layers and the first electrode 7003 is used as a cathode, an electron-injection layer, an electron-transport layer, a light-emitting layer, a hole-transport layer, and a hole-injection layer are stacked in this order. Note that not all of these layers need to be provided.

The stacking order is not limited to the order presented above, and when the first electrode 7003 is used as an anode, a hole-injection layer, a hole-transport layer, a light-emitting layer, an electron-transport layer, and an electron-injection layer may be stacked in the order presented over the first electrode 7003.

For example, the first electrode 7003 formed by stacking a Ti film, an aluminum film, and a Ti film is used as an anode, a hole-injection layer, a hole-transport layer, a light-emitting layer, an electron-transport layer, and an electron-injection layer are stacked in this order over the first electrode 7003, and a stack of a thin Mg:Ag alloy film and ITO is formed.

Note that in the case where the driving transistor 7001 is of an n-type, it is preferable that an electron-injection layer, an electron-transport layer, a light-emitting layer, a hole-transport layer, and a hole-injection layer be stacked in the order presented over the first electrode 7003 because an increase in voltage of a driver circuit can be prevented and power consumption can be reduced more effectively than in the case of using the layers stacked in the above order.

The second electrode 7005 is formed using a light-transmitting conductive material that transmits visible light. For example, a light-transmitting conductive film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added, or the like can be used.

The light-emitting element 7002 corresponds to a region where the EL layer 7004 including the light-emitting layer is sandwiched between the first electrode 7003 and the second electrode 7005. In the case of the pixel illustrated in FIG. 17C, light emitted from the light-emitting element 7002 is ejected to the second electrode 7005 side as indicated by an arrow.

The planarization insulating layer 7053 can be formed using a resin material such as polyimide, an acrylic resin, a benzocyclobutene resin, polyamide, or an epoxy resin. Other than such resin materials, it is also possible to use a low-dielectric constant material (low-k material), a siloxane-based resin, phosphosilicate glass (PSG), borophosphosilicate glass (BPSG), or the like. Note that the planarization insulating layer 7053 may be formed by stacking a plurality of insulating films formed using these materials. The planarization insulating layer 7053 can be formed, depending on the material, by a method such as a sputtering method, an SOG method, a spin coating method, a dipping method, a spray coating method, or a droplet discharge method (e.g., an inkjet method, screen printing, or offset printing), or a tool (equipment) such as a doctor knife, a roll coater, a curtain coater, or a knife coater.

In the structure illustrated in FIG. 17C, for performing full-color display, the light-emitting element 7002, one of adjacent light-emitting elements, and the other of the adjacent light-emitting elements are, for example, a green emissive light-emitting element, a red emissive light-emitting element, and a blue emissive light-emitting element, respectively. Alternatively, a light-emitting display device capable of full color display may be manufactured using four kinds of light-emitting elements which include a white light-emitting element in addition to three kinds of light-emitting elements.

In the structure of FIG. 17C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that although the organic EL elements are described here as the light-emitting elements, an inorganic EL element may be provided as a light-emitting element.

Note that the example is described in which the transistor (the driving transistor) which controls the driving of a light-emitting element is electrically connected to the light-emitting element; alternatively, a structure may be employed in which a transistor for current control is connected between the driving transistor and the light-emitting element.

Note that the structure of the semiconductor device described in this embodiment is not limited to those illustrated in FIGS. 17A to 17C and can be modified in various ways based on techniques of the present invention.

Next, the appearance and a cross section of a light-emitting display panel (also referred to as a light-emitting panel) to which the transistor according to Embodiment 1 or 2 is applied and which is one embodiment of a semiconductor device will be described with reference to FIGS. 18A and 18B. FIG. 18A is a top plan view of a panel in which a transistor and a light-emitting element that are formed over a first substrate are sealed between the first substrate and a second substrate with a sealant. FIG. 18B is a cross-sectional view along H-I in FIG. 18A.

A sealant 4505 is provided so as to surround a pixel portion 4502, signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Consequently, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. In this manner, a panel is preferably packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b, which are formed over the first substrate 4501, each include a plurality of transistors. A transistor 4510 included in the pixel portion 4502 and a transistor 4509 included in the signal line driver circuit 4503a are illustrated as an example in FIG. 18B.

The highly reliable transistor described in Embodiment 1 or 2 which includes an oxide semiconductor layer (In—Ga—Zn—O-based film) can be used for the transistors 4509 and 4510. In this embodiment, the transistors 4509 and 4510 are n-channel transistors.

A conductive layer 4540 is provided over part of an insulating layer 4544, which overlaps with a channel formation region of an oxide semiconductor layer in the transistor 4509 for the driver circuit. The conductive layer 4540 is provided at the position overlapping with the channel formation region of the oxide semiconductor layer, whereby the amount of change in threshold voltage of the transistor 4509 between before and after the BT test can be reduced. A potential of the conductive layer 4540 may be the same or different from that of a gate electrode layer in the transistor 4509. The conductive layer 4540 can also function as a second gate electrode layer. Alternatively, the potential of the conductive layer 4540 may be GND or 0 V, or the conductive layer 4540 may be in a floating state.

Reference numeral 4511 denotes a light-emitting element. A first electrode layer 4517 which is a pixel electrode included in the light-emitting element 4511 is electrically connected to a source electrode layer or a drain electrode layer of the transistor 4510. Note that the structure of the light-emitting element 4511 is a layered structure of the first electrode layer 4517, an electroluminescent layer 4512, and a second electrode layer 4513, but is not limited to the structure in this embodiment. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. It is particularly preferable that the bank 4520 be formed using a photosensitive material and an opening portion be formed over the first electrode layer 4517 so that a sidewall of the opening portion is formed as an inclined surface with continuous curvature.

The electroluminescent layer 4512 may be formed with a single layer or a plurality of layers stacked.

A protective film may be formed over the second electrode layer 4513 and the bank 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the transistor 4509.

The connection terminal electrode 4515 is electrically connected to a terminal included in the FPC 4518a through an anisotropic conductive film 4519.

The second substrate positioned in the direction in which light is extracted from the light-emitting element 4511 needs to have a light-transmitting property. In that case, a light-transmitting material such as a glass plate, a plastic plate, a polyester film, or an acrylic resin film is used for the second substrate.

As the filler 4507, an ultraviolet curable resin or a thermosetting resin can be used in addition to an inert gas such as nitrogen or argon. For example, PVC (polyvinyl chloride), an acrylic resin, polyimide, an epoxy resin, a silicone resin, PVB (polyvinyl butyral), or EVA (ethylene vinyl acetate) can be used. In this embodiment, nitrogen is used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment can be performed by which reflected light can be diffused by projections and depressions on the surface so as to reduce glare.

Driver circuits formed using a single crystal semiconductor film or a polycrystalline semiconductor film over a substrate separately prepared may be mounted as the signal line driver circuits 4503a and 4503b and the scan line driver circuits 4504a and 4504b. Alternatively, only the signal line driver circuits or part thereof, or only the scan line driver circuits or part thereof may be separately formed and mounted. This embodiment is not limited to the structure illustrated in FIGS. 18A and 18B.

Through the above process, a display device including a transistor which is excellent in operation stability can be manufactured. Since the light-emitting display device according to this embodiment includes a transistor which is excellent in operation stability, reliability of the light-emitting display device is high.

Formed using the oxide semiconductors each having a wide band gap and having a carrier concentration suppressed to less than $1 \times 10^{14}/cm^3$, preferably $1 \times 10^{12}/cm^3$ or less, the transistors provided in a pixel portion and a driver circuit of the display device according to this embodiment are normally off and the off current of the transistors is small. Specifically, the transistor can have an off current per a channel width of 1 µm of $1 \times 10^{-16}$ A/µm or lower, furthermore 1 aA/µm ($1 \times 10^{-18}$ A/µm) or lower, at room temperature.

Thus, the display device can have a smaller leak current and lower power consumption. Further, the ratio of an on current to an off current of the display device can be high. Furthermore, contrast and display quality of the display device can be high.

Moreover, the display device according to this embodiment includes a transistor which includes a highly-purified oxide semiconductor layer and thus has high field effect mobility, so that the display device can operate at high speed, have a characteristic of displaying moving images, and display high-definition images.

Note that the structure described in this embodiment can be combined with any of the structures described in the other embodiments as appropriate.

Embodiment 8

In this embodiment, an example of electronic paper will be described as a display device which is an example of a semiconductor device of the present invention.

Figure 19:
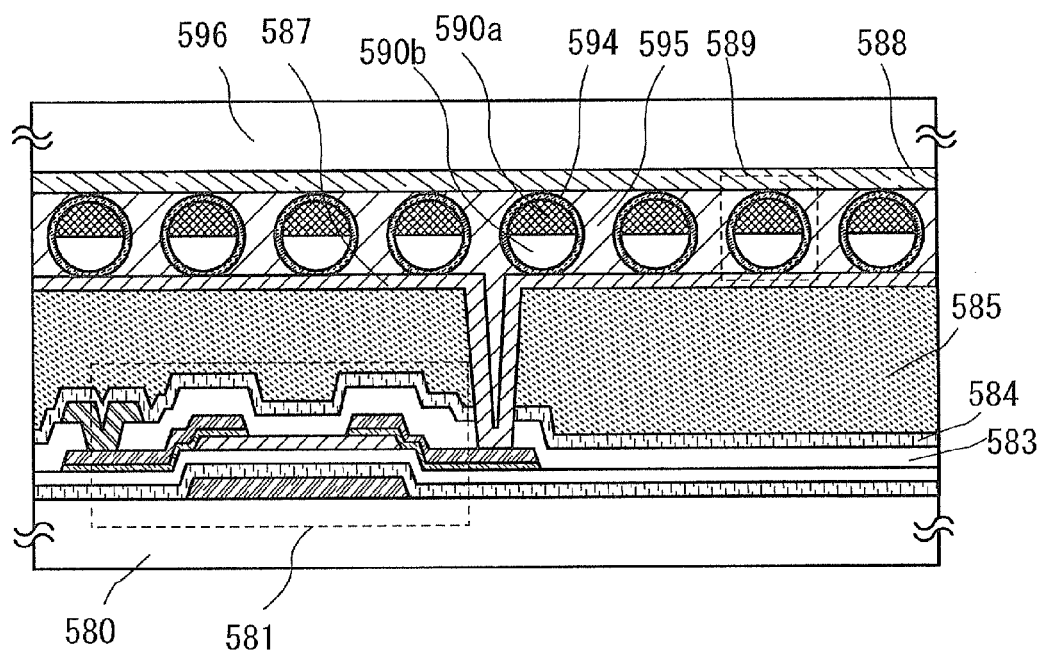
FIG. 19 illustrates a semiconductor device according to an embodiment.

FIG. 19 illustrates an active matrix electronic paper as an example of a display device to which an embodiment of the present invention is applied. A transistor 581 used for the display device can be formed as in Embodiment 1 or 2.

The electronic paper in FIG. 19 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The source electrode layer or the drain electrode layer of the transistor 581 is in contact with and electrically connected to a first electrode layer 587 through an opening formed in an insulating layer 585. Between the first electrode layer 587 and a second electrode layer 588, spherical particles 589 each having a black region 590a, a white region 590b, and a cavity 594 filled with liquid around the black region 590a and the white region 590b are provided. A space around the spherical particles 589 is filled with a filler 595 such as a resin (see FIG. 19). Note that in FIG. 19, reference numeral 580 denotes a substrate, reference numeral 583 denotes an interlayer insulating film, reference numeral 584 denotes a protective film, and reference numeral 596 denotes a substrate.

Alternatively, it is possible to use an electrophoretic element instead of the twisting ball. A microcapsule having a diameter of approximately 10 µm to 200 µm, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and a device including the electrophoretic display element is called electronic paper in general. The electrophoretic display element has higher reflectance than a liquid crystal display element; thus, an auxiliary light is unnecessary, power consumption is low, and a display portion can be recognized in a dim place. In addition, even when power is not supplied to the display portion, an image which has been displayed once can be maintained. Consequently, a displayed image can be stored even if a semiconductor device having a display function (which may be referred to as a display device simply or a semiconductor device provided with a display device) is kept away from an electric wave source serving as a power supply source.

Through the above process, electronic paper incorporating the transistor which is excellent in operation stability can be manufactured. Since the light-emitting display device according to this embodiment incorporates a transistor which is excellent in operation stability, reliability of the electronic paper is high.

Formed using the oxide semiconductors each having a wide band gap and having a carrier concentration suppressed to less than $1 \times 10^{14}/cm^3$, preferably $1 \times 10^{12}/cm^3$ or less, the transistors provided in a pixel portion and a driver circuit of the display device according to this embodiment are normally off and the off current of the transistors is small. Specifically, the transistor can have an off current per a channel width of 1 µm of $1 \times 10^{-16}$ A/µm or lower, furthermore 1 aA/µm ($1 \times 10^{-18}$ A/µm) or lower, at room temperature.

Thus, the display device can have a smaller leak current and lower power consumption. Further, the ratio of an on current to an off current of the display device can be high. Furthermore, contrast and display quality of the display device can be high.

Moreover, the display device according to this embodiment includes a transistor which includes a highly-purified oxide semiconductor layer and thus has high field effect mobility, so that the display device can operate at high speed, have a characteristic of displaying moving images, and display high-definition images.

This embodiment can be implemented in appropriate combination with any of the structures described in Embodiments 1 and 2.

Embodiment 9

Figure 20A:
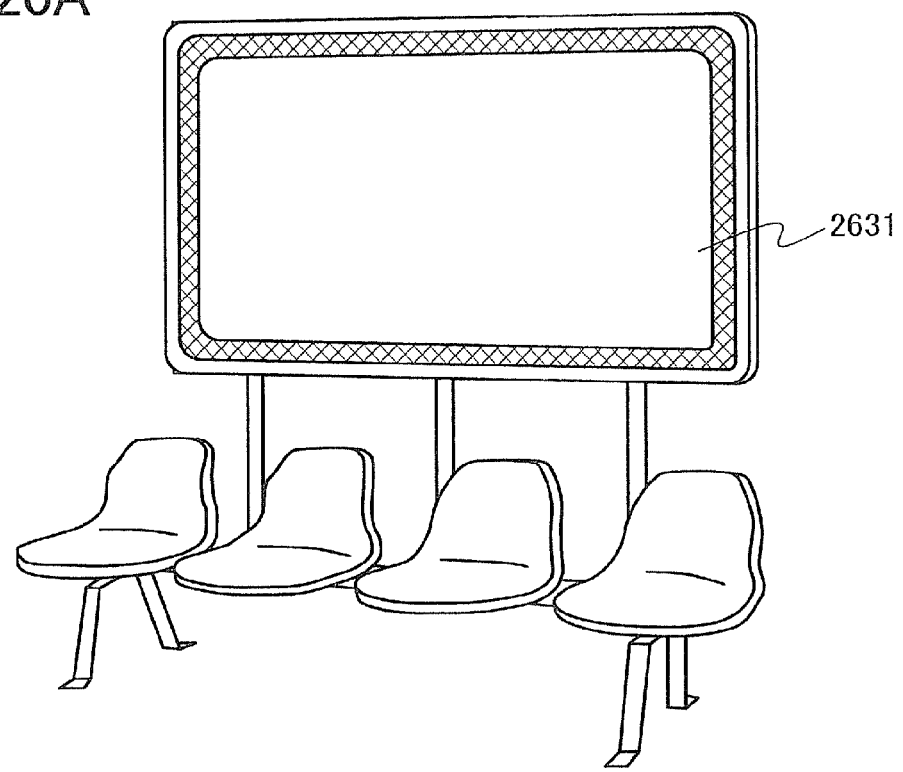
FIGS. 20A and 20B illustrate application examples of electronic paper.
Figure 20B:
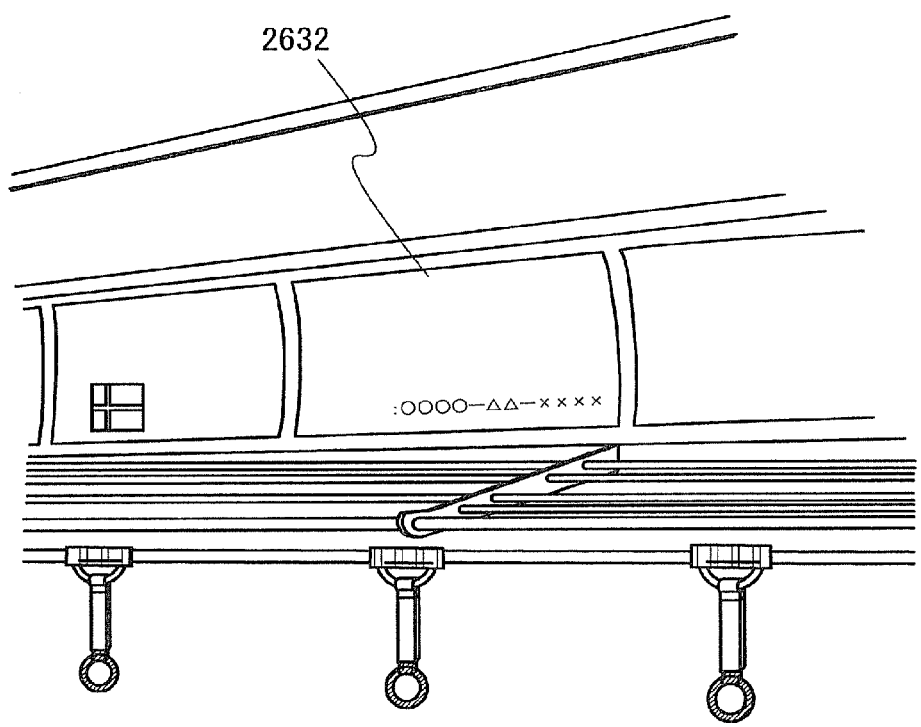
Figure 21:
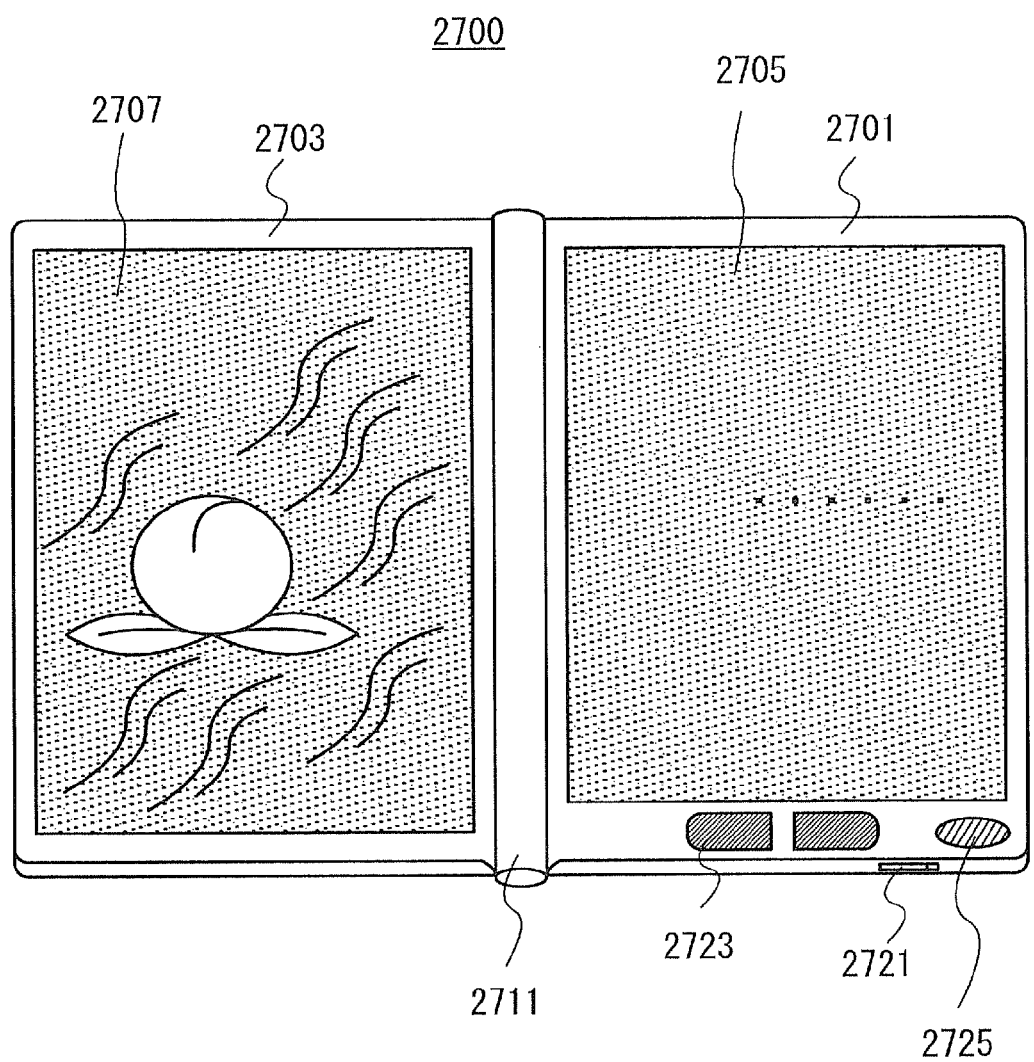
FIG. 21 is an external view illustrating an example of an e-book reader.

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIGS. 20A and 20B and FIG. 21 illustrate examples of the electronic devices.

FIG. 20A illustrates a poster 2631 formed using electronic paper. In the case where an advertising medium is printed paper, the advertisement is replaced by manpower; however, by using electronic paper to which an embodiment of the present invention is applied, the advertising display can be changed in a short time. Further, an image can be stably displayed without being distorted. Note that the poster may transmit and receive data wirelessly.

FIG. 20B illustrates an advertisement 2632 in a vehicle such as a train. In the case where an advertising medium is printed paper, the advertisement is replaced by manpower; however, by using electronic paper to which an embodiment of the present invention is applied, the advertising display can be changed in a short time without a lot of manpower. Further an image can be stably displayed without being distorted. Note that the advertisement in a vehicle may transmit and receive data wirelessly.

FIG. 21 illustrates an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 21) can display text and a display portion on the left side (the display portion 2707 in FIG. 21) can display graphics.

FIG. 21 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

With the use of the transistor described in the above embodiment, a display device provided with the transistor which is excellent in operation stability can be manufactured. The display device provided with a transistor which is excellent in operation stability is highly reliable.

Embodiment 10

A semiconductor device according to an embodiment of the present invention can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 22A:
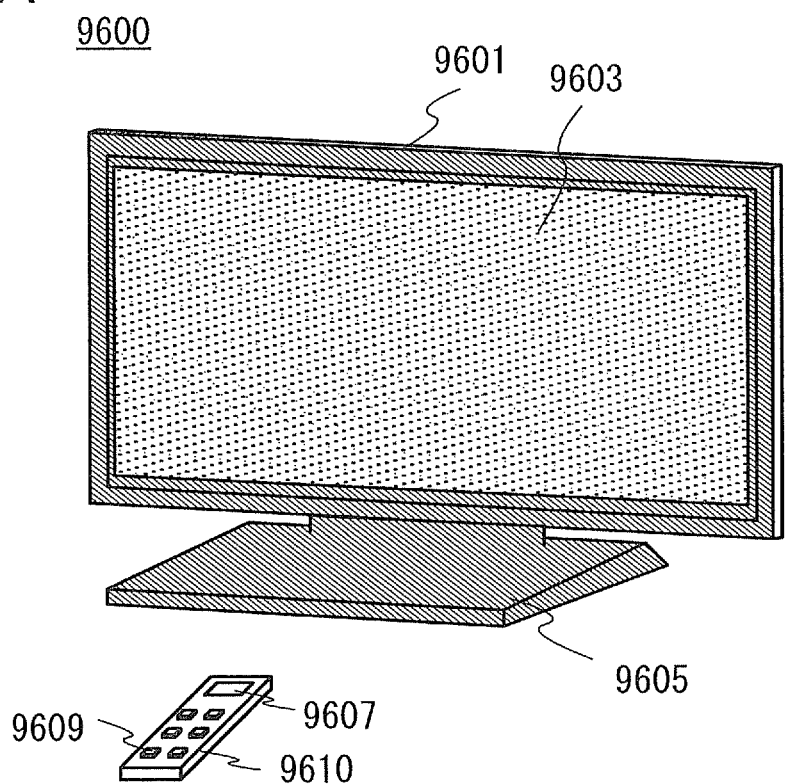
FIGS. 22A and 22B are external views illustrating a television set and a digital photo frame, respectively.

FIG. 22A illustrates an example of a television set 9600. In the television set 9600, a display portion 9603 is incorporated in a housing 9601. The display portion 9603 can display an image. Further, the housing 9601 is supported by a stand 9605 in this embodiment.

The television set 9600 can be operated by an operation switch of the housing 9601 or a separate remote controller 9610. Channels and volume can be controlled by operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 22B:
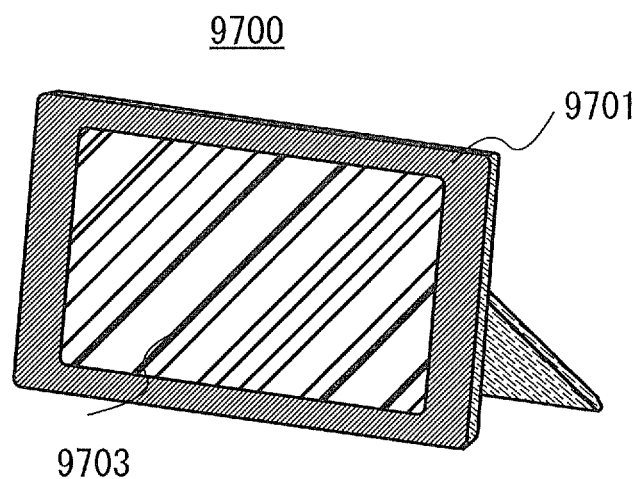

FIG. 22B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may transmit and receive data wirelessly. The structure may be employed in which desired image data is transferred wirelessly to be displayed.

Figure 23A:
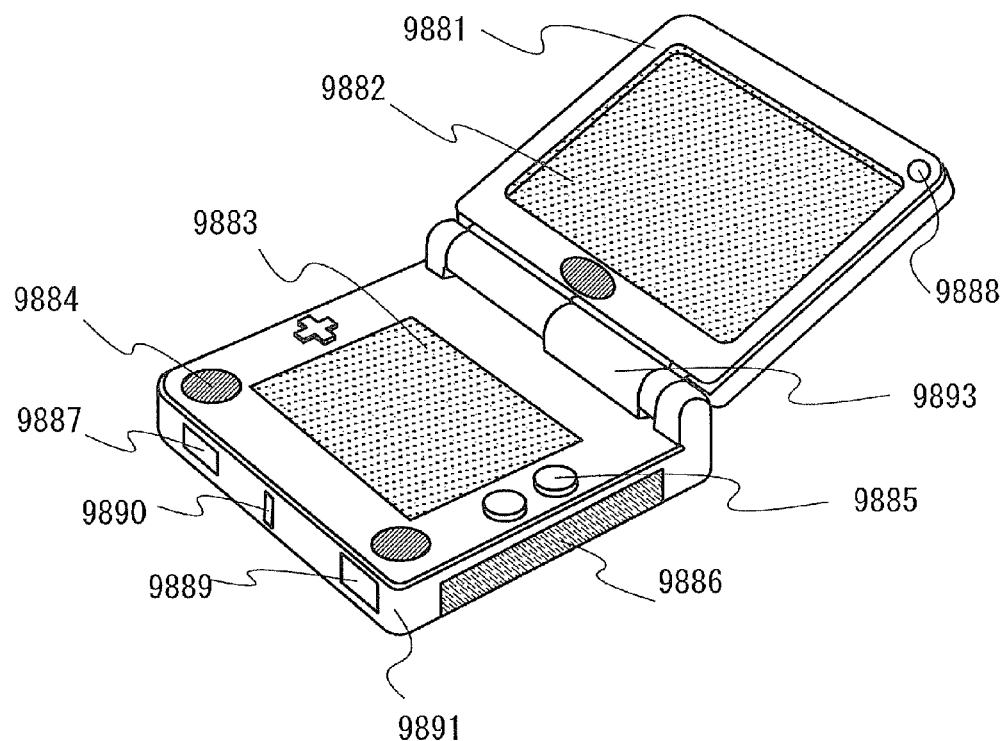
FIGS. 23A and 23B are external views illustrating examples of amusement machines.

FIG. 23A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. The portable game machine illustrated in FIG. 23A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. Needless to say, the structure of the portable game machine is not limited to the above, and may be any structure as long as at least a semiconductor device according to one embodiment of the present invention is provided. Moreover, another accessory may be provided as appropriate. The portable game machine illustrated in FIG. 23A has a function of reading out a program or data stored in a storage medium to display it on the display portion, and a function of sharing information with another portable game machine by wireless communication. The portable game machine in FIG. 23A can have a variety of functions other than those above.

Figure 23B:
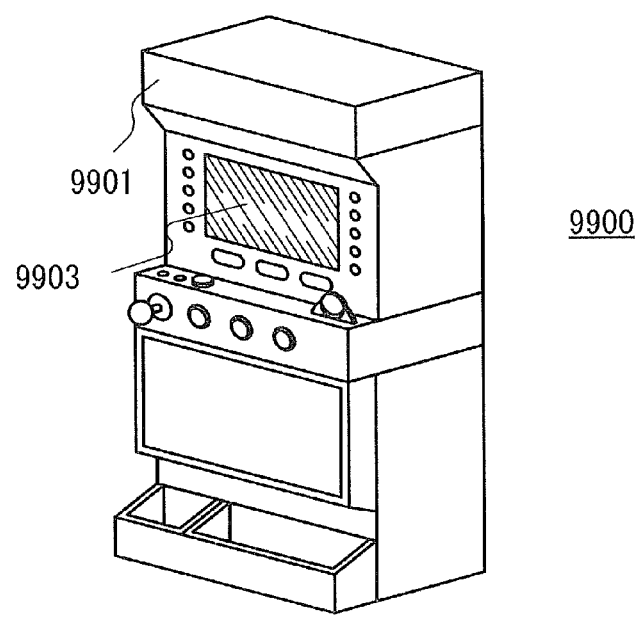

FIG. 23B illustrates an example of a slot machine 9900, which is a large game machine. A display portion 9903 is incorporated in a housing 9901 of the slot machine 9900. The slot machine 9900 additionally includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 24:
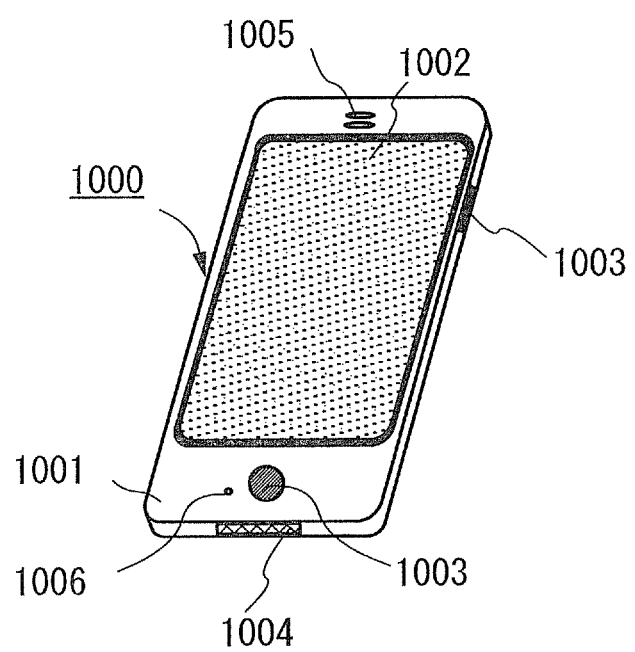
FIG. 24 is an external view illustrating a mobile phone.

FIG. 24 illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 24 is touched with a finger or the like, data can be input into the mobile phone handset 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In this case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display in the screen of the display portion 1002 can be automatically switched by determining the direction of the mobile phone handset 1000 (whether the mobile phone handset 1000 is placed horizontally or vertically).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

With the use of the transistor described in the above embodiment, a display device provided with the transistor which is excellent in operation stability can be manufactured. The above electronic appliance provided with a transistor which is excellent in operation stability is highly reliable.

This application is based on Japanese Patent Application serial no. 2009-282093 filed with Japan Patent Office on Dec. 11, 2009, the entire contents of which are hereby incorporated by reference.

The invention claimed is:

1. A semiconductor device comprising:
a first gate electrode;
a gate insulating layer over the first gate electrode;
an oxide semiconductor layer over and in contact with the gate insulating layer;
a source electrode and a drain electrode over the oxide semiconductor layer;
a first insulating layer over and in contact with the source electrode, the drain electrode, and a part of the oxide semiconductor layer; and
a second insulating layer over and in contact with the first insulating layer,
wherein the second insulating layer is in direct contact with the gate insulating layer in a region which surrounds the oxide semiconductor layer.

2. The semiconductor device according to claim 1, further comprising a barrier layer between the oxide semiconductor layer and the source electrode and between the oxide semiconductor layer and the drain electrode.

3. The semiconductor device according to claim 2, wherein the barrier layer includes a nitride.

4. The semiconductor device according to claim 1, wherein:
the gate insulating layer comprises a first layer and a second layer over the first layer, and
the second insulating layer is in direct contact with the first layer.

5. The semiconductor device according to claim 4, wherein the second insulating layer is in direct contact with a side surface of the second layer.

6. The semiconductor device according to claim 4, further comprising a second gate electrode over the second insulating layer.

7. The semiconductor device according to claim 1, further comprising a first capacitor electrode and a second capacitor electrode with the gate insulating layer interposed therebetween,
wherein:
the first capacitor electrode includes a same material as the first gate electrode, and
the second capacitor electrode includes a same material as the source electrode and the drain electrode.

8. The semiconductor device according to claim 1, further comprising:
a gate wiring electrically connected to the first gate electrode; and
a signal line electrically connected to the source electrode in an opening formed in the second insulating layer,
wherein the second insulating layer is located over and in direct contact with the signal line.

9. The semiconductor device according to claim 8,
wherein the gate insulating layer and the oxide semiconductor layer are sandwiched between the gate wiring and the signal line at an intersection thereof.

10. An electronic appliance comprising the semiconductor device according to claim 1.

11. A semiconductor device comprising:
a first gate electrode and a second gate electrode;
a gate insulating layer over the first gate electrode and the second gate electrode;
a first oxide semiconductor layer and a second oxide semiconductor layer over and in contact with the gate insulating layer, the first oxide semiconductor layer and the second oxide semiconductor layer overlapping with the first gate electrode and the second gate electrode, respectively;
a first source electrode and a first drain electrode over the first oxide semiconductor layer;
a second source electrode and a second drain electrode over the second oxide semiconductor layer;
a first insulating layer over and in contact with the first source electrode, the first drain electrode, the second source electrode, the second drain electrode, a part of the first oxide semiconductor layer, and a part of the second oxide semiconductor layer;
a second insulating layer over and in contact with the first insulating layer, the second insulating layer overlapping with the first gate electrode and the second gate electrode;
an output terminal electrically connected to the first drain electrode, the second source electrode, and the second gate electrode;
a first wiring configured to input a first voltage to the first source electrode; and
a second wiring configured to input a second voltage to the second drain electrode,
wherein the second insulating layer is in direct contact with the gate insulating layer in a region which surrounds the first oxide semiconductor layer and the second oxide semiconductor layer.

12. The semiconductor device according to claim 11,
wherein the first voltage is lower than the second voltage.

13. The semiconductor device according to claim 11, further comprising:
a barrier layer between the first oxide semiconductor layer and the first source electrode, the first oxide semiconductor layer and the first drain electrode, the second oxide semiconductor layer and the first source electrode, and the second oxide semiconductor layer and the second drain electrode.

14. The semiconductor device according to claim 13,
wherein the barrier layer includes a nitride.

15. The semiconductor device according to claim 11,
wherein:
the gate insulating layer comprises a first layer and a second layer over the first layer, and
the second insulating layer is in direct contact with the first layer.

16. The semiconductor device according to claim 15,
wherein the second insulating layer is in direct contact with a side surface of the second layer.

17. The semiconductor device according to claim 11, further comprising a third gate electrode over the second insulating layer,
wherein the third gate electrode overlaps with the first gate electrode.

18. The semiconductor device according to claim 17, further comprising a fourth gate electrode over the second insulating layer,
wherein the fourth gate electrode overlaps with the second gate electrode.

19. An electronic appliance comprising the semiconductor device according to claim 11.

* * * * *